US011456265B2

(12) United States Patent
Tonegawa

(10) Patent No.: US 11,456,265 B2
(45) Date of Patent: Sep. 27, 2022

(54) SEMICONDUCTOR DEVICE AND METHOD OF MANUFACTURING THE SAME

(71) Applicant: Renesas Electronics Corporation, Tokyo (JP)

(72) Inventor: Takashi Tonegawa, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/927,006

(22) Filed: Jul. 13, 2020

(65) Prior Publication Data

US 2020/0343207 A1 Oct. 29, 2020

Related U.S. Application Data

(63) Continuation of application No. 15/788,637, filed on Oct. 19, 2017, now abandoned.

(30) Foreign Application Priority Data

Nov. 15, 2016 (JP) ............................ JP2016-222189

(51) Int. Cl.
*H01L 23/00* (2006.01)
*H01L 23/495* (2006.01)
(Continued)

(52) U.S. Cl.
CPC .......... *H01L 24/05* (2013.01); *H01L 23/3114* (2013.01); *H01L 23/4334* (2013.01);
(Continued)

(58) Field of Classification Search
CPC ..... H01L 2224/0346; H01L 224/03462; H01L 2224/03464; H01L 2224/05155; H01L 24/05; H01L 24/06; H01L 2224/05083
See application file for complete search history.

(56) References Cited

U.S. PATENT DOCUMENTS

2003/0019426 A1* 1/2003 Inoue .................... H01L 21/288 118/429
2008/0076238 A1 3/2008 Miyashita et al.
(Continued)

FOREIGN PATENT DOCUMENTS

JP H 03-190136 A 8/1991
JP 2005-033130 A 2/2005
(Continued)

OTHER PUBLICATIONS

Taiwanese Office Action dated Feb. 25, 2021, in Taiwanese Patent Application No. 106136821 and English Translation thereof.
(Continued)

*Primary Examiner* — Samuel A Gebremariam
*Assistant Examiner* — Jonas T Beardsley
(74) *Attorney, Agent, or Firm* — McGinn IP Law Group, PLLC

(57) ABSTRACT

A method of manufacturing a semiconductor device includes forming an interlayer insulating film over a main surface of a semiconductor substrate, forming a first conductive film pattern for a first pad and a second conductive film pattern for a second pad over the interlayer insulating film, forming an insulating film over the interlayer insulating film such that the insulating film covers the first and the second conductive film patterns, forming a first opening portion for the first pad, the first opening portion exposing a portion of the first conductive film pattern, and a second opening portion for the second pad, the second opening portion exposing a portion of the second conductive film pattern, in the insulating film, and forming a first plated layer by plating over the portion of the first conductive film pattern exposed in the first opening portion, and a second plated layer.

19 Claims, 41 Drawing Sheets

(51) Int. Cl.

| | |
|---|---|
| ***H01L 29/78*** | (2006.01) |
| ***H01L 29/66*** | (2006.01) |
| ***H01L 23/31*** | (2006.01) |
| ***H01L 23/433*** | (2006.01) |

(52) U.S. Cl.
CPC .... *H01L 23/4952* (2013.01); *H01L 23/49524* (2013.01); *H01L 23/49562* (2013.01); *H01L 23/49568* (2013.01); *H01L 23/49575* (2013.01); *H01L 23/562* (2013.01); *H01L 24/03* (2013.01); *H01L 29/66734* (2013.01); *H01L 29/7813* (2013.01); *H01L 23/3107* (2013.01); *H01L 23/49513* (2013.01); *H01L 24/06* (2013.01); *H01L 24/32* (2013.01); *H01L 24/40* (2013.01); *H01L 24/48* (2013.01); *H01L 24/73* (2013.01); *H01L 2224/03464* (2013.01); *H01L 2224/04026* (2013.01); *H01L 2224/04034* (2013.01); *H01L 2224/04042* (2013.01); *H01L 2224/05008* (2013.01); *H01L 2224/05017* (2013.01); *H01L 2224/05019* (2013.01); *H01L 2224/05024* (2013.01); *H01L 2224/05025* (2013.01); *H01L 2224/05082* (2013.01); *H01L 2224/05083* (2013.01); *H01L 2224/05096* (2013.01); *H01L 2224/05144* (2013.01); *H01L 2224/05155* (2013.01); *H01L 2224/05164* (2013.01); *H01L 2224/05582* (2013.01); *H01L 2224/05583* (2013.01); *H01L 2224/0603* (2013.01); *H01L 2224/06181* (2013.01); *H01L 2224/291* (2013.01); *H01L 2224/32245* (2013.01); *H01L 2224/40151* (2013.01); *H01L 2224/45124* (2013.01); *H01L 2224/45144* (2013.01); *H01L 2224/45147* (2013.01); *H01L 2224/48137* (2013.01); *H01L 2224/48245* (2013.01); *H01L 2224/48247* (2013.01); *H01L 2224/48463* (2013.01); *H01L 2224/49173* (2013.01); *H01L 2224/49175* (2013.01); *H01L 2224/49177* (2013.01); *H01L 2224/73221* (2013.01); *H01L 2224/73263* (2013.01); *H01L 2224/73265* (2013.01); *H01L 2224/84801* (2013.01); *H01L 2924/13055* (2013.01); *H01L 2924/3511* (2013.01); *H01L 2924/3512* (2013.01)

(56) References Cited

U.S. PATENT DOCUMENTS

| | | | | |
|---|---|---|---|---|
| 2008/0265386 | A1 | 10/2008 | Muto et al. | |
| 2009/0133782 | A1* | 5/2009 | Uchida | C23C 22/83 148/275 |
| 2010/0181650 | A1 | 7/2010 | Shigihara et al. | |
| 2010/0246152 | A1* | 9/2010 | Lin | H01L 24/02 361/783 |
| 2014/0123776 | A1 | 5/2014 | Singer et al. | |
| 2015/0267302 | A1* | 9/2015 | Kubota | C23C 18/1651 427/304 |
| 2015/0364587 | A1* | 12/2015 | Yoshinaga | H01L 29/0649 257/144 |
| 2016/0155833 | A1 | 6/2016 | Yoshinaga et al. | |
| 2016/0197023 | A1 | 7/2016 | Teshima | |
| 2016/0319456 | A1* | 11/2016 | Yoshioka | C25D 21/12 |

FOREIGN PATENT DOCUMENTS

| | | | | |
|---|---|---|---|---|
| JP | 2014-123776 | * | 6/2014 | H01L 29/7397 |
| JP | 2014-123776 | A | 7/2014 | |
| JP | 2016-4877 | A | 1/2016 | |
| JP | 2016-188407 | A | 11/2016 | |
| TW | 200636911 | A | 10/2006 | |

OTHER PUBLICATIONS

United States Office Action dated Apr. 14, 2020 in U.S. Appl. No. 15/788,637.

United States Office Action dated Oct. 2, 2019 in U.S. Appl. No. 15/788,637.

United States Office Action dated Mar. 4, 2019 in U.S. Appl. No. 15/788,637.

United States Office Action dated Sep. 26, 2018 in U.S. Appl. No. 15/788,637.

Japanese Office Action, dated Mar. 16, 2021, in Japanese Application No. 2020-078811 and English Translation thereof.

* cited by examiner

FIG. 40

| SAMPLE NO. | THICKNESS OF LARGE-AREA PAD Ni PLATED LAYER (μm) | THICKNESS OF SMALL-AREA PAD Ni PLATED LAYER (μm) | WARPAGE OF SEMICONDUCTOR SUBSTRATE | CRACK AT TIME OF WIRE BONDING |
|---|---|---|---|---|
| 1 | 1.9 | 1.9 | ○ | × |
| 2 | 2 | 2 | ○ | × |
| 3 | 2.3 | 2.3 | ○ | × |
| 4 | 2.5 | 2.5 | ○ | × |
| 5 | 2.9 | 2.9 | ○ | × |
| 6 | 3 | 3 | × | ○ |
| 7 | 3.5 | 3.5 | × | ○ |

FIG. 41

| SAMPLE NO. | THICKNESS OF LARGE-AREA PAD Ni PLATED LAYER (μm) | THICKNESS OF SMALL-AREA PAD Ni PLATED LAYER (μm) | WARPAGE OF SEMICONDUCTOR SUBSTRATE | CRACK AT TIME OF WIRE BONDING |
|---|---|---|---|---|
| 8 | 1.9 | 2.51 | ○ | × |
| 9 | 2 | 2.64 | ○ | × |
| 10 | 2.3 | 3.04 | ○ | ○ |
| 11 | 2.5 | 3.30 | ○ | ○ |
| 12 | 2.9 | 3.83 | ○ | ○ |
| 13 | 3 | 3.96 | × | ○ |
| 14 | 3.5 | 4.62 | × | ○ |

FIG. 42

| SAMPLE NO. | THICKNESS OF LARGE-AREA PAD Ni PLATED LAYER (μm) | THICKNESS OF SMALL-AREA PAD Ni PLATED LAYER (μm) | WARPAGE OF SEMICONDUCTOR SUBSTRATE | CRACK AT TIME OF WIRE BONDING |
|---|---|---|---|---|
| 15 | 1.9 | 2.31 | ○ | × |
| 16 | 2 | 2.44 | ○ | × |
| 17 | 2.3 | 2.80 | ○ | × |
| 18 | 2.5 | 3.05 | ○ | ○ |
| 19 | 2.9 | 3.53 | ○ | ○ |
| 20 | 3 | 3.66 | × | ○ |
| 21 | 3.5 | 4.26 | × | ○ |

SEMICONDUCTOR DEVICE AND METHOD OF MANUFACTURING THE SAME

The present application is a Continuation Application of U.S. patent application Ser. No. 15/788,637, filed on Oct. 19, 2017, which is based on and claims priority from Japanese Patent Application No. 2016-222189, filed on Nov. 15, 2016, the entire contents of which are incorporated herein by reference.

TECHNICAL FIELD OF THE INVENTION

The present invention relates to a semiconductor device and a method of manufacturing the same, and can be preferably used for a semiconductor device including a bonding pad and a method of manufacturing the semiconductor device.

BACKGROUND OF THE INVENTION

In a semiconductor chip in which a power semiconductor element is formed, a current flowing between a pad provided on a main surface side and a back surface electrode on a back surface side can be controlled by the power semiconductor element formed in the semiconductor chip. Therefore, such a semiconductor chip can be used as a switching element in which a large current flows, for example. In packaging the semiconductor chip, a metal plate is connected with the pad of the semiconductor chip via solder in consideration of reduction in resistance.

Japanese Patent Application Laid-Open Publication No. 2005-33130 (Patent Document 1) describes a technique regarding a semiconductor device having a metal electrode for external connection including a nickel plated layer formed on a front surface of an aluminum electrode.

SUMMARY OF THE INVENTION

Improvement of reliability of a semiconductor device including a bonding pad is desired.

Other objects and novel features of the present invention will be apparent from the description of the present specification and the accompanying drawings.

According to an embodiment, a semiconductor device includes: a semiconductor substrate; an interlayer insulating film formed over a main surface of the semiconductor substrate; a first conductive film pattern for a first pad and a second conductive film pattern for a second pad; an insulating film such that the insulating film covers the first and the second conductive film patterns; a first opening portion formed in the insulating film and exposing a portion of the first conductive film pattern; and a second opening portion formed in the insulating film and exposing a portion of the second conductive film pattern. The semiconductor device further includes: a first plated layer formed over the portion of the first conductive film pattern exposed in the first opening portion; and a second plated layer formed over the portion of the second conductive film pattern exposed in the second opening portion. The first pad is formed of the portion of the first conductive film pattern exposed in the first opening portion, and the first plated layer, and the second pad is formed of the portion of the second conductive film pattern exposed in the second opening portion, and the second plated layer. An area of the second opening portion is smaller than an area of the first opening portion, and a thickness of the second plated layer is greater than a thickness of the first plated layer.

Also, according to an embodiment, a method of manufacturing a semiconductor device includes the steps of: forming a first conductive film pattern for a first pad and a second conductive film pattern for a second pad; forming an insulating film such that the insulating film covers the first and the second conductive film patterns; and forming a first opening portion exposing a portion of the first conductive film pattern, and a second opening portion exposing a portion of the second conductive film pattern, in the insulating film. The method of manufacturing a semiconductor device further includes the step of: forming a first plated layer over the portion of the first conductive film pattern exposed in the first opening portion, and a second plated layer over the portion of the second conductive film pattern exposed in the second opening portion. The first pad is formed of the portion of the first conductive film pattern exposed in the first opening portion, and the first plated layer, and the second pad is formed of the portion of the second conductive film pattern exposed in the second opening portion, and the second plated layer. An area of the second opening portion is smaller than an area of the first opening portion, and a thickness of the second plated layer is greater than a thickness of the first plated layer.

According to an embodiment, reliability of a semiconductor device can be improved.

BRIEF DESCRIPTIONS OF THE DRAWINGS

FIG. 40 is a table indicating an examination result as to whether a warpage of a semiconductor substrate occurs and whether a crack occurs at the time of wire bonding;

FIG. 41 is a table indicating another examination result as to whether a warpage of the semiconductor substrate occurs and whether a crack occurs at the time of wire bonding;

FIG. 42 is a table indicating further examination result as to whether a warpage of the semiconductor substrate occurs and whether a crack occurs at the time of wire bonding;

DESCRIPTIONS OF THE PREFERRED EMBODIMENTS

Figure 1:
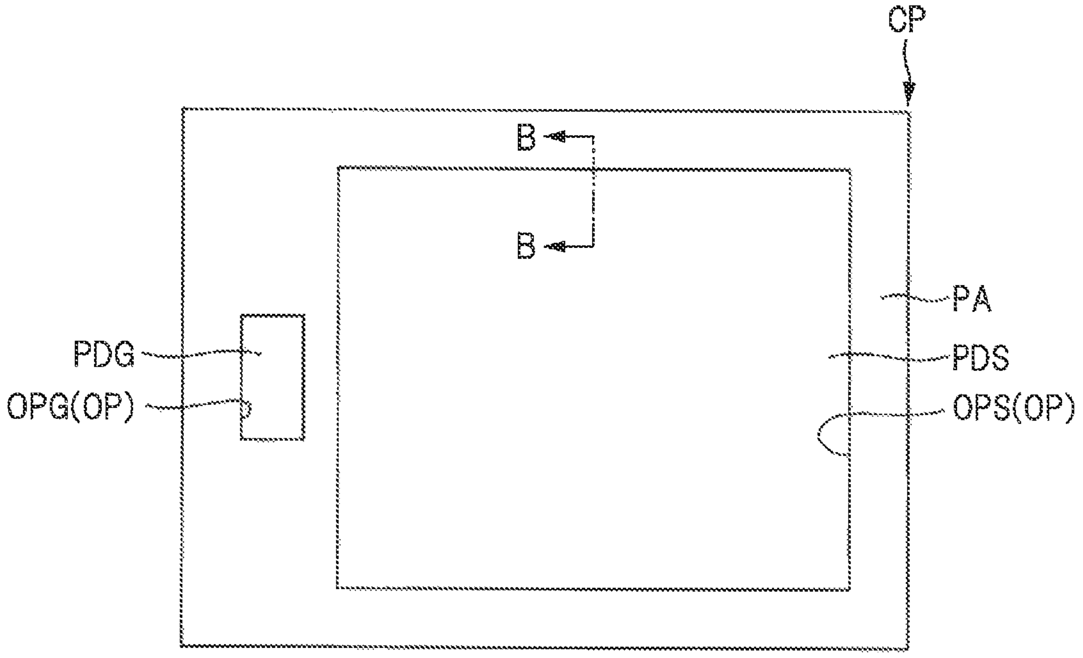
FIG. 1 is an overall plan view of a semiconductor device according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof is omitted. In addition, the description of the same or similar portions is not repeated in principle unless particularly required in the following embodiments.

In addition, in some drawings used in the embodiments, hatching may be omitted even in a cross-sectional view so as to make the drawings easy to see. Also, hatching may be used even in a plan view so as to make the drawings easy to see.

First Embodiment

<Overall Structure of Semiconductor Device (Semiconductor Chip)>

A semiconductor device according to the present embodiment will be described with reference to the drawings.

Figure 2:
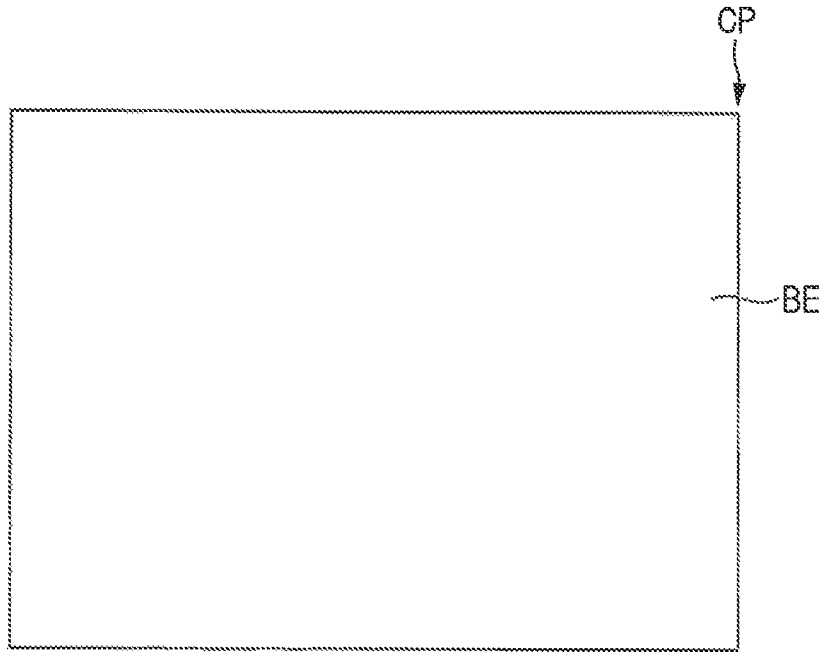
FIG. 2 is an overall plan view of the semiconductor device according to the embodiment.

FIGS. 1 and 2 are overall plan views of a semiconductor device (semiconductor chip) CP according to the present embodiment. FIG. 1 illustrates an overall top plan view of the semiconductor device CP on an upper surface side, and FIG. 2 illustrates an overall bottom plan view of the semiconductor device CP on a back surface (lower surface) side.

As illustrated in FIGS. 1 and 2, the semiconductor device CP of the present embodiment includes an upper surface as one main surface, and a back surface (lower surface) as the other main surface on an opposite side of the upper surface.

FIG. 1 illustrates the upper surface of the semiconductor device CP, and FIG. 2 illustrates the back surface of the semiconductor device CP.

As illustrated in FIG. 1, the semiconductor device CP includes a source pad (a pad for source or a bonding pad for source) PDS as a first terminal, and a gate pad (a pad for gate or a bonding pad for gate) PDG as a control terminal on the upper surface side. Further, as illustrated in FIG. 2, the semiconductor device CP includes a back surface electrode BE as a second terminal on the back surface side. The source pad PDS, the gate pad PDG, and the back surface electrode BE can function as external connection terminals of the semiconductor device CP.

To be specific, an insulating film PA as a surface protection film is formed over an uppermost layer of the semiconductor device CP on the upper surface side. The source pad PDS is exposed in a source opening portion OPS provided in the insulating film PA, and the gate pad PDG is exposed in a gate opening portion OPG provided in the insulating film PA. Further, an uppermost layer of the semiconductor device CP on the back surface side is the back surface electrode BE, and the back surface electrode BE is formed over the entire back surface of the semiconductor device CP.

Figure 11:
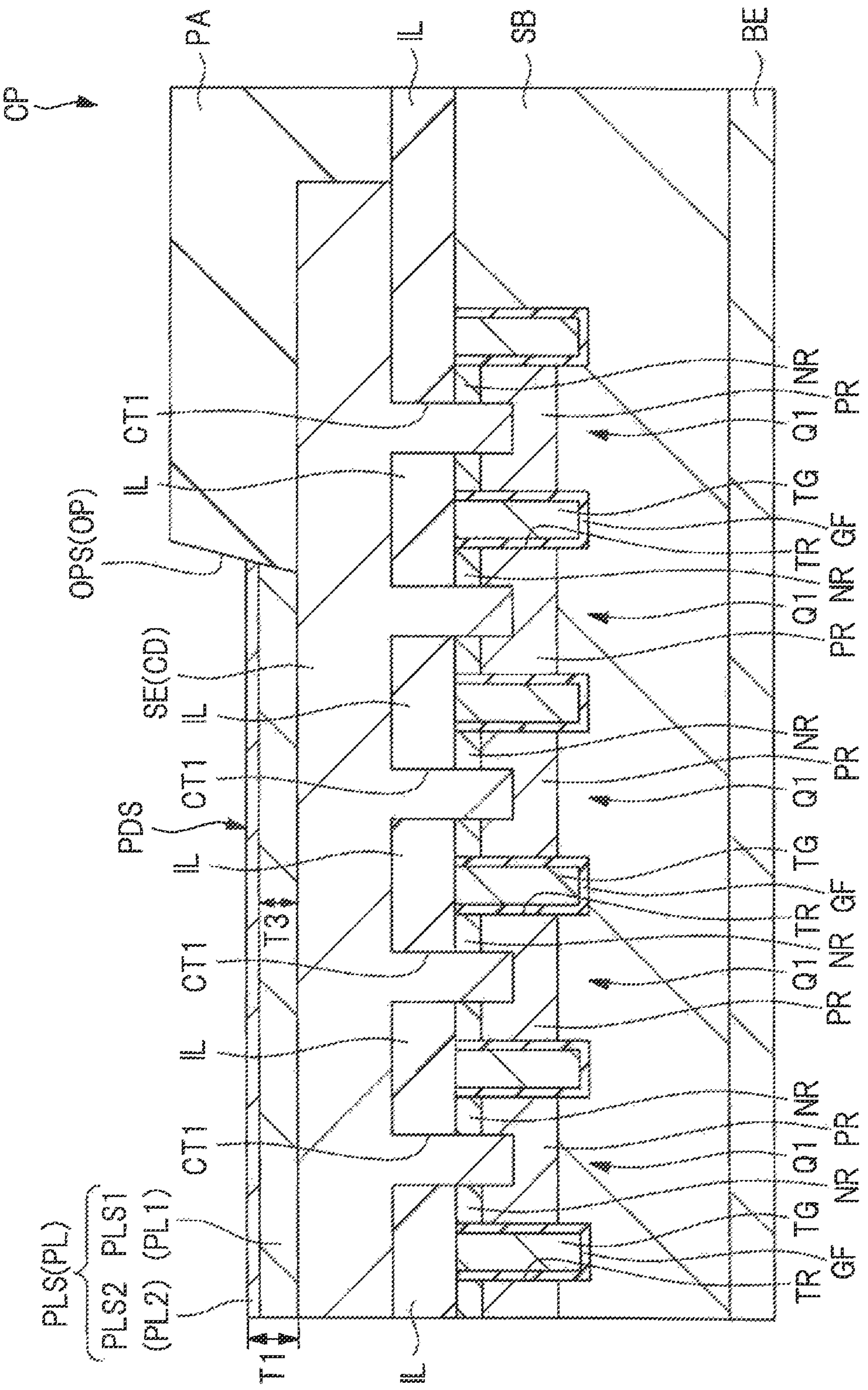
FIG. 11 is a cross-sectional view of a principal portion of the semiconductor device of the embodiment.
Figure 12:
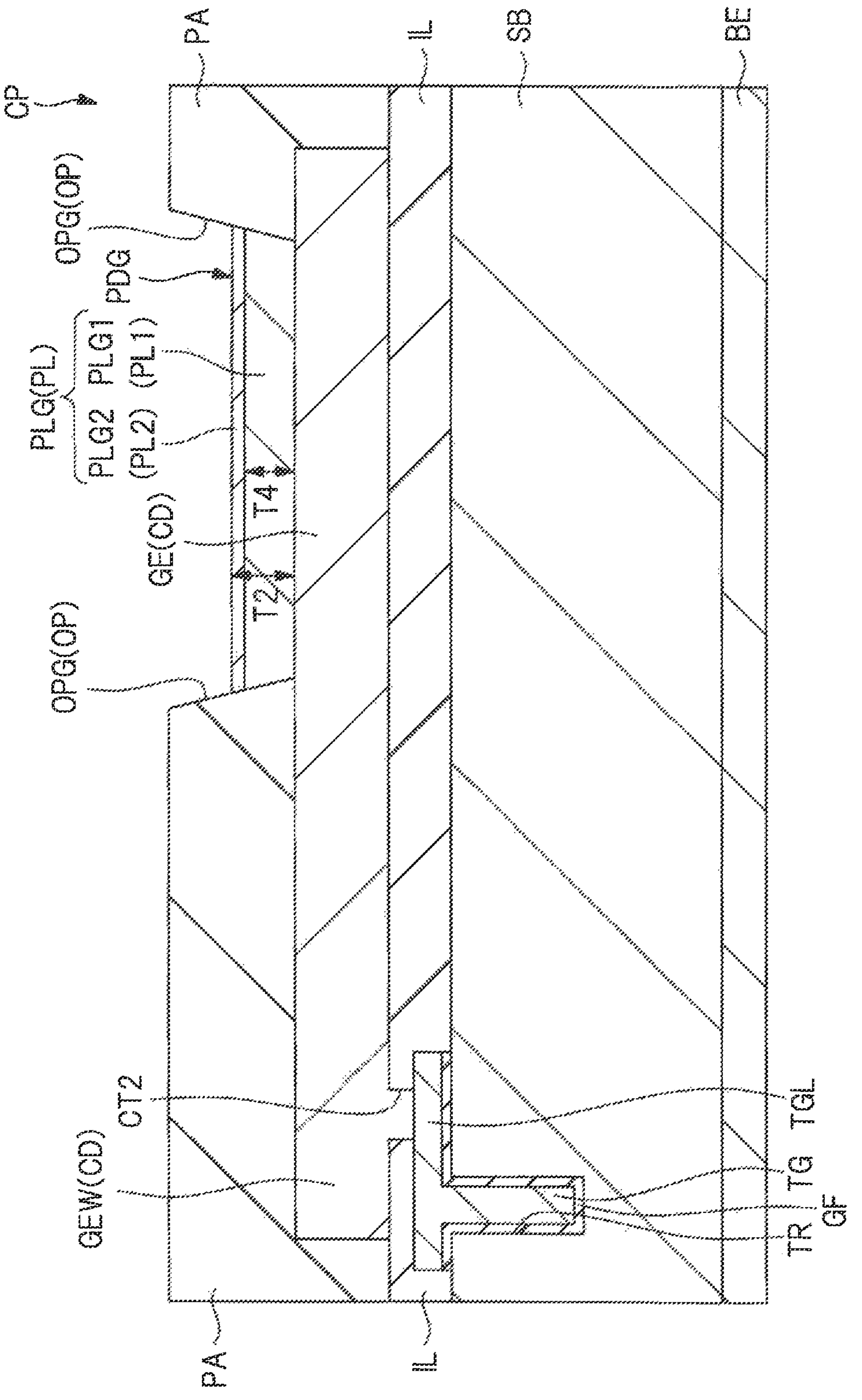
FIG. 12 is a cross-sectional view of the principal portion of the semiconductor device of the embodiment.

In a semiconductor substrate SB constituting the semiconductor device CP, a semiconductor element controlling conduction between the first terminal (the source pad PDS here) formed on the upper surface side of the semiconductor device CP and the second terminal (the back surface electrode BE here) formed on the back surface side of the semiconductor device CP is formed. Note that the semiconductor substrate SB constituting the semiconductor device CP is illustrated in FIGS. 11 and 12 described below although not illustrated in FIGS. 1 and 2. Therefore, the semiconductor device CP controls the semiconductor element formed in the semiconductor substrate SB to control conduction between the first terminal on the upper surface side and the second terminal on the back surface side and allow a current to flow between the first terminal on the upper surface side and the second terminal on the back surface side. Therefore, the semiconductor device CP can be used as a switching element in which a large current flows. The gate pad PDG functions as a control terminal controlling the conduction between the first terminal and the second terminal.

A power transistor can be used as the semiconductor element formed in the semiconductor substrate SB and controlling conduction between the first terminal on the upper surface side of the semiconductor device CP and the second terminal on the back surface side of the semiconductor device CP. As the power transistor, a trench gate-type metal insulator semiconductor field effect transistor (MISFET) can be used. A trench gate-type insulated gate bipolar transistor (IGBT) (an insulated gate bipolar transistor) can also be used. In a case of using the MISFET as the semiconductor element, the first terminal on the upper surface side of the semiconductor device CP is a source terminal, the second terminal on the back surface side of the semiconductor device CP is a drain terminal, and the control terminal on the upper surface side of the semiconductor device CP is a gate terminal. In a case of using the IGBT as the semiconductor element, the first terminal on the upper surface side of the semiconductor device CP is an emitter terminal, the second terminal on the back surface side of the semiconductor device CP is a collector terminal, and the control terminal on the upper surface side of the semiconductor device CP is a gate terminal.

<Semiconductor Package Configuration>

Next, a semiconductor device (semiconductor package) PKG in which the semiconductor device (semiconductor chip) CP is packaged will be described.

Figure 3:
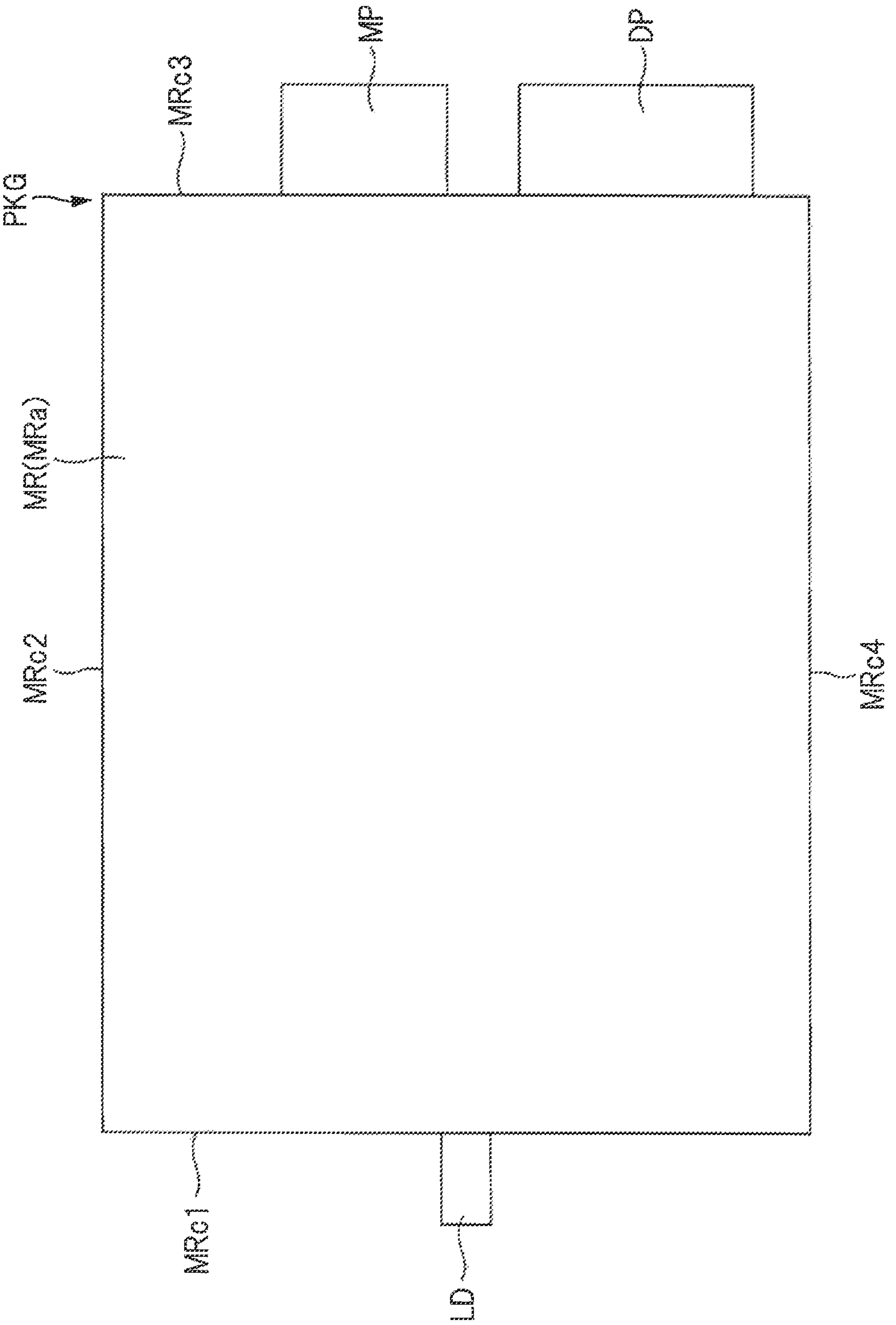
FIG. 3 is a top view of the semiconductor device according to the embodiment.
Figure 4:
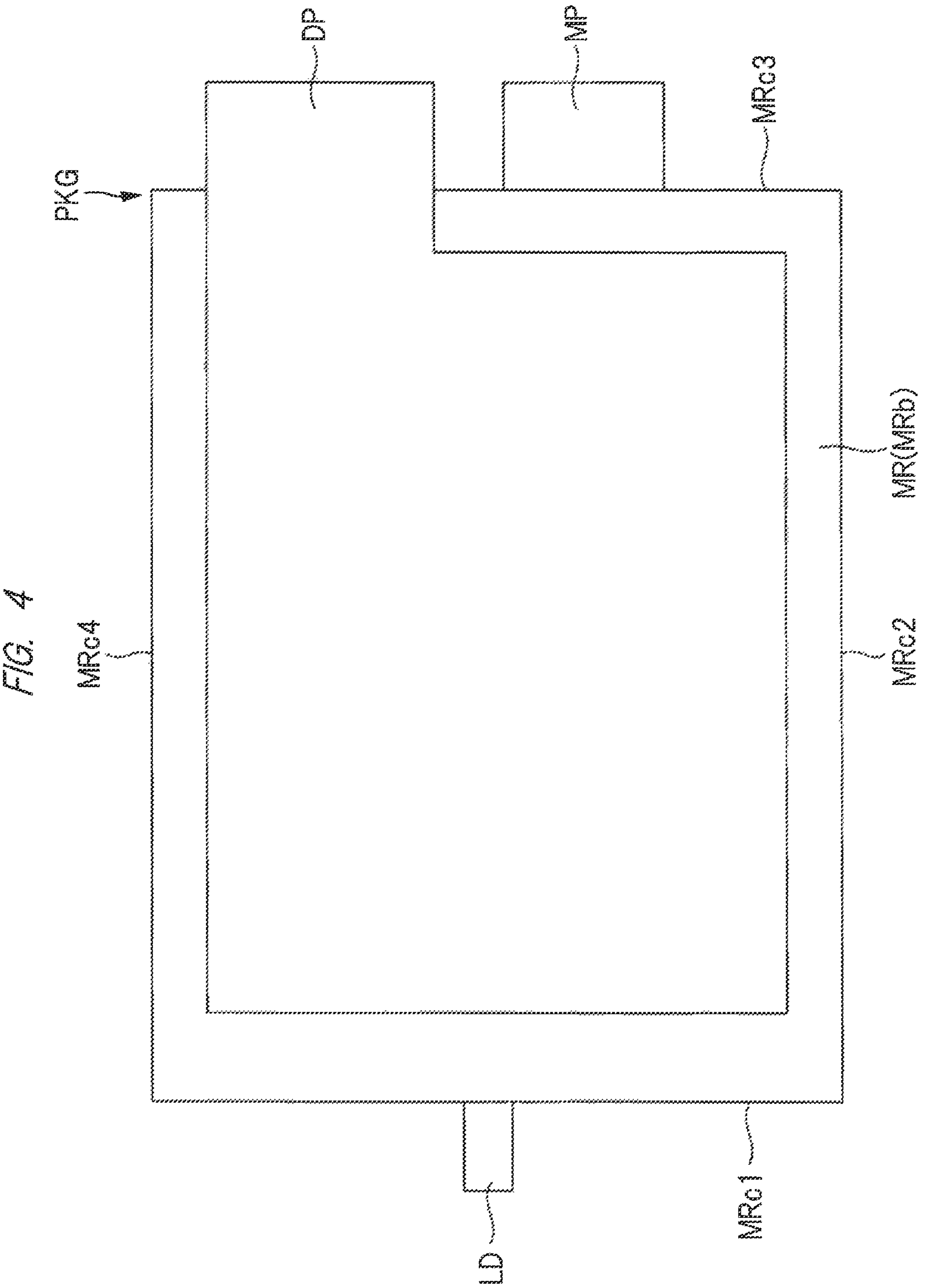
FIG. 4 is a bottom view of the semiconductor device according to the embodiment.
Figure 5:
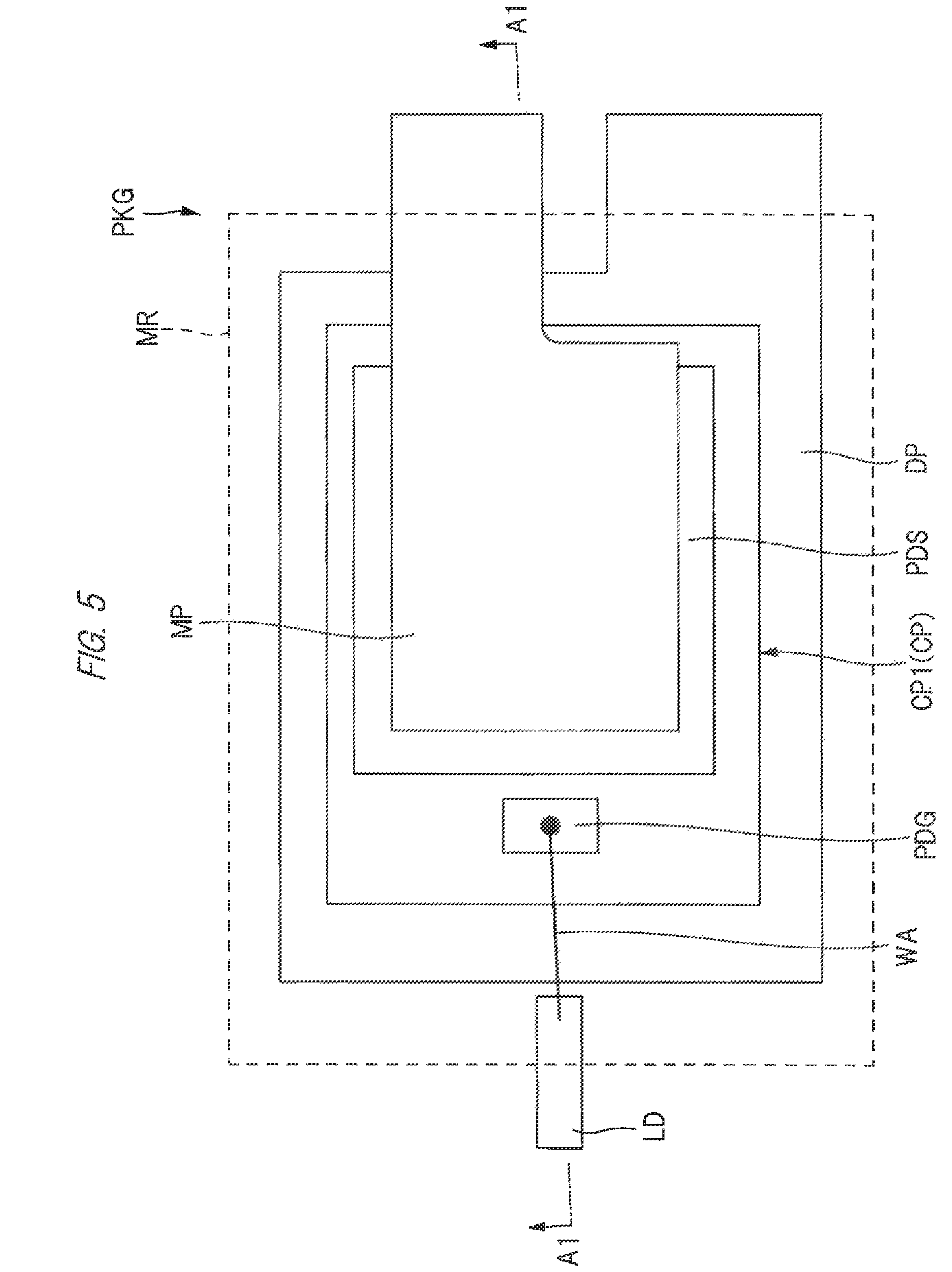
FIG. 5 is a plan perspective view of the semiconductor device of the embodiment.
Figure 6:
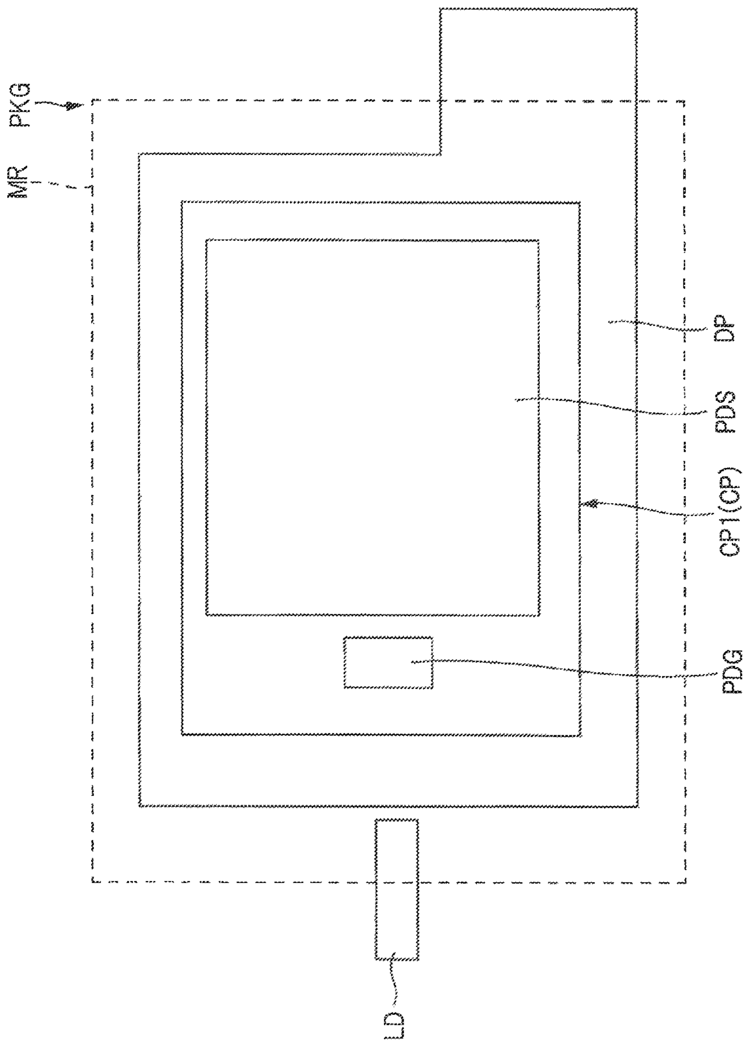
FIG. 6 is a plan perspective view of the semiconductor device of the embodiment.
Figure 7:
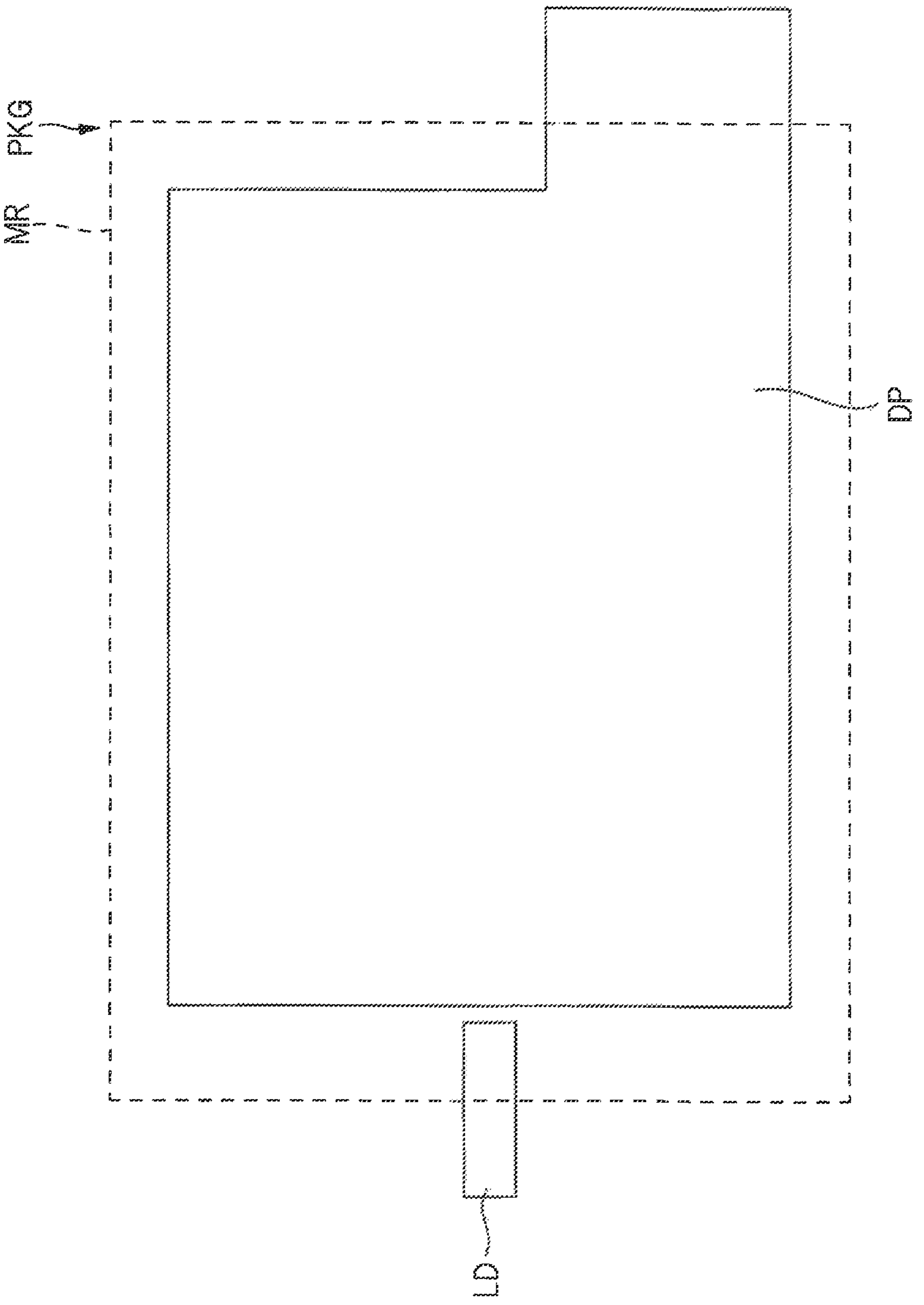
FIG. 7 is a plan perspective view of the semiconductor device of the embodiment.

FIGS. 3 to 8 are a top view (FIG. 3), a bottom view (FIG. 4), plan perspective views (FIGS. 5 to 7), and a cross-sectional view (FIG. 8) each schematically illustrating an example of the semiconductor device PKG in which the semiconductor device CP is packaged. FIG. 3 illustrates an entire plan view of the semiconductor device PKG on an upper surface side thereof, FIG. 4 illustrates an entire plan view of the semiconductor device PKG on a bottom surface (back surface) side, and FIG. 5 illustrates a plan view (top view) seeing through a sealing portion MR as viewed from the upper surface side of the semiconductor device PKG. FIG. 6 corresponds to a diagram obtained by removing a metal plate MP and a wire WA from FIG. 5, and FIG. 7 corresponds to a diagram obtained by further removing a semiconductor chip CP1 from FIG. 6. FIGS. 5 to 7 each illustrate an outer periphery position of the sealing portion MR by a dotted line. Further, the cross-sectional view taken along an A1-A1 line of FIG. 5 substantially corresponds to FIG. 8.

The semiconductor chip CP1 used in the semiconductor device (semiconductor package) PKG illustrated in FIGS. 3 to 8 is the same as the semiconductor device (semiconductor chip) CP illustrated in FIGS. 1 and 2 above. Therefore, repetitive description about the configuration of the semiconductor chip CP1 is omitted here.

As illustrated in FIGS. 3 to 8, the semiconductor device PKG includes the semiconductor chip CP1, a die pad (chip mounting portion) DP over which the semiconductor chip CP1 is mounted, the metal plate (conductor plate) MP bonded to the source pad PDS of the semiconductor chip CP1, a lead LD formed of a conductor, the conductive wire (bonding wire) WA, and the sealing portion (sealing resin portion) MR sealing the aforementioned elements.

The sealing portion MR is made of a resin material such as a thermosetting resin material and can include filler and the like. For example, the sealing portion MR can be formed using an epoxy resin including filler. A phenol curing agent or a biphenyl thermosetting resin to which silicone rubber, filler, and the like are added may be used as the material of the sealing portion MR for the reason that low stress is achieved, for example, other than the epoxy resin.

The sealing portion MR includes an upper surface MRa as one main surface, a lower surface MRb as the other main surface on an opposite side of the upper surface MRa, and side surfaces MRc1, MRc2, MRc3, and MRc4 intersecting with the upper surface MRa and the lower surface MRb. That is, an appearance of the sealing portion MR is a thin plate shape surrounded by the upper surface MRa, the lower surface MRb, and side surfaces MRc1, MRc2, MRc3, and MRc4. Each planar shape of the upper surface MRa and the lower surface MRb of the sealing portion MR is formed into a rectangular shape, for example, and corners of the rectangle may be rounded. Of the side surfaces MRc1, MRc2, MRc3, and MRc4 of the sealing portion MR, the side surface MRc1 and the side surface MRc3 face each other, and the side surface MRc2 and the side surface MRc4 face each other. The side surface MRc1 and the side surfaces MRc2 and MRc4 intersect with each other, and the side surface MRc3 and the side surfaces MRc2 and MRc4 intersect with each other.

The lead (lead portion) LD is formed of a conductor and is preferably made of a metal material such as copper (Cu) or a copper alloy. The lead LD has one portion sealed into the sealing portion MR and the other portion protruding from the side surface of the sealing portion MR outside the sealing portion MR. Hereinafter, a portion positioned inside the sealing portion MR is called an inner lead portion, and a portion positioned outside the sealing portion MR is called an outer lead portion, in each of the lead LD.

Note that the semiconductor device PKG of the present embodiment has a structure in which a part (the outer lead portion) of the lead LD protrudes from the side surface of the sealing portion MR, and hereinafter, the description will be given on the basis of the structure. However, the embodiment is not limited to this structure. For example, a configuration (a QFN-type configuration) in which the lead LD does not substantially protrude from the side surface of the sealing portion MR and a portion of the lead LD is exposed from the lower surface MRb of the sealing portion MR can be employed.

Figure 8:
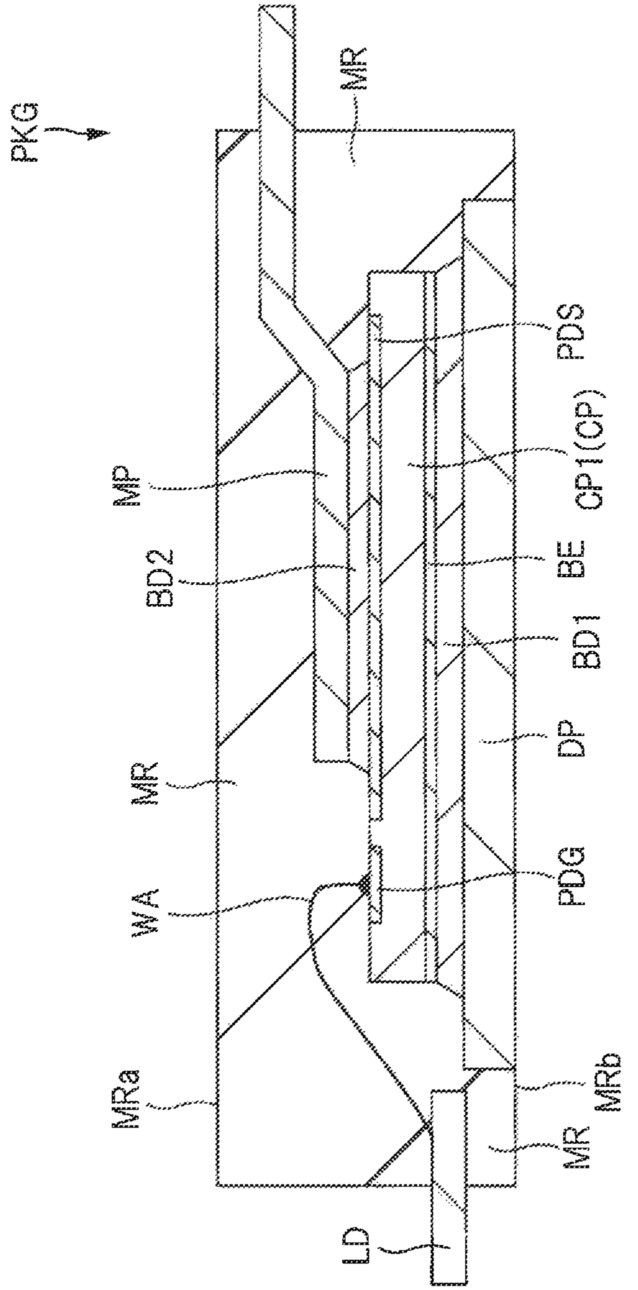
FIG. 8 is a cross-sectional view of the semiconductor device of the embodiment.

The lead LD is arranged on a side surface MRc1 side of the sealing portion MR, and the outer lead portion of the lead LD protrudes from the side surface MRc1 of the sealing portion MR outside the sealing portion MR. In the case of FIG. 8, the outer lead portion of the lead LD is flat. However, as another form, the outer lead portion of the lead LD may be bended in such a manner that a lower surface close to an end of the outer lead portion is substantially flush with the lower surface MRb of the sealing portion MR.

A lower surface (back surface) of the die pad DP is exposed from the lower surface MRb of the sealing portion MR. The die pad DP is not exposed from the upper surface MRa of the sealing portion MR. The die pad DP is a chip mounting portion over which the semiconductor chip CP1 is mounted.

The die pad DP is formed of a conductor and is preferably made of a metal material such as copper (Cu) or a copper alloy. It is more preferable if the die pad DP and the lead LD are made of the same material, and thus, the semiconductor device PKG can be easily manufactured.

The semiconductor chip CP1 is mounted over an upper surface of the die pad DP. The source pad PDS and the gate pad PDG are formed in the front surface of the semiconductor chip CP1, and the back surface electrode (back surface drain electrode) BE is formed over the back surface of the semiconductor chip CP1. Here, the main surface on a side where the source pad PDS and the gate pad PDG are formed is called a front surface of the semiconductor chip CP1 and the main surface on an opposite side of the front surface and over which the back surface electrode BE is formed is called a back surface of the semiconductor chip CP1, of the two main surfaces positioned opposite to each other, in the semiconductor chip CP1.

The semiconductor chip CP1 is mounted over the upper surface of the die pad DP in a state that the front surface of the semiconductor chip CP1 faces upward and the back surface (the back surface electrode BE) of the semiconductor chip CP1 faces the upper surface of the die pad DP. The back surface of the semiconductor chip CP1 is bonded and fixed to the upper surface of the die pad DP via a conductive adhesive layer (a bonding material) BD1. Therefore, the back surface electrode BE of the semiconductor chip CP1 is bonded and fixed to the die pad DP via the conductive adhesive layer BD1 and is electrically connected. The adhesive layer BD1 has conductivity and is made of, for example, a conductive paste adhesive material such as silver (Ag) paste or solder. The semiconductor chip CP1 is sealed inside the sealing portion MR and is not exposed from the sealing portion MR.

Heat generated at the time of operation of the semiconductor chip CP1 can be dissipated outside mainly from the back surface of the semiconductor chip CP1 through the die pad DP. Therefore, the die pad DP has preferably a larger area than the semiconductor chip CP1 mounted over the die pad DP, and with this configuration, a heat dissipation property can be improved.

The gate pad PDG of the semiconductor chip CP1 and the inner lead portion of the lead LD are electrically connected via the wire WA as a conductive connecting member. To be specific, one end of the wire WA is connected to the gate pad PDG of the semiconductor chip CP1, and the other end of the wire WA is connected to the inner lead portion of the lead LD. The gate pad PDG of the semiconductor chip CP1 and the lead LD are electrically connected via the wire WA. The portion of the lead LD (that is, the outer lead portion of the lead LD) not covered with and exposed from the sealing portion MR can function as an external terminal electrically connected to the gate pad PDG of the semiconductor chip CP1.

The wire WA is a conductive connecting member and is more specifically conductive wire, preferably made of a metal wire (thin metal wire) such as a gold (Au) wire, a copper (Cu) wire, or an aluminum (Al) wire. The wire WA is sealed inside the sealing portion MR and is not exposed from the sealing portion MR.

The metal plate MP is bonded and fixed to the source pad PDS of the semiconductor chip CP1 via a conductive adhesive layer (bonding material) BD2 to be electrically connected with the source pad PDS of the semiconductor chip CP1. The adhesive layer BD2 has conductivity and is preferably made of solder. Therefore, the metal plate MP is electrically connected with the source pad PDS of the semiconductor chip CP1 via the adhesive layer BD2 made of solder. Therefore, the source pad PDS of the semiconductor chip CP1 serves as a pad (bonding pad) for connecting the metal plate MP, and the gate pad PDG of the semiconductor chip CP1 serves as a pad (bonding pad) for connecting the wire WA.

The metal plate MP has a portion exposed from the sealing portion MR. To be specific, the portion of the metal plate MP protrudes from the side surface MRc3 of the sealing portion MR outside the sealing portion MR. That is, the metal plate MP includes a portion positioned outside the sealing portion MR and a portion positioned inside the sealing portion MR, and the portion of the metal plate MP positioned inside the sealing portion MR is bonded to the source pad PDS of the semiconductor chip CP1 via the adhesive layer BD2. The portion of the metal plate MP not covered with and exposed from the sealing portion MR can function as an external terminal electrically connected with the source pad PDS of the semiconductor chip CP1.

The metal plate MP is preferably made of metal (metal material) having high conductivity and thermal conductivity and can be preferably made of copper (Cu) or a copper (Cu) alloy. It is more preferable if the metal plate MP is made of copper (Cu) or a copper (Cu) alloy in terms of easy processing, high thermal conductivity, and relatively inexpensive price. Further, the metal plate MP can be made of aluminum (Al) or an aluminum (Al) alloy. A width of the metal plate MP is larger (wider) than a width (diameter) of the wire WA. The metal plate MP having lower resistance than the wire WA is connected with the source pad PDS of the semiconductor chip CP1, and thus, ON resistance of the semiconductor element (a vertical MISFET here) formed in the semiconductor chip CP1 can be reduced. Therefore, in the semiconductor device PKG, package resistance can be reduced, and a conduction loss can be reduced. Further, by using the metal plate MP made of a metal material cheaper than gold, instead of the wire made of gold (Au), manufacturing costs of the semiconductor device PKG can be reduced.

Further, in the case of FIGS. 3 to 8, the portion of the metal plate MP is exposed from the sealing portion MR and functions as an external terminal. As another form, an additional lead is provided in the semiconductor device PKG, and the metal plate MP can be bonded to the additional lead, inside the sealing portion MR, via a conductive bonding material (preferably, solder). In this case, the source pad PDS of the semiconductor chip CP1 is electrically connected with the metal plate MP via the conductive adhesive layer BD2, and the metal plate MP is electrically connected with the additional lead via a conductive bonding material. Therefore, the source pad PDS of the semiconductor chip CP1 is electrically connected with the additional lead via the metal plate MP and the like. Therefore, in this case, a portion of the additional lead is exposed from the sealing portion MR and functions as an external terminal, and thus, the metal plate MP does not need to expose from the sealing portion MR. Note that the additional lead described here also has conductivity similarly to the lead LD and can be formed of a material similar to the lead LD.

The lower surface of the die pad DP is exposed from the lower surface MRb of the sealing portion MR. Further, a portion of the die pad DP protrudes from the side surface MRc3 of the sealing portion MR outside the sealing portion MR. The die pad DP and the metal plate MP are not in contact with each other. The portion of the die pad DP not covered with and exposed from the sealing portion MR can function as an external terminal electrically connected with the back surface electrode BE of the semiconductor chip CP1.

In a case where the portion of the metal plate MP and the portion of the die pad DP are made to protrude from the same side surface MRc3 of the sealing portion MR, the portion of the metal plate MP protruding from the side surface MRc3 of the sealing portion MR and the portion of the die pad DP protruding from the side surface MRc3 of the sealing portion MR preferably do not overlap with each other in plan view. With this configuration, external equipment or the like can be easily connected to the metal plate MP as a source terminal of the semiconductor device PKG and the die pad DP as a drain terminal. Also, in the case of FIGS. 3 to 8, the portion of the die pad DP protrudes from the side surface MRc3 of the sealing portion MR outside the sealing portion MR. As another form, there may be a case where the portion of the die pad DP does not protrude from the side surface MRc3 of the sealing portion MR.

A conduction current (ON current) of the semiconductor element formed in the semiconductor chip CP1 mainly flows between the metal plate MP and the die pad DP. By use of the metal plate MP for a conduction path, the conduction loss can be reduced. Although the wire WA has higher resistance than the metal plate MP, the current flowing in the conduction path from the gate pad PDG to the lead LD is smaller than the current flowing in the conduction path from the source pad PDS to the metal plate MP, and thus, the gate pad PDG and the lead LD are electrically connected by the wire WA.

Figure 9:
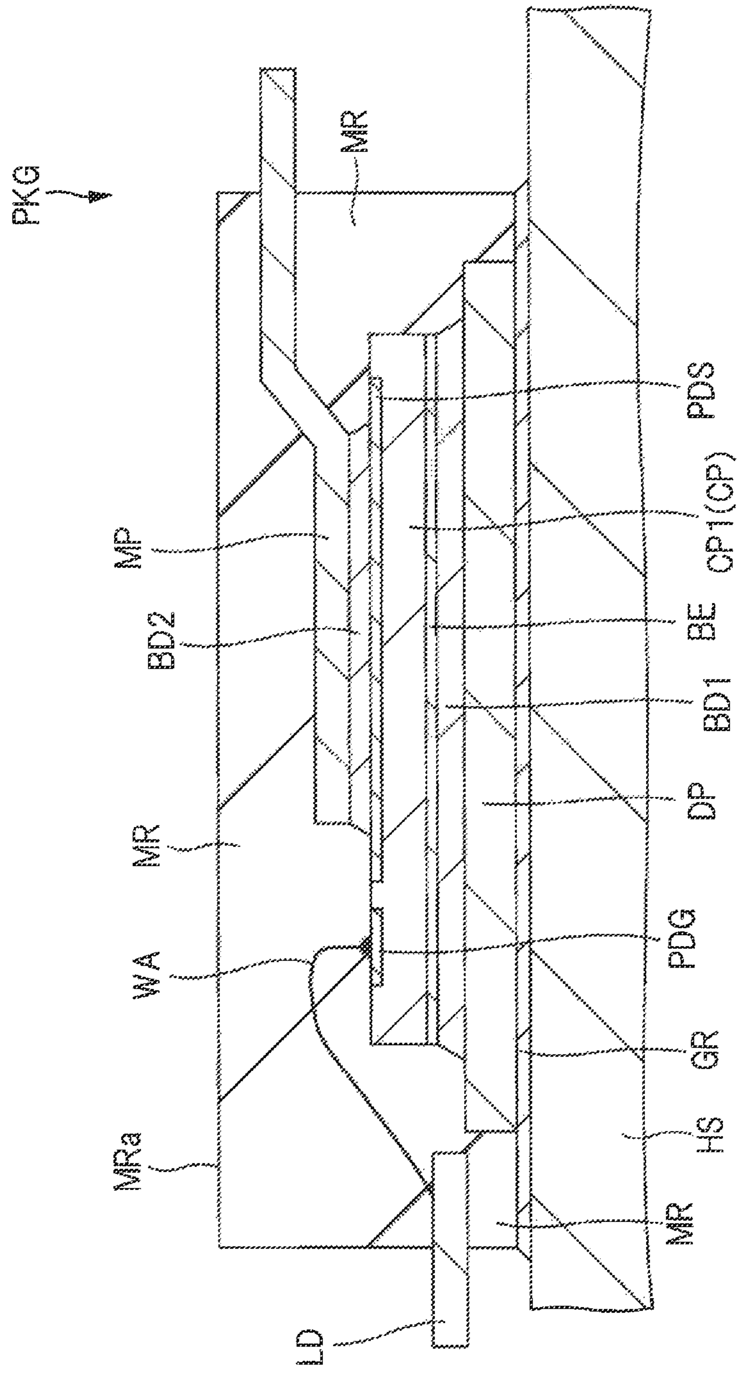
FIG. 9 is a cross-sectional view illustrating an example of a mounted form of the semiconductor device of the embodiment.

FIG. 9 is a cross-sectional view illustrating an example of a mounted form of the semiconductor device PKG. FIG. 9 illustrates a cross-section corresponding to FIG. 8 described above.

As illustrated in FIG. 9, the semiconductor device PKG can be mounted over a metal plate (heat sink) HS, for example. The metal plate HS is a metal plate including a water cooling mechanism. In the case of FIG. 9, the semiconductor device PKG is mounted over an upper surface of the metal plate HS via thermal conductive grease GR in such a manner that the lower surface of the die pad DP faces the upper surface of the metal plate HS. Therefore, the thermal conductive grease GR is interposed between the die pad DP of the semiconductor device PKG and the metal plate HS. In the case of FIG. 9, heat generated in the semiconductor chip CP1 of the semiconductor device PKG can be mainly dissipated to the metal plate HS through the conductive adhesive layer BD1, the die pad DP, and the thermal conductive grease GR.

Next, a process of manufacturing the semiconductor device PKG will be described.

To manufacture the semiconductor device PKG, a lead frame integrally including the die pad DP and the lead LD is prepared. In the lead frame, the die pad DP and the lead LD are integrally coupled with a frame (not illustrated) of the lead frame.

Next, a die bonding step is performed. The semiconductor chip CP1 is mounted over and bonded to the upper surface of the die pad DP of the lead frame via bonding material (this bonding material serves as the adhesive layer BD1). By the step, the back surface of the semiconductor chip CP1 is bonded and fixed to the upper surface of the die pad DP via the conductive adhesive layer (bonding material) BD1.

Next, a wire bonding step is performed. The gate pad PDG of the semiconductor chip CP1 and the lead LD of the lead frame are connected via the wire WA.

Next, the metal plate MP is bonded and fixed to the source pad PDS of the semiconductor chip CP1 via a bonding material (this bonding material serves as the adhesive layer BD2). The bonding material (adhesive layer BD2) used here is a conductive bonding material and is preferably solder.

After that, a molding step is performed. The sealing portion MR is formed, the die pad DP and the lead LD are then separated from the lead frame- and the outer lead portion of the lead LD is bended as needed, so that the semiconductor device PKG can be manufactured.

Further, here, a case in which the step of bonding the metal plate MP to the source pad PDS of the semiconductor chip CP1 is performed after the wire bonding step has been described. However, the order can be switched, and the wire bonding step can be performed after the step of bonding the metal plate MP to the source pad PDS of the semiconductor chip CP1.

Further, here, a case in which the semiconductor device PKG includes one semiconductor chip CP1 has been described. However, the embodiment is not limited to the case, and the semiconductor device PKG may include a plurality of semiconductor chips. FIG. is a plan perspective view of a semiconductor device PKG of a modification, and the semiconductor device PKG in FIG. 10 includes the semiconductor chips CP1 and CP2. Note that FIG. 10 illustrates a top plan view seen through a sealing portion MR1, similarly to FIG. 5.

Figure 10:
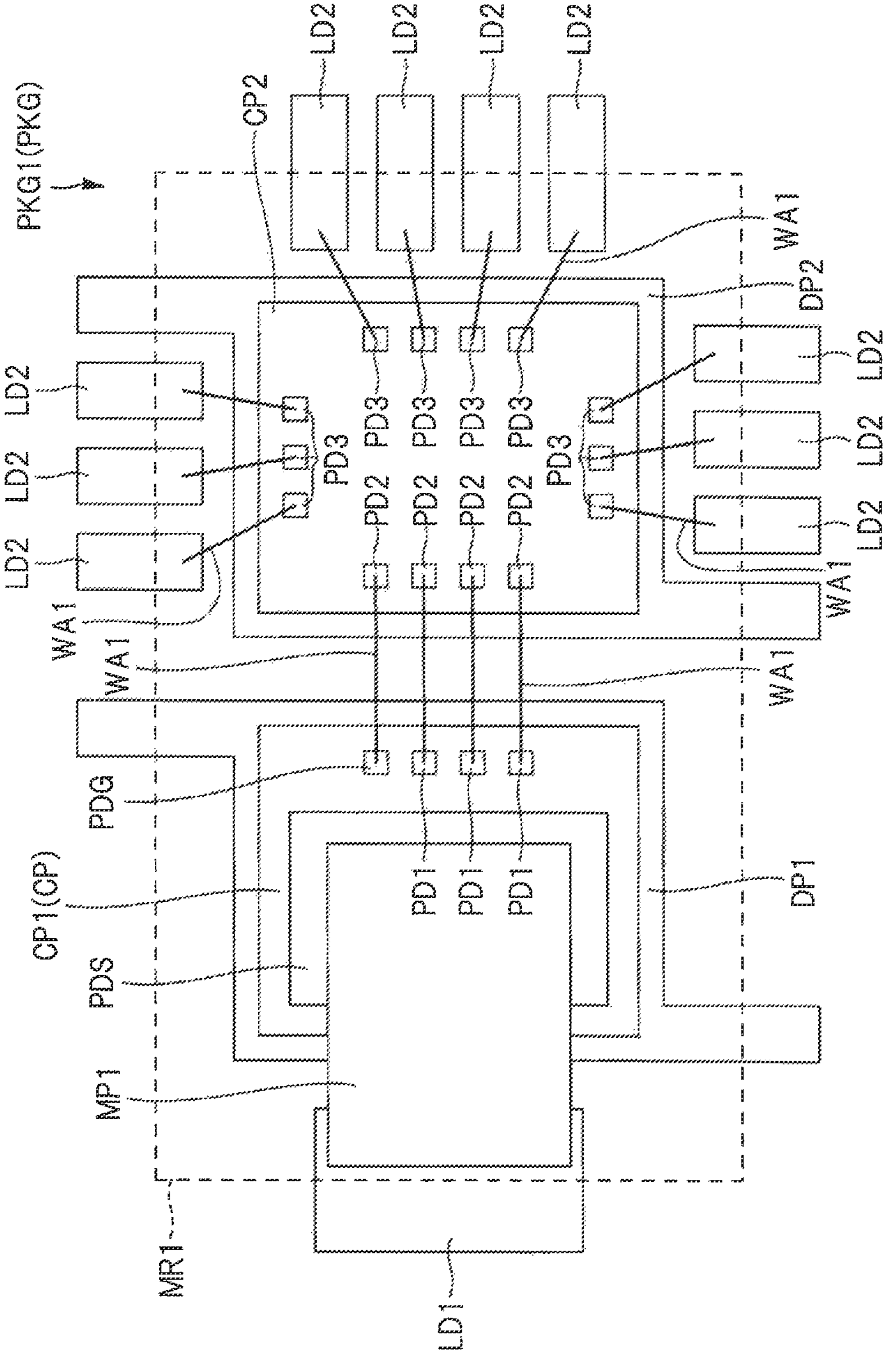
FIG. 10 is a plan perspective view of a semiconductor device of a modification.

The semiconductor device PKG of the modification illustrated in FIG. 10 includes not only the semiconductor chip CP1 corresponding to the above-described semiconductor device CP but also another semiconductor chip CP2, and the semiconductor chips CP1 and CP2 are sealed in the sealing portion MR1. The semiconductor chip CP2 is a semiconductor chip including a control circuit for controlling the semiconductor chip CP1, for example. Here, the semiconductor device PKG illustrated in FIG. 10 is denoted with reference character PKG1 and is called a semiconductor device PKG1.

A schematic configuration of the semiconductor device PKG1 illustrated in FIG. 10 is as follows.

That is, the semiconductor device PKG1 includes semiconductor chips CP1 and CP2, a die pad DP1 over which the semiconductor chip CP1 is mounted, a die pad DP2 over which the semiconductor chip CP2 is mounted, a metal plate MP1 bonded to a source pad PDS of the semiconductor chip CP1, a plurality of conducive leads LD1 and LD2, a plurality of conductive wires WA1, and a sealing portion (sealing resin portion) MR1 sealing the aforementioned elements. The die pads DP1 and DP2 correspond to the above-described die pad DP, the metal plate MP1 corresponds to the above-described metal plate MP, the leads LD1 and LD2 correspond to the above-described lead LD, the wire WA1 corresponds to the above-described wire WA, and the sealing portion MR1 corresponds to the sealing portion MR.

The metal plate MP1 is bonded and fixed to the source pad PDS of the semiconductor chip CP1 via solder to be electrically connected with the source pad PDS of the semiconductor chip CP1. The other end of the metal plate MP1 is bonded to the lead LD1 via solder to be electrically connected with the lead LD1. Therefore, the source pad PDS of the semiconductor chip CP1 is electrically connected with the lead LD1 via the metal plate MP1. The above-described back surface electrode BE of the semiconductor chip CP1 is bonded and fixed to the die pad DP1 via a conductive adhesive layer to be electrically connected with the die pad DP1.

The semiconductor chip CP1 may include and may not include a pad (bonding pad) other than the source pad PDS and the gate pad PDG. In the case of FIG. 10, the semiconductor chip CP1 further includes a pad (bonding pad) PD1 other than the source pad PDS and the gate pad PDG. Each area (planar size) of the gate pad PDG and the pad PD1 is smaller than an area of the source pad PDS. The gate pad PDG and the pad PD1 of the semiconductor chip CP1 are respectively electrically connected with pads PD2 of the semiconductor chip CP2 via the wires WA1. Therefore, the source pad PDS of the semiconductor chip CP1 is a pad for connecting the metal plate MP1, and the gate pad PDG and the pad PD1 of the semiconductor chip CP are pads for connecting the wires WA1. Other pads PD3 the semiconductor chip CP2 are electrically connected with the leads LD2 via the wires WA1.

<Internal Configuration of Semiconductor Chip>

Next, an internal configuration of the semiconductor device (semiconductor chip) CP will be described with reference to the drawings.

Figure 13:
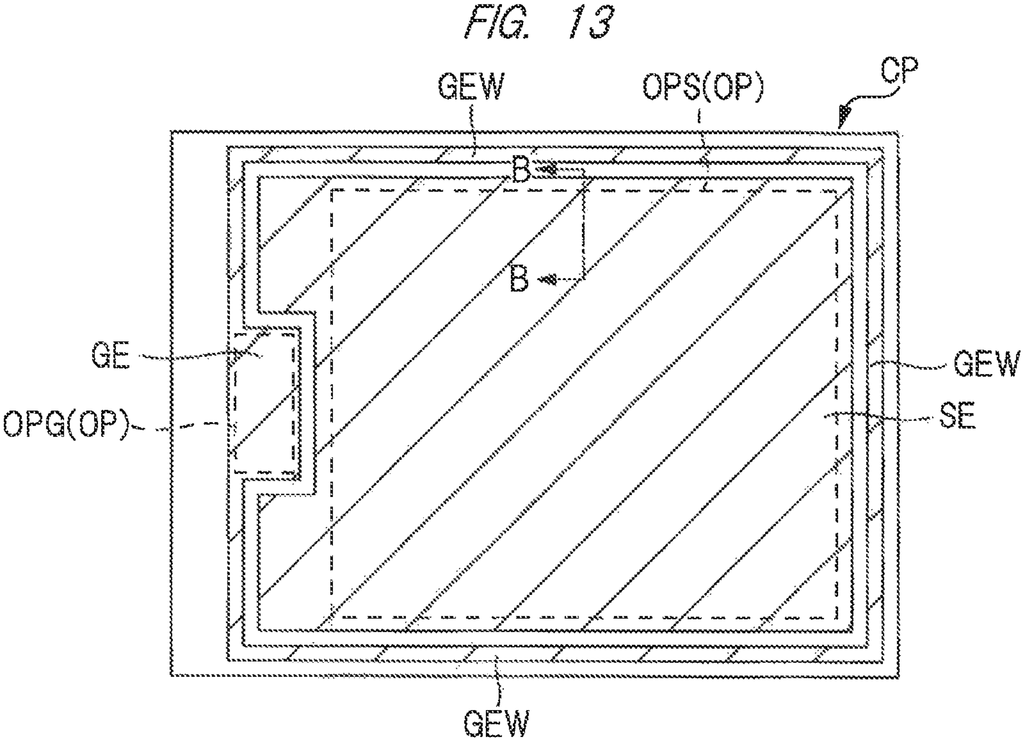
FIG. 13 is a plan perspective view of the semiconductor device of the embodiment.
Figure 14:
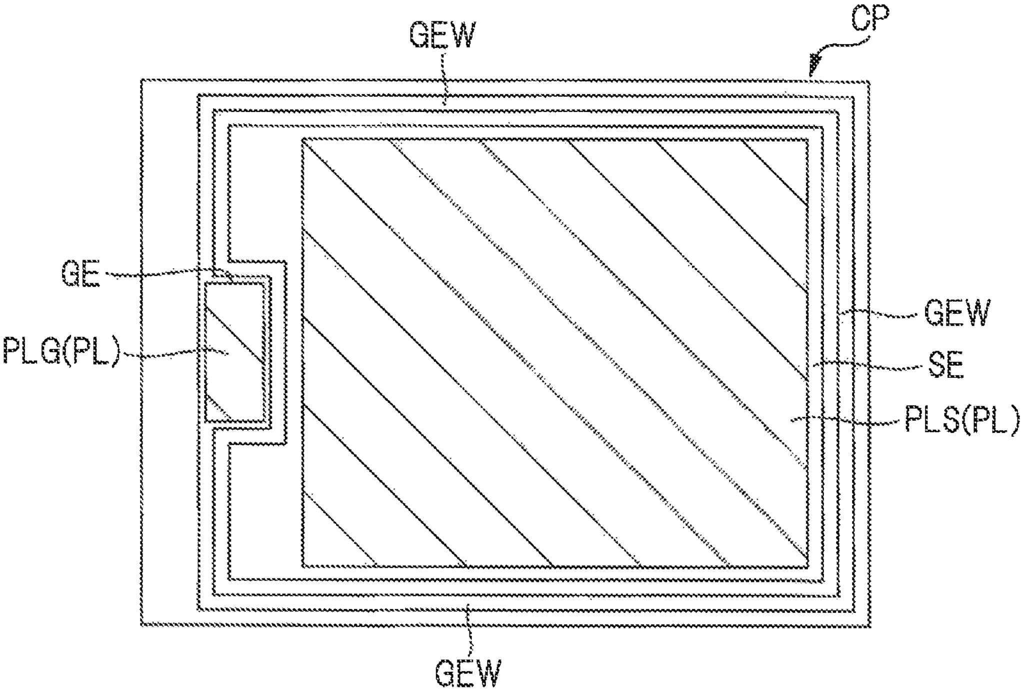
FIG. 14 is a plan perspective view of the semiconductor device of the embodiment.

FIGS. 11 and 12 are cross-sectional views each illustrating a principal portion of the semiconductor device CP of the present embodiment. FIG. 11 substantially corresponds to a cross-sectional view taken along a B-B line of FIGS. 1 and 13, and FIG. 12 corresponds to a cross-sectional view crossing the gate pad PDG. Also, FIGS. 13 and 14 are plan perspective views of the semiconductor device CP of the present embodiment. FIGS. 13 and 14 illustrate plan views (top views) seen through the insulating film PA when the semiconductor chip CP viewed from the upper surface side.

Note that, in FIG. 13, a source electrode SE, a gate electrode GE, and a gate wiring GEW are hatched to facilitate understanding of forming positions of the source electrode SE, the gate electrode GE, and the gate wiring GEW. Further, the positions of the opening portions OP (OPG and OPS) are illustrated by the dotted lines. Further, in FIG. 14, plated layers PL (PLG and PLS) are hatched to facilitate understanding of forming positions of the plated layers PL (PLG and PLS). As described below, the plated layers PL are formed over a conductive film CD exposed in the opening portions OP. Therefore, as can be seen by comparison of FIGS. 13 and 14, the forming positions of the opening portions OP and the forming positions of the plated layers PL match with each other in plan view.

As illustrated in FIGS. 11 and 12, the semiconductor substrate SB constituting the semiconductor device (semiconductor chip) CP is made of n-type single crystal silicon and the like into which n-type impurities such as arsenicum (As) are doped, for example. As the semiconductor substrate SB, a semiconductor substrate (so-called epitaxial wafer) in which an epitaxial layer made of $n^-$-type single crystal silicon having lower impurity concentration than a substrate main body made of an n-type single crystal silicon substrate is formed over the substrate main body can also be used.

A trench gate-type MISFET is formed in the semiconductor substrate SB constituting the semiconductor device (semiconductor chip) CP. The trench gate-type MISFET is a MISFET having a trench-type gate structure (a gate electrode structure in which a gate electrode is embedded in a trench provided in the substrate). A specific configuration of the trench gate-type MISFET formed in the semiconductor substrate SB will be described below.

The trench gate-type MISFET constituting a power transistor (power semiconductor element) is formed in a main surface of the semiconductor substrate SB. To be specific, a plurality of unit transistor cells Q1 are formed in the main surface of the semiconductor substrate SB, and the plurality of unit transistor cells Q1 formed in the semiconductor substrate SB are arranged in parallel, thereby forming one power transistor. Each of the unit transistor cells Q1 is formed of the trench gate-type MISFET. Here, a plane region where the plurality of unit transistor cells Q1 constituting the power transistor are formed in the main surface of the semiconductor substrate SB is called a transistor cell region.

The semiconductor substrate SB functions as a drain region of the unit transistor cells Q1. The back surface electrode BE for drain is formed over the entire back surface of the semiconductor substrate SB. The back surface electrode BE functions as a drain terminal.

The back surface electrode BE can be formed of a layered film including a titanium (Ti) layer, a nickel (Ni) layer, and a gold (Au) layer in this order from the back surface of the semiconductor substrate SB, for example.

Note that, in the semiconductor substrate SB, a main surface opposite to a side where a trench for trench gate electrode TG is formed is called a back surface of the semiconductor substrate SB.

A p-type semiconductor region PR is formed in the semiconductor substrate SB in the transistor cell region. The p-type semiconductor region PR functions as a channel forming region of the unit transistor cell Q1.

Further, an $n^-$-type semiconductor region NR is formed on the p-type semiconductor region PR in the semiconductor substrate SB of the transistor cell region. The $n^+$-type semiconductor region NR functions as a source region of the unit transistor cell Q1 and is thus a source semiconductor region. The p-type semiconductor region PR is present under the $n^+$-type semiconductor region NR. A portion of the semiconductor substrate SB interposed between the p-type semiconductor region PR and the back surface electrode BE maintains the n-type conductivity type, and functions as a drain region of the unit transistor cell Q1.

The trench TR extending in a thickness direction of the semiconductor substrate SB from the main surface of the semiconductor substrate SB is formed in the semiconductor substrate SB, and the trench gate electrode TG is embedded in the trench TR via a gate insulating film GF. Since the gate insulating film GF made of an insulating film such as a silicon oxide film is formed over a bottom surface and a side surface of the trench TR, the gate insulating film GF is interposed between the trench gate electrode TG embedded in the trench TR and the semiconductor substrate SB. The trench gate electrode TG is made of the conductive film embedded in the trench TR of the semiconductor substrate SB and is made of, for example, a doped polysilicon film. Although illustration is omitted, the trench TR is formed in a stripe or in a grid in plan view in the main surface of the semiconductor substrate SB, for example.

The trench TR is formed to penetrate the $n^+$-type semiconductor region NR and the p-type semiconductor region PR and to be terminated in the n-type semiconductor substrate SB, from the upper surface of the semiconductor substrate SB. Therefore, the bottom surface of the trench TR is deeper than a bottom surface of the $n^+$-type semiconductor region NR and is deeper than a bottom surface of the p-type semiconductor region PR to be positioned in the middle of a depth direction of the n-type semiconductor substrate SB.

The trenches TR and the trench gate electrodes TG respectively embedded in the trenches TR illustrated in FIG. 11 extend in a direction perpendicular to the sheet surface of the FIG. 11. However, the trench gate electrodes TG are integrally coupled in a region not illustrated in the cross-sectional views of FIGS. 11 and 12. The trench gate electrodes TG of the plurality of unit transistor cells Q1 formed in the semiconductor substrate SB are electrically connected to one another and are electrically connected to the gate wiring GEW described below.

Next, a structure of an upper layer than the semiconductor substrate SB will be described.

An insulating film (interlayer insulating film) IL is formed over the upper surface of the semiconductor substrate SB to cover the trench gate electrode TG. The insulating film IL is an interlayer insulating film and made of a silicon oxide film, for example.

Contact holes (opening portions or through holes) CT1 and CT2 are formed in the insulating film IL. The contact hole CT1 is a source contact hole and is formed between adjacent trenches TR in plan view.

The contact hole CT2 is a gate contact hole. In the case of FIG. 12, a gate lead-out portion (gate lead-out wiring portion) TGL integrally formed with the trench gate electrode TG is made to extend onto the semiconductor substrate SB outside the trench TR, and the contact hole CT2 is formed on the gate lead-out portion TGL. Apart of the gate lead-out portion TGL is exposed at a bottom portion of the contact hole CT2. An insulating film of the same layer as the gate insulating film GF is interposed between the gate lead-out portion TGL and the semiconductor substrate SB.

The source electrode SE, the gate electrode GE, and the gate wiring GEW are formed over the insulating film IL. The source electrode SE, the gate electrode GE, and the gate wiring GEW are made of a patterned conductive film. To be specific, the source electrode SE, the gate electrode GE, and the gate wiring GEW are formed in such a manner that a conductive film CD is formed to fill the contact holes CT1 and CT2 over the insulating film IL in which the contact holes CT1 an CT2 are formed, and then, the conductive film CD is patterned.

The conductive film (metal film) CD is made of a metal film containing aluminum (Al) as a main component, and to be specific, is made of an aluminum film or an aluminum alloy film. In a case of using the aluminum alloy film as the conductive film CD, an aluminum alloy film to which silicon (Si) is added, that is, an Al—Si alloy film, or an aluminum alloy film to which copper (Cu) is added, that is, an Al—Cu alloy film, for example, can be preferably used.

Note that, in the case of using the aluminum alloy film as the conductive film CD, an aluminum (Al)-rich aluminum alloy film is preferable. Here, aluminum (Al) rich means that a composition ratio of aluminum (Al) is larger than 50 atomic %. Therefore, the aluminum (Al) content percentage of the conductive film CD is preferably larger than 50 atomic %, and more preferably, 98 atomic % or more. Further, a thickness of the conductive film CD can be set to substantially 3000 to 5000 nm, for example.

The gate electrode GE and the gate wiring GEW are integrally formed. However, the source electrode SE is separated from the gate electrode GE and the gate wiring GEW. That is, while the gate electrode GE and the gate wiring GEW are integrally formed and connected to each other, the source electrode SE is not connected to both the gate electrode GE and the gate wiring GEW.

The source electrode SE is formed over the insulating film IL, and a portion of the source electrode SE fills the source contact hole CT1. The portion of the source electrode SE filling the source contact hole CT1 is called a "via portion of the source electrode SE" or a "source via portion."

The gate wiring GEW is formed over the insulating film IL, and a portion of the gate wiring GEW fills the gate contact hole CT2. The portion of the gate wiring GEW filling the gate contact hole CT2 is called a "via portion of the gate wiring GEW" or a "gate via portion."

Further, here, a case in which the source via portion is integrally formed with the source electrode SE and the gate via portion is integrally formed with the gate wiring GEW is described. As another form, the source via portion (a conductive portion filling the source contact hole CT1) can be formed in a separate process from the source electrode SE, and the gate via portion (a conductive portion filling the gate contact hole CT2) can be formed in a separate process from the gate wiring GEW.

The source electrode SE is formed in the entire plane region (transistor cell region) in which the plurality of unit transistor cells Q1 are formed. The source contact hole CT1 is formed on an upper side of the semiconductor substrate SB between the trenches TR in plan view in the transistor cell region and penetrates the insulating film IL and the $n^+$-type semiconductor region NR, and a bottom portion of the contact hole CT1 reaches the p-type semiconductor region PR. Therefore, the source via portion embedded in the source contact hole CT1 also penetrates the insulating film IL and the $n^+$-type semiconductor region NR, and a bottom portion of the source via portion reaches the p-type semiconductor region PR. Since a lower side surface of the source via portion is in contact with the $n^+$-type semiconductor region NR, and the bottom portion of the source via portion is in contact with the p-type semiconductor region PR. Therefore, the source via portion is electrically connected to the $n^+$-type semiconductor region NR and the p-type semiconductor region PR.

A plurality of the source contact holes CT1 are formed in the transistor cell region, and the source regions (the $n^+$-type semiconductor regions NR) and the channel forming regions (the p-type semiconductor regions PR) of the plurality of unit transistor cells Q1 provided in the transistor cell region are electrically connected to the common source electrode SE via the source via portions embedded in the plurality of contact holes CT1. Therefore, the source pad PDS is electrically connected with the source regions (the $n^+$-type semiconductor regions NR) and the channel forming regions (the p-type semiconductor regions PR) of the plurality of unit transistor cells Q1 provided in the transistor cell region, through the source electrode SE.

The gate electrode GE and the gate wiring GEW are formed in positions not overlapping with the source electrode SE in plan view. For example, the gate wiring GEW is formed to surround the transistor cell region around the transistor cell region in plan view and is thus formed to surround the source electrode SE. The gate electrode GE is arranged outside the transistor cell region in plan view and is integrally formed with the gate wiring GEW. The gate electrode GE is an electrode portion (conductor portion) for forming the gate pad PDG, and a width of the gate electrode GE is larger than a width of the gate wiring GEW. The gate electrode GE and the gate wiring GEW are integrally formed, and thus, the gate electrode GE and the gate wiring GEW are electrically connected to each other.

Since the gate contact hole CT2 is formed on the gate lead-out portion TGL, the gate via portion is in contact with the gate lead-out portion TGL to be electrically connected. Therefore, the gate electrode GE is electrically connected with the trench gate electrodes TG of the plurality of unit transistor cells Q1 provided in the transistor cell region through the gate wiring GEW, the gate via portion, and the gate lead-out portion TGL. Therefore, the gate pad PDG is electrically connected with the trench gate electrodes TG of the plurality of unit transistor cells Q1 provided in the transistor cell region, through the gate electrode GE and the gate wiring GEW.

The conductive film CD (the source electrode SE, the gate electrode GE, and the gate wiring GEW) is covered with the insulating film (a protection film or a passivation film) PA for surface protection. That is, the insulating film PA is formed over the insulating film IL to cover the conductive film CD (the source electrode SE, the gate electrode GE, and the gate wiring GEW). The insulating film PA is an uppermost layer film (insulating film) of the semiconductor device CP. The insulating film PA is made of a resin film such as a polyimide resin.

A plurality of opening portions OP are formed in the insulating film PA, and a portion of the conductive film CD is exposed in each of the opening portions OP. A plated layer PL is formed over the conductive film CD exposed in the opening portion OP. The plated layer PL is selectively formed over the conductive film CD exposed in the opening portion OP, and the plated layer PL is not formed over part of the conductive film CD covered with the insulating film PA. The plated layer PL is preferably made of a layered film including a nickel (Ni) plated layer PL1 and a gold (Au) plated layer PL2 over the nickel plated layer PL1. The conductive film CD exposed in the opening portion OP and the plated layer PL formed over the exposed conductive film CD serve as a pad electrode (bonding pad), the source pad PDS is formed of the conductive film CD exposed in the opening portion OPS and the plated layer PL over the exposed conductive film CD, and the gate pad PDG is formed of the conductive film CD exposed in the opening portion OPG, and the plated layer PL over the exposed conductive film CD.

That is, of the opening portions OP formed in the insulating film PA, a portion of the source electrode SE is exposed in the opening portion OPS for forming a source bonding pad, and the plated layer PL is formed over the portion of the source electrode SE exposed in the opening portion OPS. The portion of the source electrode SE exposed in the opening portion OPS in the insulating film PA and the plated layer PL over the exposed portion of the source electrode SE serve as the source pad PDS as the source bonding pad. Further, of the opening portions OP formed in the insulating film PA, a portion of the gate electrode GE is exposed in the opening portion OPG for forming a gate bonding pad, and the plated layer PL is formed over the portion of the gate electrode GE exposed in the opening portion OPG. The gate pad PDG as the gate bonding pad is formed of the portion of the gate electrode GE exposed in the opening portion OPG in the insulating film PA and the plated layer PL over the exposed portion of the gate electrode GE. In plan view, the opening portion OPS is included in the source electrode SE as well as the opening portion OPG is included in the gate electrode GE. The gate wiring GEW is not exposed in the opening portion OP, and the entire gate wiring GEW is covered with the insulating film PA.

Since the source electrode SE is formed in almost the entire transistor cell region in plan view, an area of the source electrode SE is larger than an area of the gate electrode GE. An area of the opening portion OPS is larger than an area of the opening portion OPG, reflecting the aforementioned fact. Each planar shape of the opening portions OPG and OPS is a rectangle, for example. The planar shape of the gate electrode GE is also a rectangle, for example. Further, the planar shape of the source electrode SE can be a rectangle and can be appropriately changed according to the planar shape of the transistor cell region. Examples of planar sizes of the opening portions OPG and OPS include 1 $mm^2$ or less for the opening portion OPG and substantially 9 $mm^2$ or more for the opening portion OPS.

The nickel plated layer PL1, of the plated layer PL, functions as a barrier layer (solder barrier layer) preventing diffusion of components of solder toward a wiring constituting the bonding pad when solder connection is performed for the bonding pad, and also functions to secure bonding strength of the solder. Further, the gold plated layer PL2 is provided to prevent oxidation of the nickel plated layer PL1 and to facilitate wettability of the solder. Also, in a case of performing wire bonding for the bonding pad, the gold plated layer PL2 also functions to enable easy connection of a wire. Solder connection for the bonding pad corresponds to a case of bonding a conductive connection member such as the metal plate MP to the source pad PDS via the solder (corresponding to the adhesive layer BD2).

Here, the plated layer PL formed over the portion of the source electrode SE exposed in the opening portion OPS is called a source pad plated layer PLS, and the plated layer PL formed over the portion of the gate electrode GE exposed in the opening portion OPG is called a gate pad plated layer PLG. Further, the nickel plated layer PL1 and the gold plated layer PL2 constituting the source pad plated layer PLS are respectively called a source pad nickel plated layer PLS1 and a source pad gold plated layer PLS2. Further, the nickel plated layer PL1 and the gold plated layer PL2 constituting the gate pad plated layer PLG are respectively called a gate pad nickel plated layer PLG1 and a gate pad gold plated layer PLG2.

Therefore, the source pad nickel plated layer PLS1 and the source pad gold plated layer PLS2 are formed in this order from the bottom over the portion of the source electrode SE exposed in the opening portion OPS, and the source pad plated layer PLS is formed of the source pad nickel plated layer PLS1 and the source pad gold plated layer PLS2. Further, the gate pad nickel plated layer PLG1 and the gate pad gold plated layer PLG2 are formed in this order from the bottom over the portion of the gate electrode GE exposed in the opening portion OPG, and the gate pad plated layer PLG is formed of the gate pad nickel plated layer PLG1 and the gate pad gold plated layer PLG2. The source pad PDS is formed of the portion of the source electrode SE exposed in the opening portion OPS in the insulating film PA and the source pad plated layer PLS over the exposed portion of the source electrode SE, and the gate pad PDG is formed of the portion of the gate electrode GE exposed in the opening portion OPG in the insulating film PA and the gate pad plated layer PLG over the exposed portion of the gate electrode GE.

In the present embodiment, a thickness T1 of the plated layer PL (PLS) formed over the portion of the source electrode SE exposed in the opening portion OPS and a thickness T2 of the plated layer PL (PLG) formed over the portion of the gate electrode GE exposed in the opening portion OPG are different from each other, and the thickness T2 of the gate pad plated layer PLG is greater than the thickness T1 of the source pad plated layer PLS (that is, T2>T1). Further, a thickness T4 of the gate pad nickel plated layer PLG1 is greater than a thickness T3 of the source pad nickel plated layer PLS1 (that is, T4>T3). Further, in each of the source pad plated layer PLS and the gate pad plated layer PLG, the thickness of the nickel plated layer PL1 is greater than the thickness of the gold plated layer PL2. By way of example, the thickness of the nickel plated layer PL1 is substantially 2 to 3 μm, and the thickness of the gold plated layer PL2 is substantially 0.03 to 0.1 μm, for example.

Further, in the present embodiment, the area of the gate opening portion OPG is smaller than the area of the source opening portion OPS, and thus, the area (planar size) of the gate pad plated layer PLG is smaller than the area of the source pad plated layer PLS. That is, the area of the gate pad PDG is smaller than the area of the source pad PDS. Note that, when referring to the areas of the opening portions OPG and OPS and the plated layers PLG and PLS, the areas correspond to areas in plan view. Further, when referring to plan view regarding the components of the semiconductor device CP, the plan view corresponds to a case where the components in a plane substantially parallel to the main surface of the semiconductor substrate SB constituting the semiconductor device CP are viewed.

In the semiconductor device having such a configuration, an operating current of the power transistor flows between the source pad PDS (source electrode SE) and the drain back surface electrode BE. That is, the operating current of the trench gate-type MISFET formed in the transistor cell region flows in the thickness direction of the semiconductor substrate SB. Therefore, the trench gate-type MISFET formed in the transistor cell region is a vertical transistor. Here, the vertical transistor corresponds to a transistor in which the operating current flows in the thickness direction of the semiconductor device (SB).

Further, in the present embodiment, a case of applying the trench gate-type MISFET as the semiconductor element formed in the semiconductor substrate SB has been described. However, the embodiment is not limited to this case, and another type of semiconductor element can be formed in the semiconductor substrate SB.

For example, a trench gate-type IGBT can be formed in the semiconductor substrate SB in place of the trench gate-type MISFET. In a case of applying the trench gate-type IGBT, a collector semiconductor region (p-type semiconductor region) is formed on the back surface side of the semiconductor substrate SB. Further, in the case of applying the trench gate-type IGBT, the back surface electrode BE functions as a collector electrode, the above-described $n^+$-type semiconductor region NR functions as an emitter semiconductor region, the above-described source electrode SE functions as an emitter electrode, and the source pad PDS functions as an emitter pad (emitter bonding pad).

Further, a laterally diffused metal-oxide-semiconductor field effect transistor (LDMOSFET) or the like can be formed in the semiconductor substrate SB in place of the trench gate-type MISFET.

Further, in a case of forming a wiring structure (multilayer wiring structure) including a plurality of wiring layers over the main surface of the semiconductor substrate SB, the present embodiment can be applied. In this case, the bonding pad is formed in the uppermost wiring layer of the plurality of wiring layers included in the wiring structure.

Figure 15:
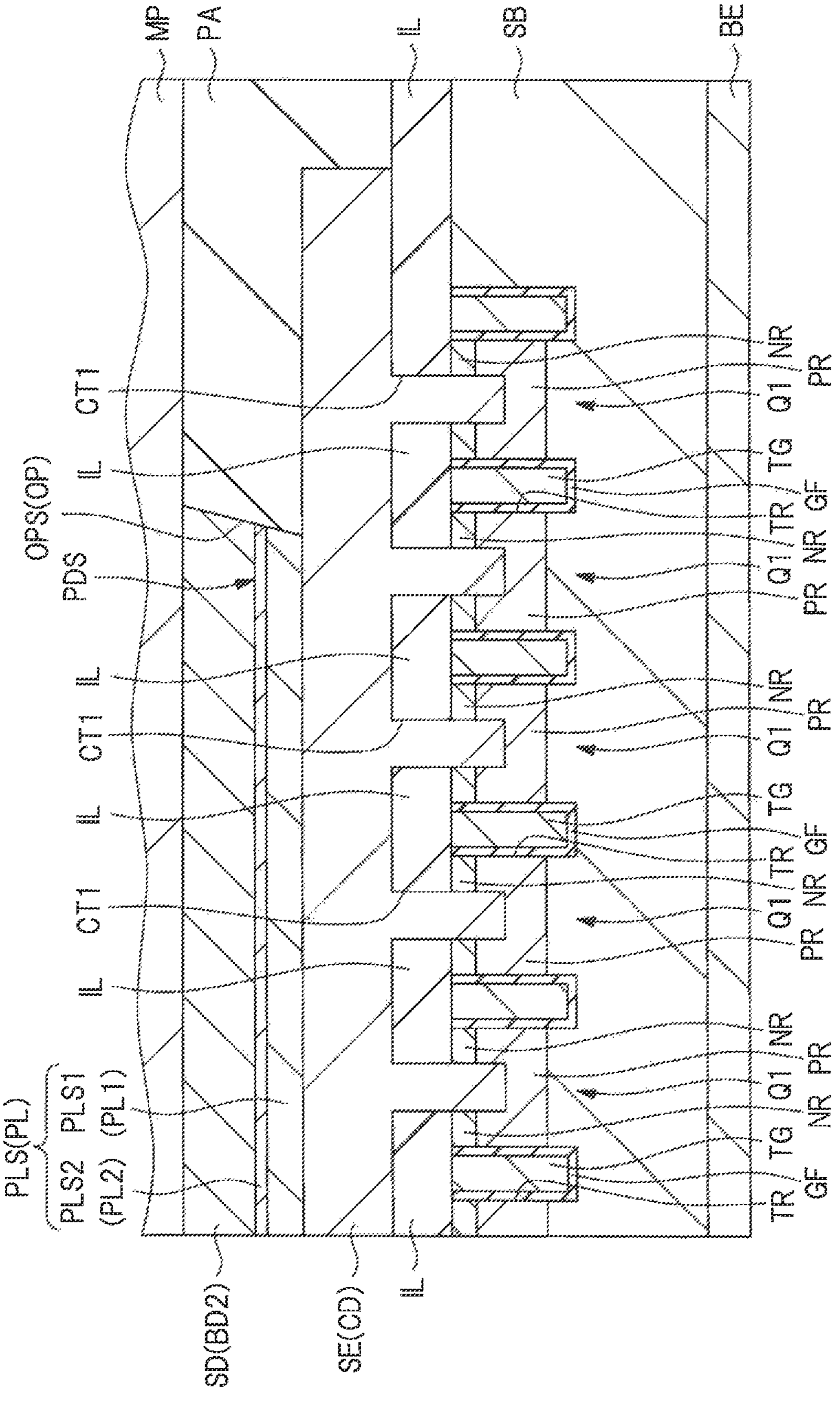
FIG. 15 is a cross-sectional view of the principal portion of the semiconductor device of the embodiment.
Figure 16:
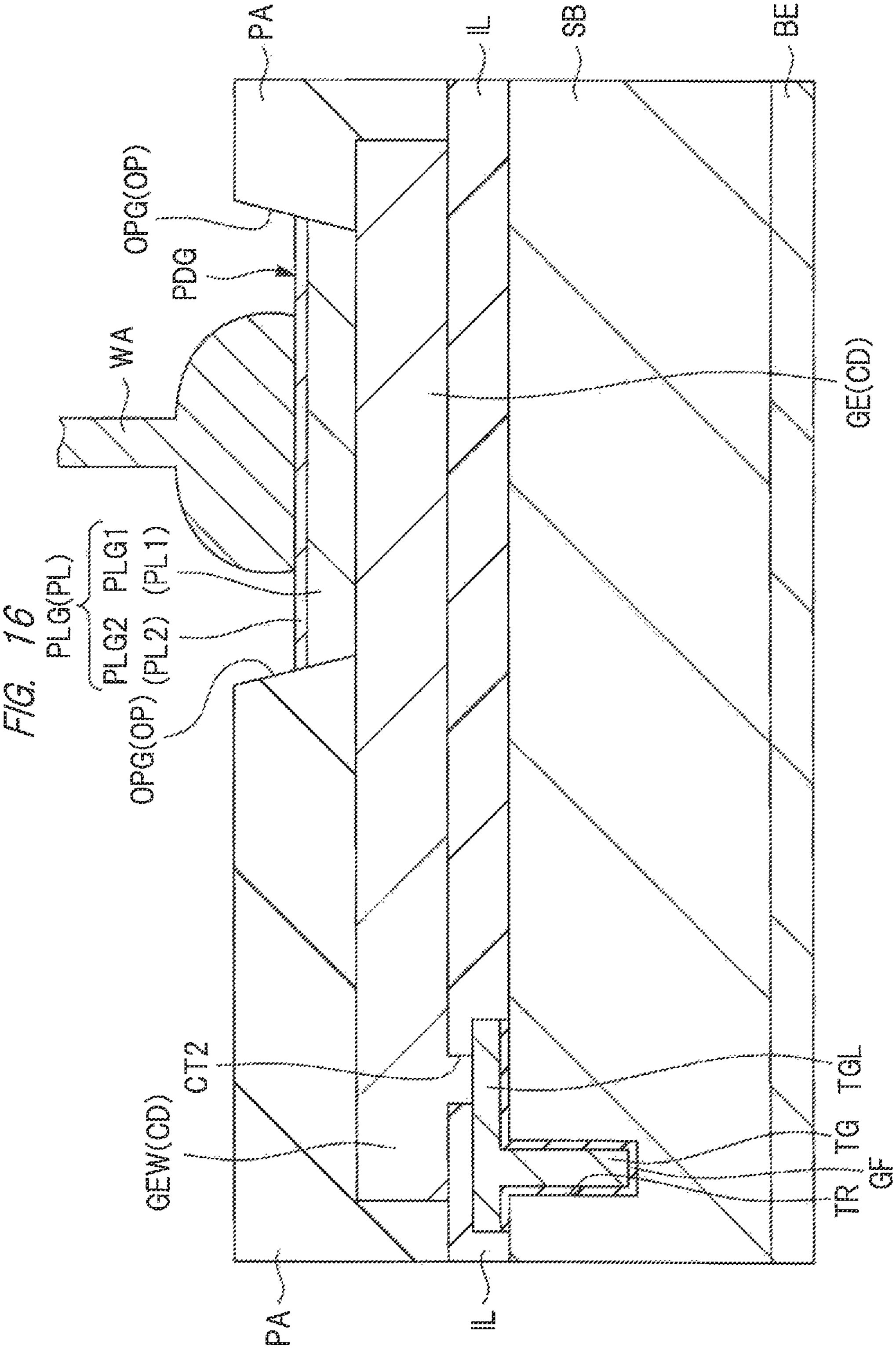
FIG. 16 is a cross-sectional view of the principal portion of the semiconductor device of the embodiment.

FIGS. 15 and 16 are cross-sectional views each illustrating the principal portion of the semiconductor device PKG in which the semiconductor device CP is packaged. FIG. 15 illustrates a cross-section corresponding to FIG. 11, and FIG. 16 illustrates a cross-section corresponding to FIG. 12 described above.

As described with reference to FIGS. 3 to 9, the metal plate MP is bonded to the source pad PDS via the adhesive layer BD2 made of solder. Therefore, FIG. 15 illustrates a state in which the metal plate MP is bonded to the source pad PDS via solder SD (adhesive layer BD2). The solder SD corresponds to the adhesive layer BD2. Further, as described with reference to FIGS. 3 to 9, the wire WA is bonded to the gate pad PDG. Therefore, FIG. 16 illustrates a state in which the wire WA is bonded to the gate pad PDG.

Note that FIG. 15 illustrates a case in which the gold plated layer PLS2 remains between the solder SD and the nickel plated layer PLS1. As another form, a case in which the gold plated layer PLS2 serving as the uppermost layer of the source pad PDS reacts with the solder SD and is taken into the solder SD to be alloyed may occur. In this case, the gold plated layer PLS2 serving as the uppermost layer of the source pad PDS is mixed with the solder SD, and the uppermost layer of the source pad PDS after the solder connection (connection of the metal plate MP by the solder SD) becomes the nickel plated layer PLS1 instead of the gold plated layer PLS2.

<Process of Manufacturing Semiconductor Device (Semiconductor Chip)>

A process of manufacturing the semiconductor device (semiconductor chip) CP as an embodiment of the present invention will be described with reference to FIGS. 17 to 34. FIGS. 17 to 34 are cross-sectional views each illustrating the principal portion during the process of manufacturing the semiconductor device (semiconductor chip) of the present embodiment. Note that, in FIGS. 17 to 34, FIGS. 17 to 23, 25, 27, 29, 31, and 33 illustrate cross-sections corresponding to FIG. 11, and FIGS. 24, 26, 28, 30, 32, and 34 illustrate cross-sections corresponding to FIG. 12.

Figure 17:
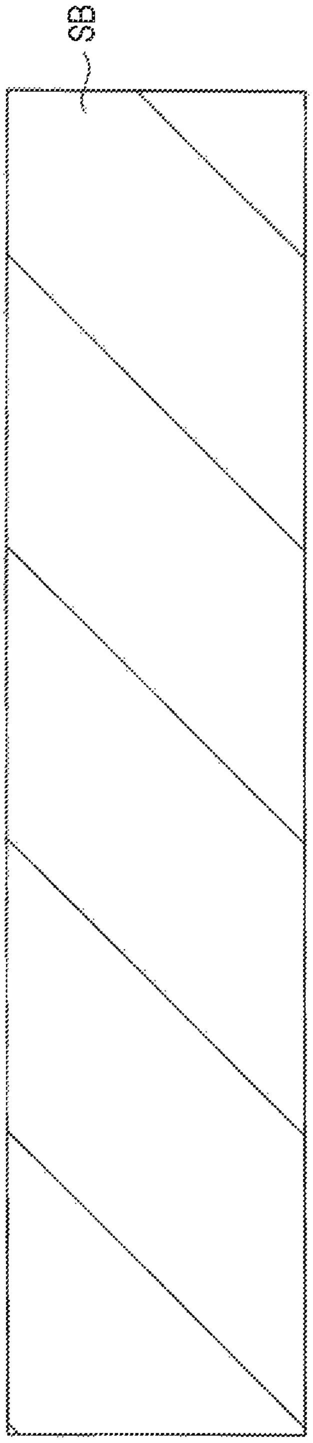
FIG. 17 is a cross-sectional view of the principal portion during a process of manufacturing the semiconductor device of the embodiment.

To manufacture the semiconductor device, first, as illustrated in FIG. 17, the semiconductor substrate SB (semiconductor wafer) made of n-type single crystal silicon and the like is prepared, for example. As the semiconductor substrate SB, a so-called epitaxial wafer can be used.

Figure 18:
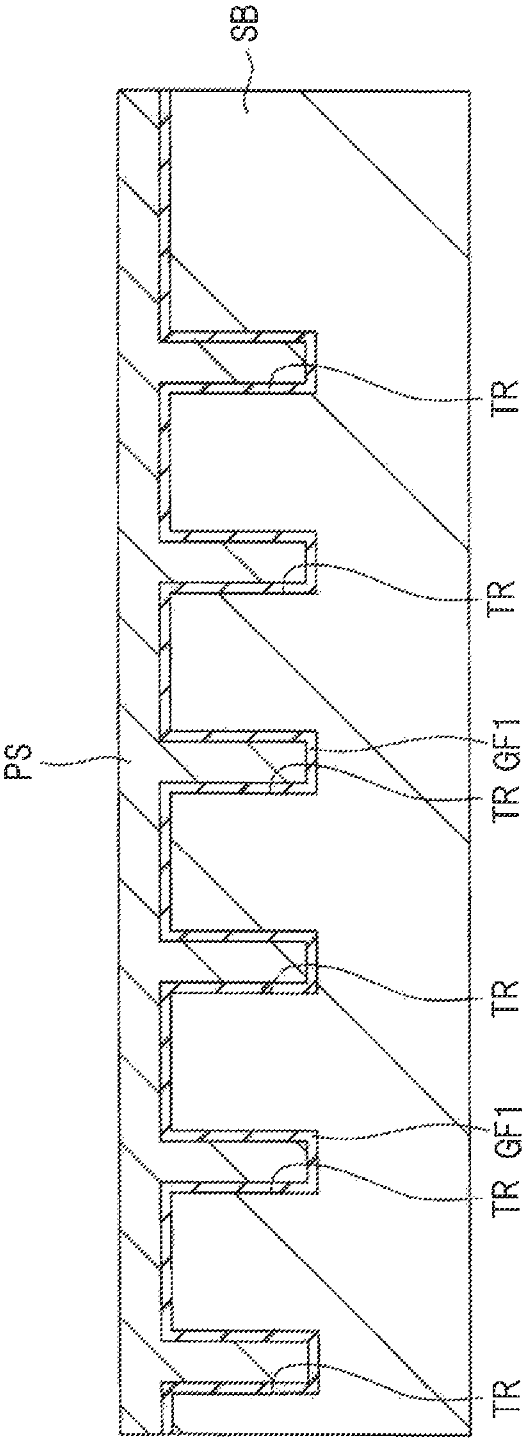
FIG. 18 is a cross-sectional view of the principal portion during the process of manufacturing the semiconductor device continued from FIG. 17.

Next, as illustrated in FIG. 18, the trench TR is formed in the main surface of the semiconductor substrate SB. The trench TR can be formed by photolithography and etching.

Next, an insulating film GF1 made of a relatively thin silicon oxide film and the like is formed over the side surface and the bottom surface of the trench TR and the upper surface of the semiconductor substrate SB by thermal oxidation or the like.

Next, a conductive film PS such as a multi-crystal silicon film (doped polysilicon film) into which impurities (for example, n-type impurities) are doped to have low resistivity is formed over the entire main surface of the semiconductor substrate SB to fill the trench TR by the CVD or the like.

Figure 19:
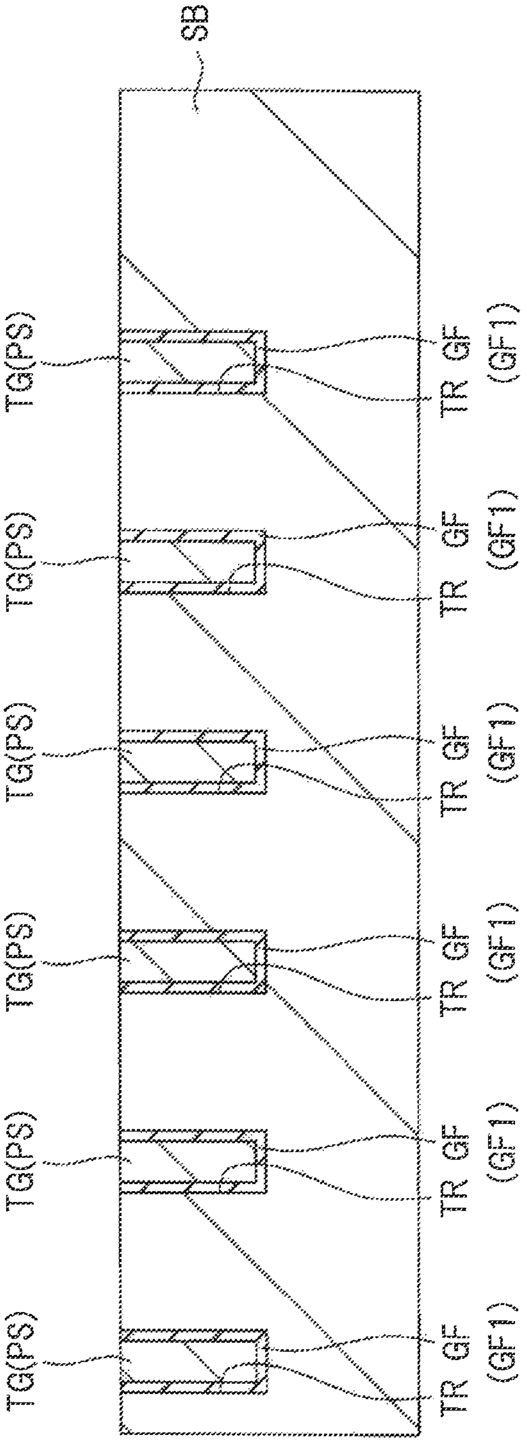
FIG. 19 is a cross-sectional view of the principal portion during the process of manufacturing the semiconductor device continued from FIG. 18.

Next, a photoresist pattern (not illustrated) to cover a region where the gate lead-out portion TGL is to be formed and to expose the other region is formed over the conductive film PS, and the conductive film PS is etched back by anisotropic etching, using the photoresist pattern as an etching mask. The conductive film PS is caused to remain inside the trench TR and under the photoresist pattern, and the rest of the conductive film PS is removed. After that, the photoresist pattern is removed. FIG. 19 illustrates this stage. The insulating film GF1 remaining in the trench TR serves as the gate insulating film GF, and the conductive film PS remaining in the trench TR serves as the trench gate electrode TG. Also, the conductive film PS remaining under the photoresist pattern serves as the gate lead-out portion TGL. This gate lead-out portion TGL is integrally formed with the trench gate electrode TG. Further, in the etch back step of the conductive film PS, the insulating film GF1 over the upper surface of the semiconductor substrate SB may be removed.

Figure 20:
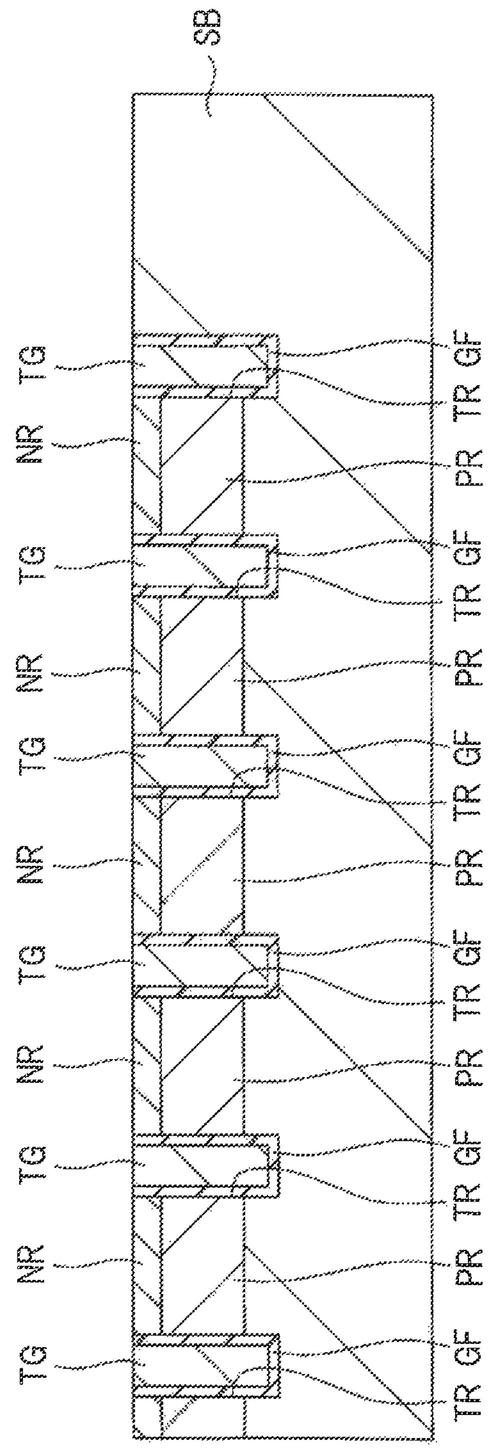
FIG. 20 is a cross-sectional view of the principal portion during the process of manufacturing the semiconductor device continued from FIG. 19.

Next, as illustrated in FIG. 20, the p-type semiconductor region PR is formed by ion implantation of p-type impurities into the main surface of the semiconductor substrate SB. The p-type semiconductor region PR is formed in an upper layer portion of the semiconductor substrate SB.

Next, the $n^+$-type semiconductor region NR is formed by ion implantation of n-type impurities into the main surface of the semiconductor substrate SB. A depth of the $n^+$-type semiconductor region NR is shallower than a depth of the p-type semiconductor region PR, and the $n^+$-type semiconductor region NR is formed on an upper portion of the p-type semiconductor region PR. The $n^+$-type semiconductor region NR and the p-type semiconductor region PR are formed shallower than the trench TR, and thus, the trench TR penetrates the $n^+$-type semiconductor region NR and the p-type semiconductor region PR and is terminated in the semiconductor substrate SB under the aforementioned regions.

Next, activating annealing as thermal treatment to activate the impurities doped so far is performed.

Figure 21:
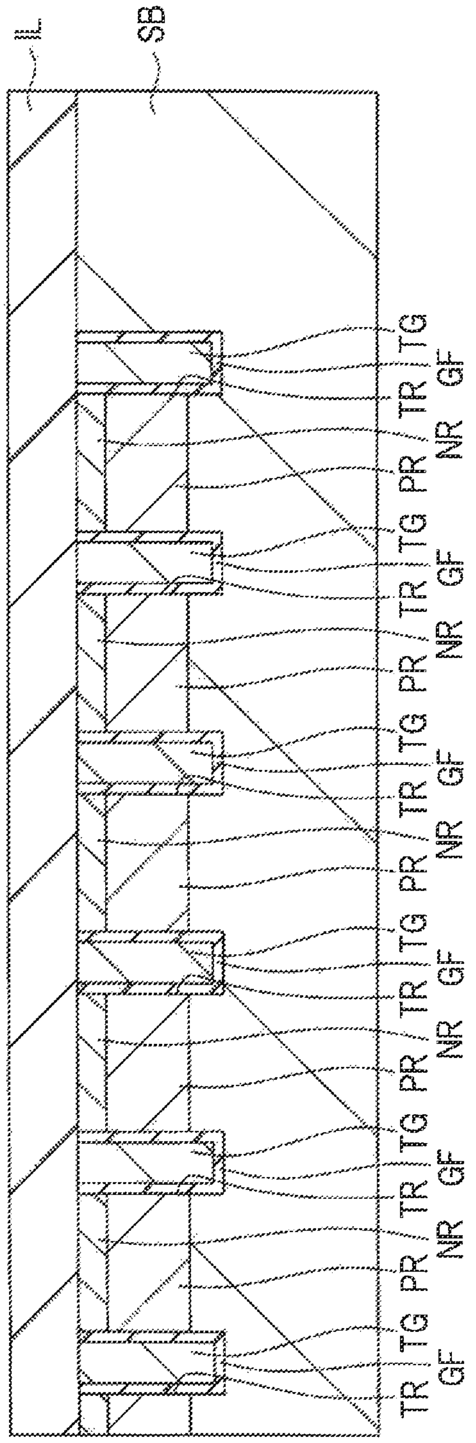
FIG. 21 is a cross-sectional view of the principal portion during the process of manufacturing the semiconductor device continued from FIG. 20.

Next, as illustrated in FIG. 21, the insulating film IL is formed over the main surface (over the entire main surface) of the semiconductor substrate SB to cover the trench gate electrode TG and the gate lead-out portion TGL, as the interlayer insulating film.

Figure 22:
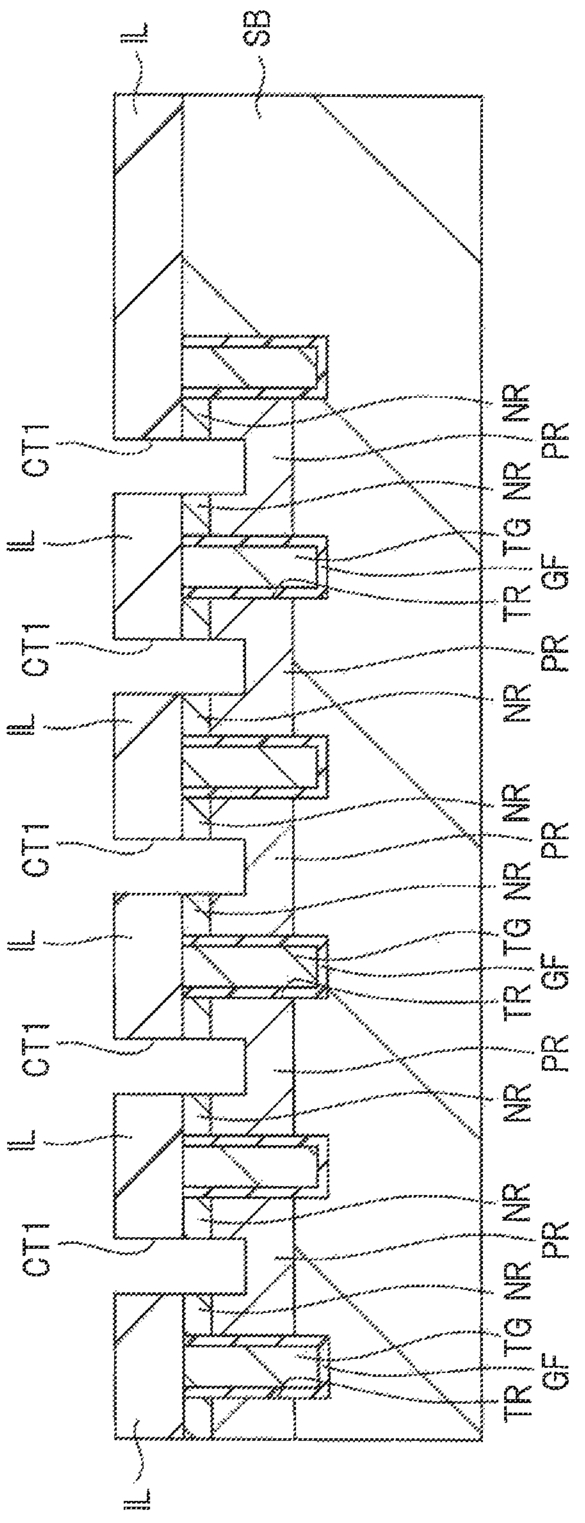
FIG. 22 is a cross-sectional view of the principal portion during the process of manufacturing the semiconductor device continued from FIG. 21.

Next, as illustrated in FIG. 22, the insulating film IL is etched by photolithography, using the photoresist pattern (not illustrated) formed over the insulating film IL as an etching mask. Further, the source contact hole CT1 is formed by etching the semiconductor substrate SB. The source contact hole CT1 is formed between the adjacent trenches TR in plan view. The p-type semiconductor region PR is exposed at the bottom surface of the source contact hole CT1, and the $n^+$-type semiconductor region NR is exposed at a lower portion of the side surface of the source contact hole CT1. Note that, after the source contact hole CT1 is formed, ion implantation of p-type impurities may be performed to the p-type semiconductor region PR exposed at the bottom surface of the source contact hole CT1.

Next, the insulating film IL is etched by photolithography, using another photoresist pattern (not illustrated) formed over the insulating film IL as an etching mask, to form the gate contact hole CT2 on the gate lead-out portion TGL.

Figure 23:
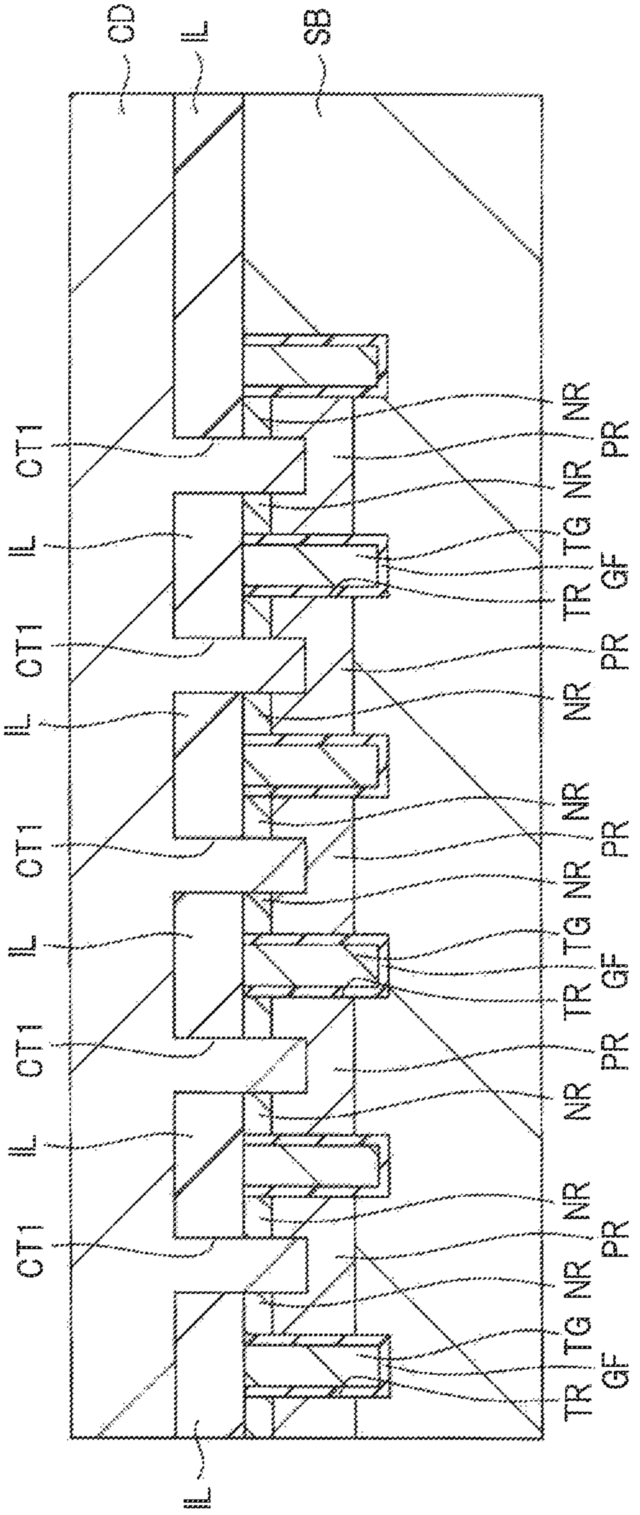
FIG. 23 is a cross-sectional view of the principal portion during the process of manufacturing the semiconductor device continued from FIG. 22.
Figure 24:
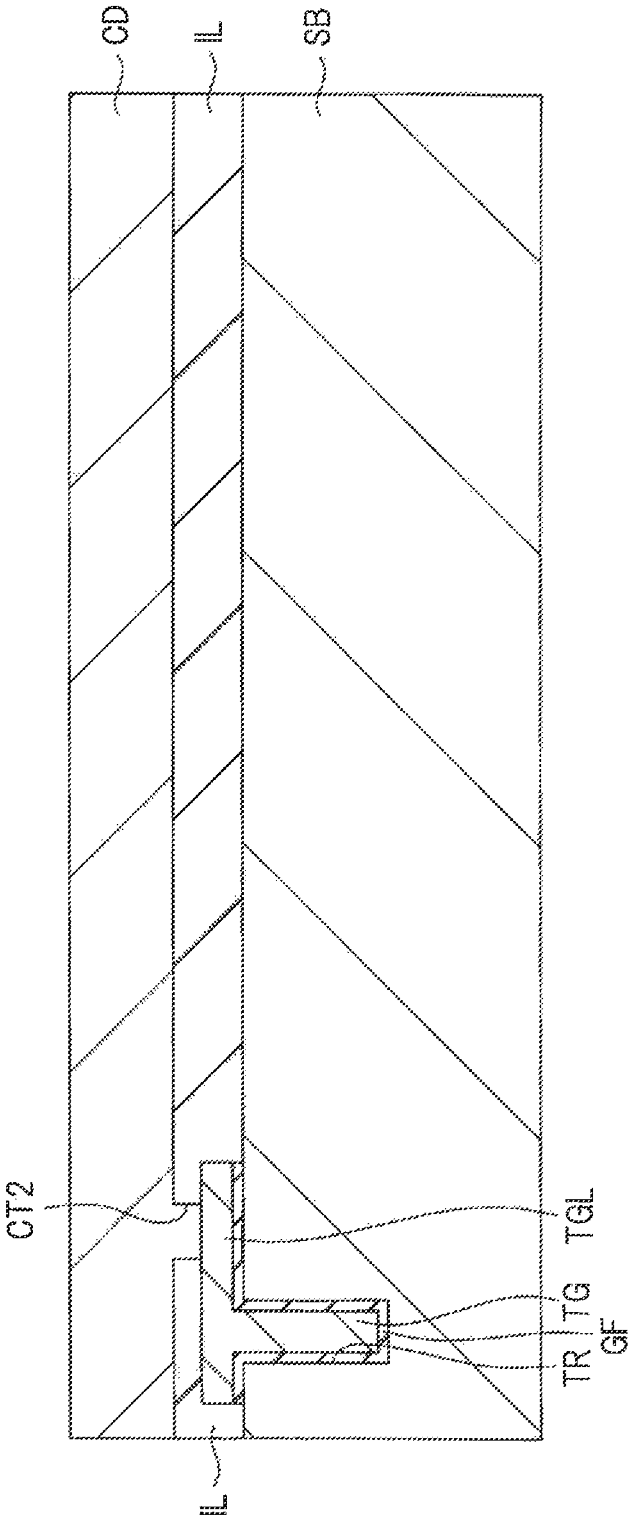
FIG. 24 is a cross-sectional view of the principal portion during the process of manufacturing the same semiconductor device as FIG. 23.

Next, as illustrated in FIGS. 23 and 24, the conductive film (metal film) CD containing aluminum (Al) as a main component is formed over the entire main surface of the semiconductor substrate SB, that is, over the insulating film IL including the contact holes CT1 and CT2, by sputtering or the like.

Figure 25:
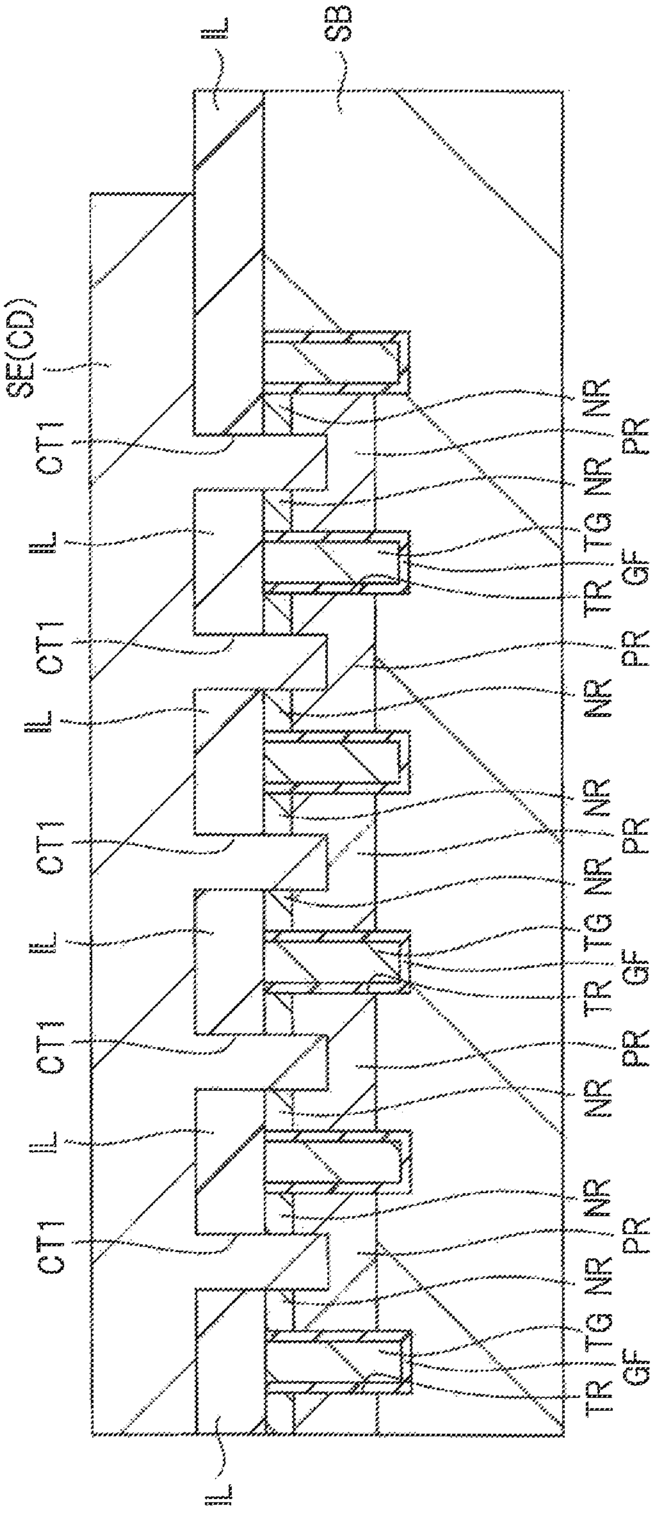
FIG. 25 is a cross-sectional view of the principal portion during the process of manufacturing the semiconductor device continued from FIG. 23.
Figure 26:
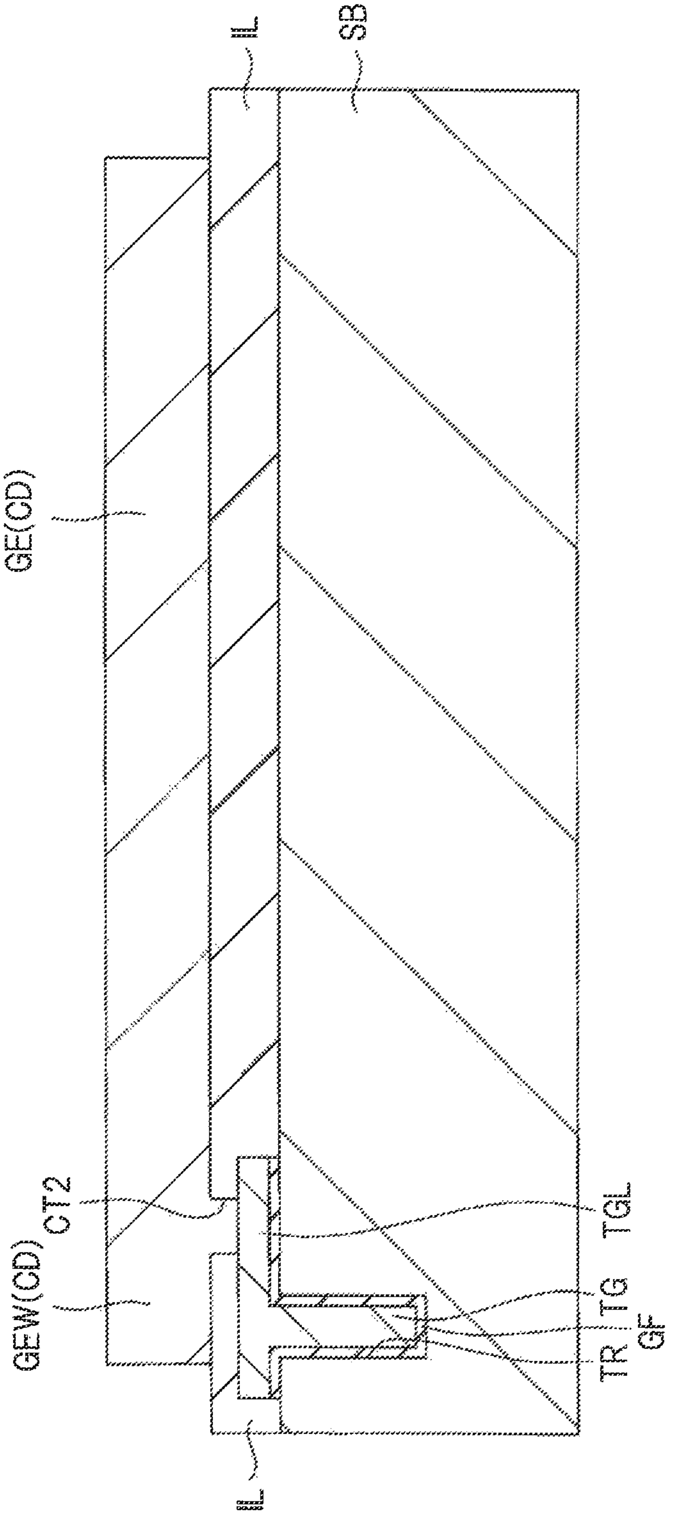
FIG. 26 is a cross-sectional view of the principal portion during the process of manufacturing the same semiconductor device as FIG. 25.

Next, as illustrated in FIGS. 25 and 26, the conductive film CD is patterned by photolithography and etching to form the source electrode SE, the gate electrode GE, and the gate wiring GEW. To be specific, the photoresist pattern (not illustrated) is formed over the conductive film CD by photolithography, and then, the conductive film CD is etched using the photoresist pattern as an etching mask. With this step, the source electrode SE, the gate electrode GE, and the gate wiring GEW formed of the patterned conductive film CD are formed. After that, the photoresist pattern is removed. As described above, the gate electrode GE and the gate wiring GEW are connected with each other and are integrally formed.

The source electrode SE is formed over the insulating film IL, and a part (the source via portion) of the source electrode SE fills the source contact hole CT1. Further, the gate electrode GE is formed over the insulating film IL, and a part (gate via portion) of the gate electrode GE fills the gate contact hole CT2.

As another form, the source via portion can be formed in a separate step from the source electrode SE, and the gate via portion can be formed in a separate step from the gate wiring GEW. In this case, after the contact holes CT1 and CT2 are formed, a conductive film is formed over the insulating film IL to fill the contact holes CT1 and CT2, and then, conductive plugs filling the contact holes CT1 and CT2 are formed by removing the conductive film outside the contact holes CT1 and CT2, by the CMP or the like. The conductive plug filling the contact hole CT2 corresponds to the gate via portion, and the conductive plug filling the contact hole CT1 corresponds to an emitter via portion. After that, the conductive film CD is formed over the insulating film IL into which the conductive plugs have been embedded, and then, the conductive film CD is patterned by photolithography and etching, so that the source electrode SE, the gate electrode GE, and the gate wiring GEW are formed.

Figure 27:
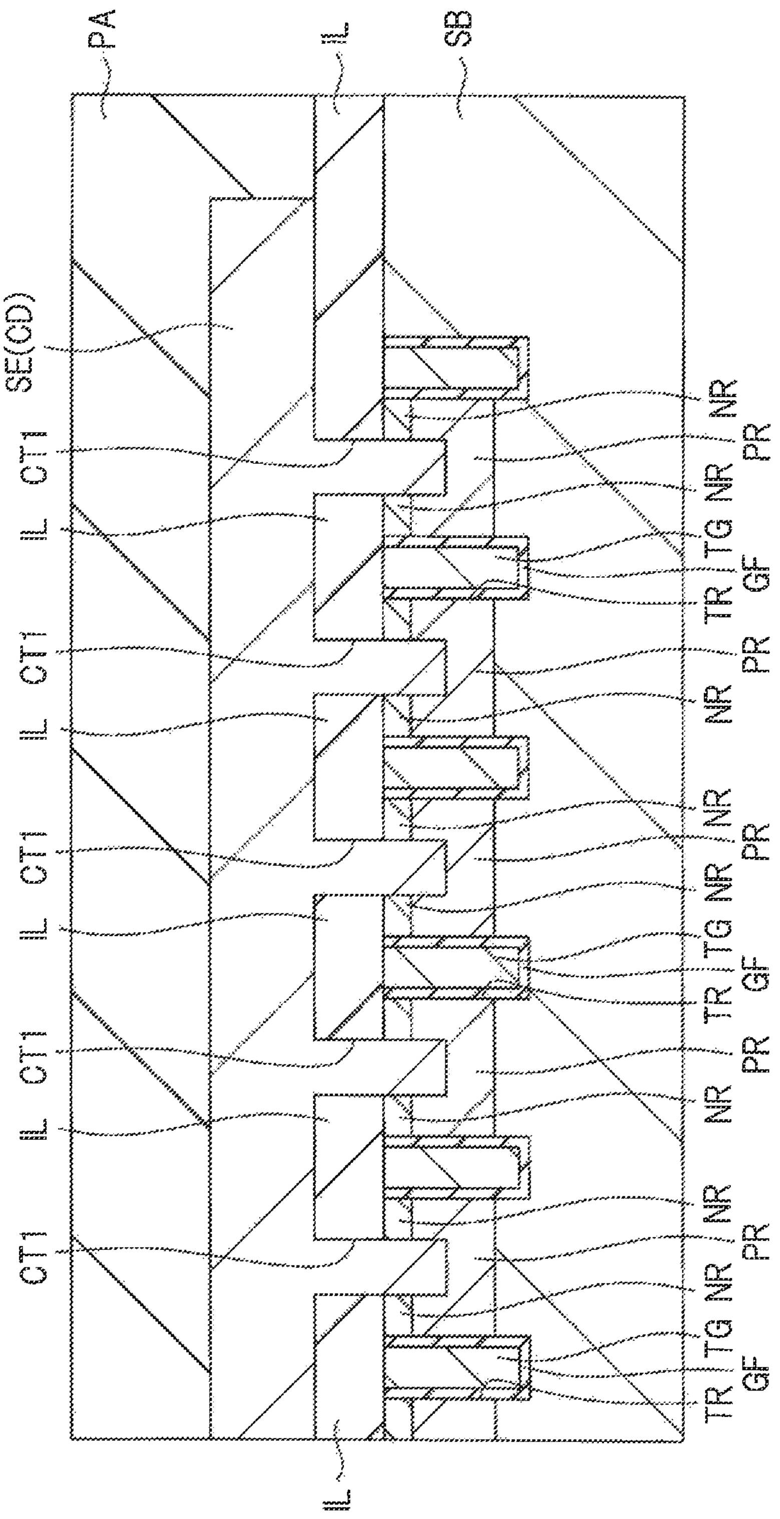
FIG. 27 is a cross-sectional view of the principal portion during the process of manufacturing the semiconductor device continued from FIG. 26.
Figure 28:
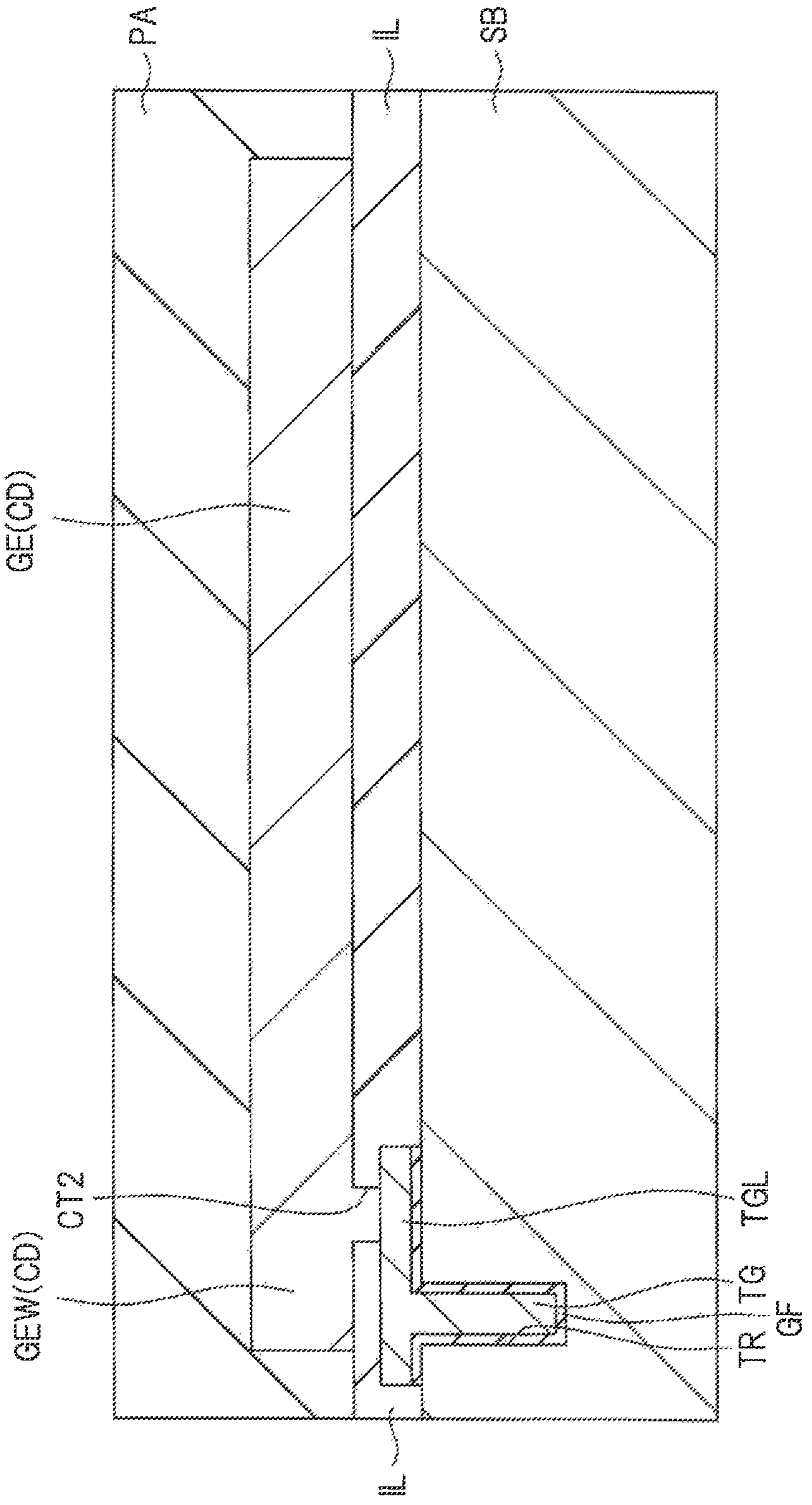
FIG. 28 is a cross-sectional view of the principal portion during the process of manufacturing the same semiconductor device as FIG. 27.

Next, as illustrated in FIGS. 27 and 28, the insulating film PA is formed over the main surface (over the entire main surface) of the semiconductor substrate SB, that is, over the insulating film IL, to cover the source electrode SE, the gate electrode GE, and the gate wiring GEW. The insulating film PA is made of a resin material such as a polyimide resin. In the stage where the insulating film PA is formed, the entire source electrode SE, gate electrode GE, and gate wiring GEW are covered with the insulating film PA.

Figure 29:
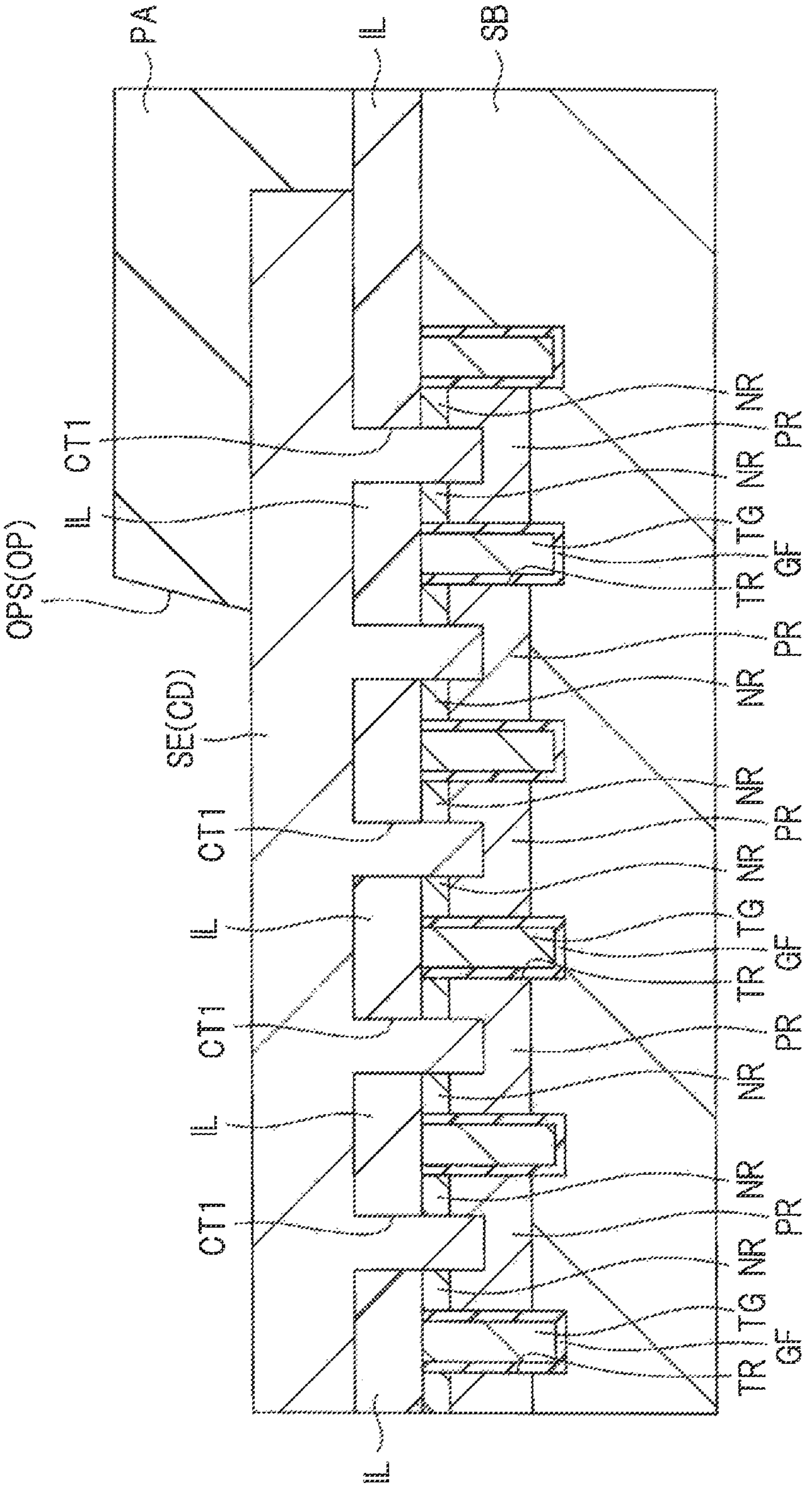
FIG. 29 is a cross-sectional view of the principal portion during the process of manufacturing the semiconductor device continued from FIG. 27.
Figure 30:
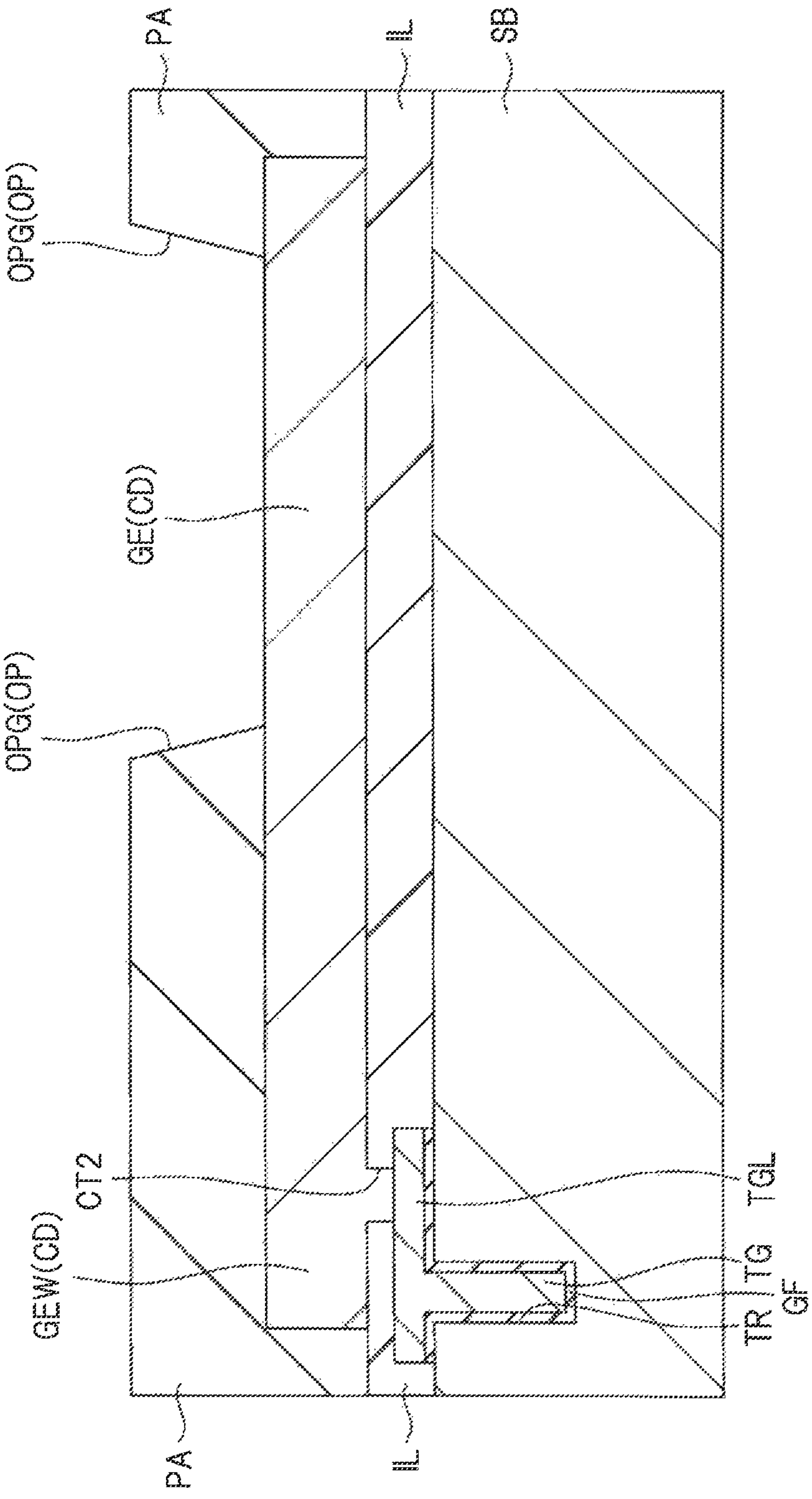
FIG. 30 is a cross-sectional view of the principal portion during the process of manufacturing the same semiconductor device as FIG. 29.

Next, as illustrated in FIGS. 29 and 30, the insulating film PA is patterned to form the opening portions OP (OPG and OPS) in the insulating film PA.

The patterning of the insulating film PA can be performed by forming the insulating film PA as a photosensitive resin material, forming a photoresist pattern (not illustrated) over the insulating film PA made of the photosensitive resin, then performing exposure and developing treatment for the insulating film PA made of the photosensitive resin, to selectively remove portions of the insulating film PA serving as the opening portions OP. Alternatively, the patterning of the insulating film PA can be performed by forming a photoresist pattern (not illustrated) over the insulating film PA, and then etching the insulating film PA, using the photoresist pattern as an etching mask, to selectively remove portions of the insulating film PA serving as the opening portions OP. In this case, the insulating film PA need not be the photosensitive resin film. Among the opening portions OP, the opening portion OPS is formed on the source electrode SE, and the opening portion OPG is formed on the gate electrode GE. The source electrode SE is exposed at a bottom portion of the opening portion OPS, and the gate electrode GE is exposed at a bottom portion of the opening portion OPG. In plan view, the opening portion OPS is included in the source electrode SE, and the opening portion OPG is included in the gate electrode GE. The opening portions OPS and OPG are not connected and are separated from each other.

Figure 31:
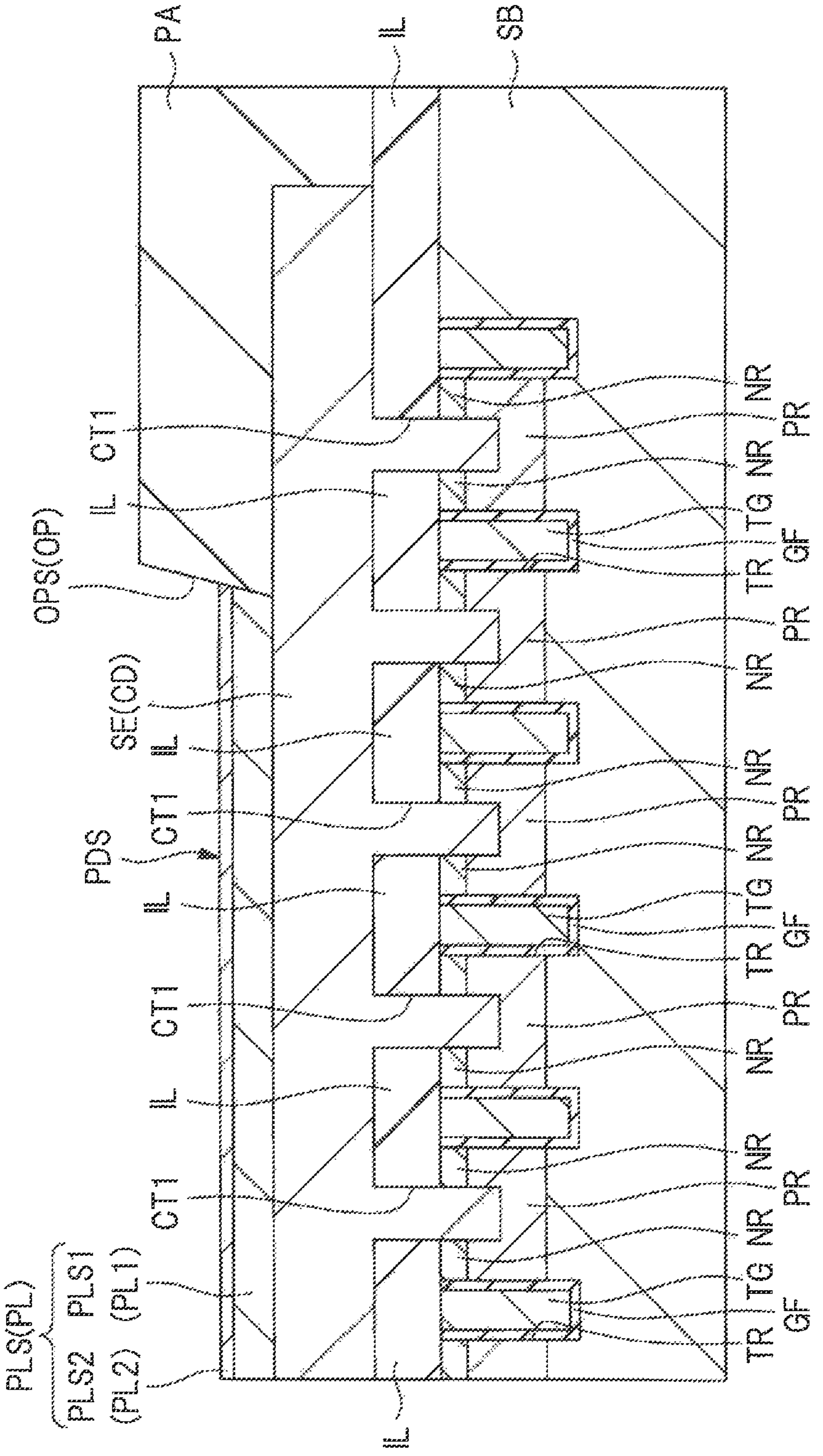
FIG. 31 is a cross-sectional view of the principal portion during the process of manufacturing the semiconductor device continued from FIG. 30.
Figure 32:
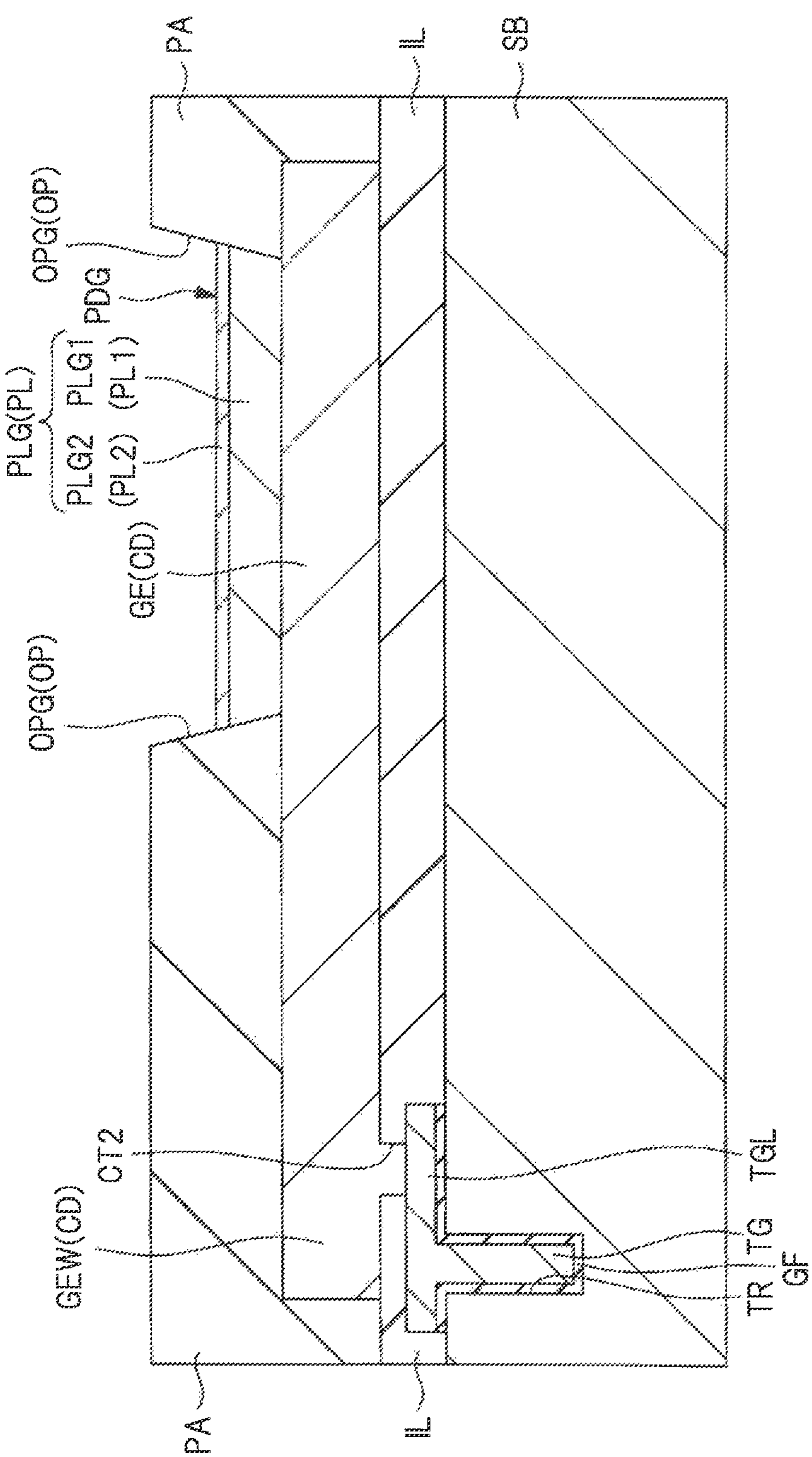
FIG. 32 is a cross-sectional view of the principal portion during the process of manufacturing the same semiconductor device as FIG. 31.

Next, as illustrated in FIGS. 31 and 32, the plated layer PL is formed by plating over the conductive film CD exposed in the opening portion OP, that is, over each of the source electrode SE exposed in the opening portion OPS and the gate electrode GE exposed in the opening portion OPG. The plated layer PL is preferably formed of a layered film including the nickel plated layer PL1 and the gold plated layer PL2 over the nickel plated layer PL1, and can be formed by plating (preferably, by electroless plating). That is, the nickel plated layer PL1 and the gold plated layer PL2 are formed in this order by plating (preferably, by electroless plating) over the conductive film CD exposed in the opening portion OP to form the plated layer PL formed of a layered film including the nickel plated layer PL1 and the gold plated layer PL2. By use of plating, the plated layer PL can be selectively formed over the conductive film CD exposed in the opening portion OP. The plated layer PL is not formed over the portion of the conductive film CD covered with the insulating film PA and over the insulating film PA.

Next, a thickness of the semiconductor substrate SB is made thin by grinding or polishing the back surface of the semiconductor substrate SB, as needed.

Figure 33:
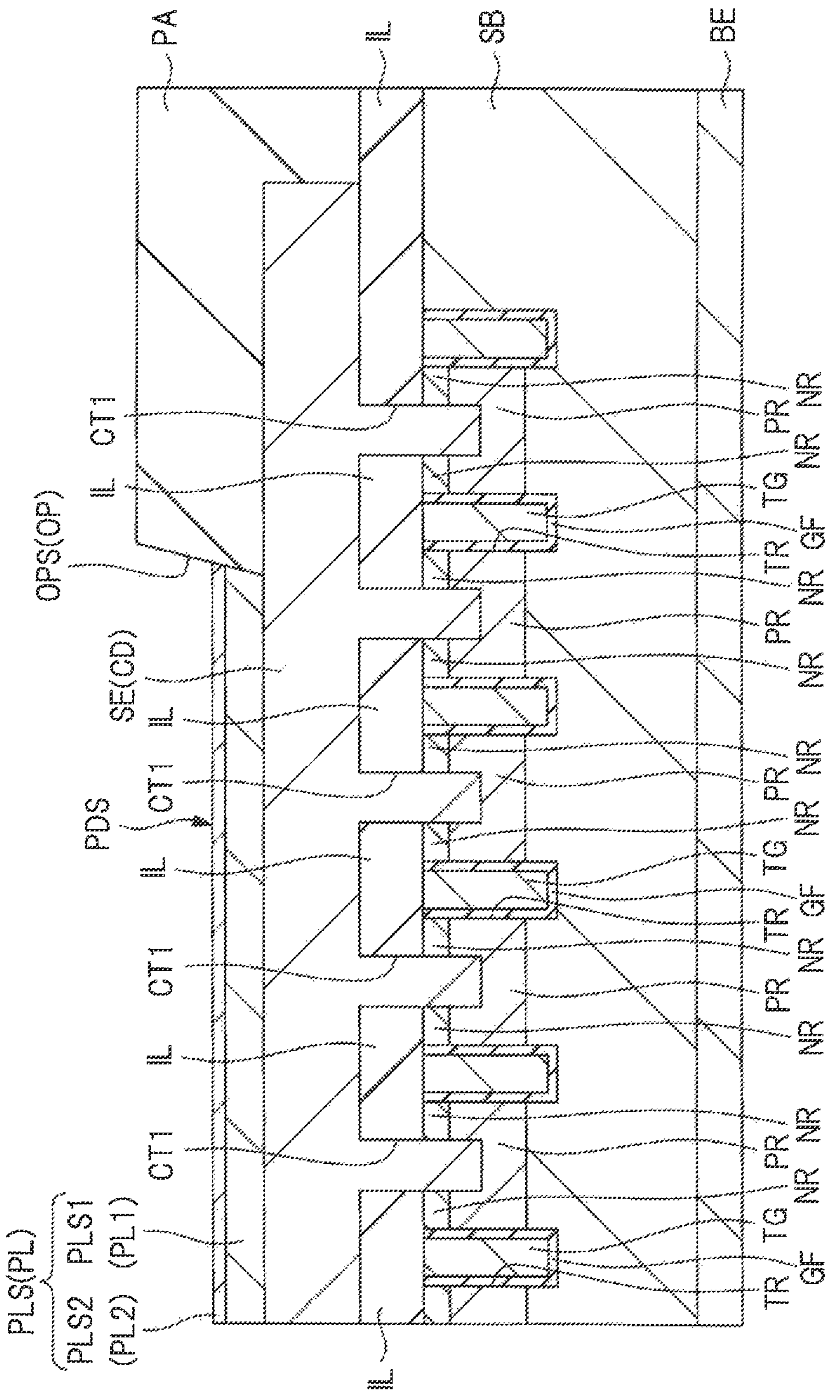
FIG. 33 is a cross-sectional view of the principal portion during the process of manufacturing the semiconductor device continued from FIG. 31.
Figure 34:
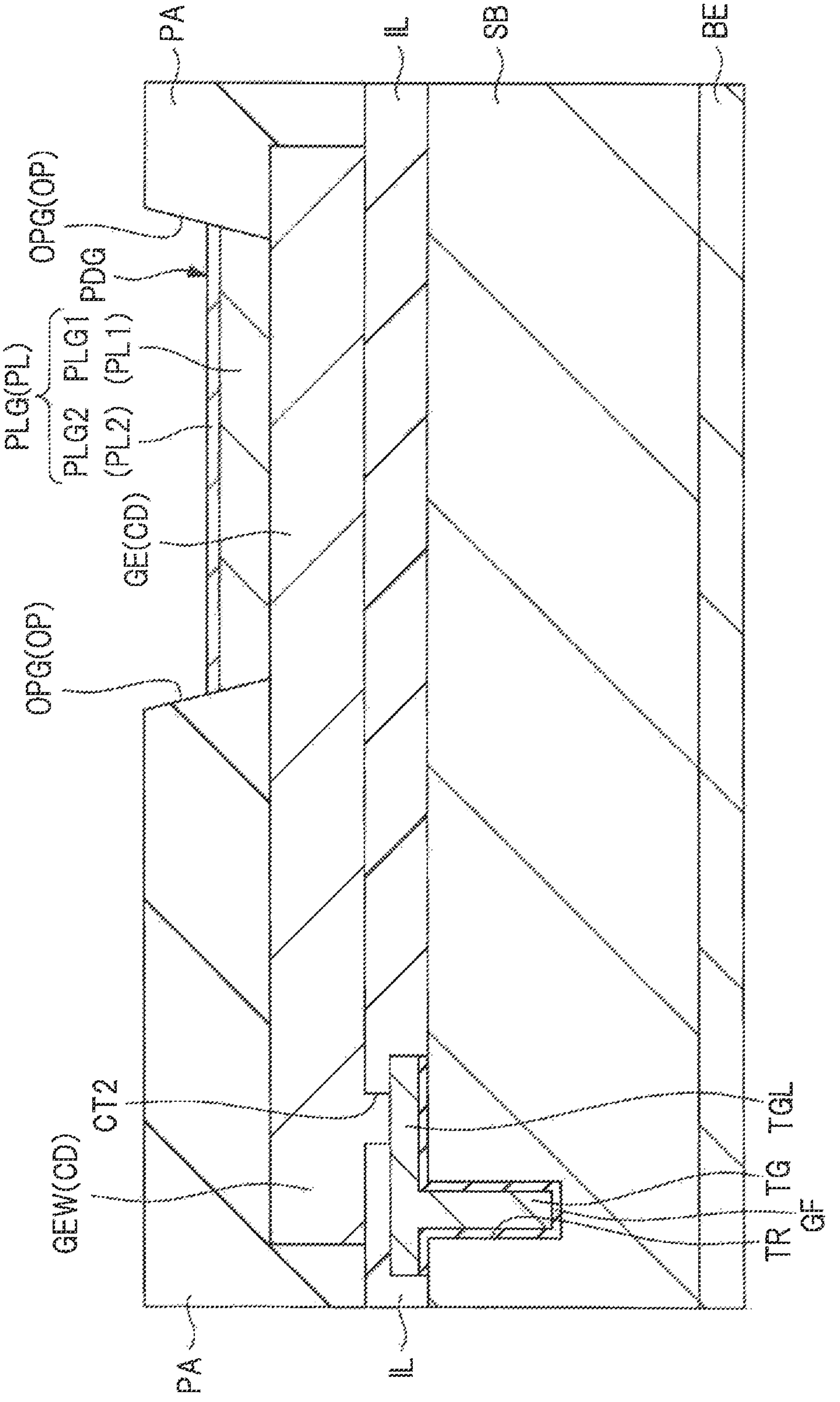
FIG. 34 is a cross-sectional view of the principal portion during the process of manufacturing the same semiconductor device as FIG. 33.

Next, as illustrated in FIGS. 33 and 34, the back surface electrode BE is formed over the entire back surface of the semiconductor substrate SB. The back surface electrode BE is formed of a layered metal film including a titanium (Ti) film, a nickel (Ni) film, and a gold (Au) film in this order from a side closer to the back surface of the semiconductor substrate SB, and can be formed by vapor deposition.

After that, the semiconductor substrate SB is divided (separated or cut) by dicing or the like into individual pieces, thereby acquiring individual semiconductor chips (semiconductor devices CP) from the semiconductor substrate SB.

In this way, the semiconductor device CP of the present embodiment is manufactured.

<Process of Forming Plated Layer PL>

Figure 35:
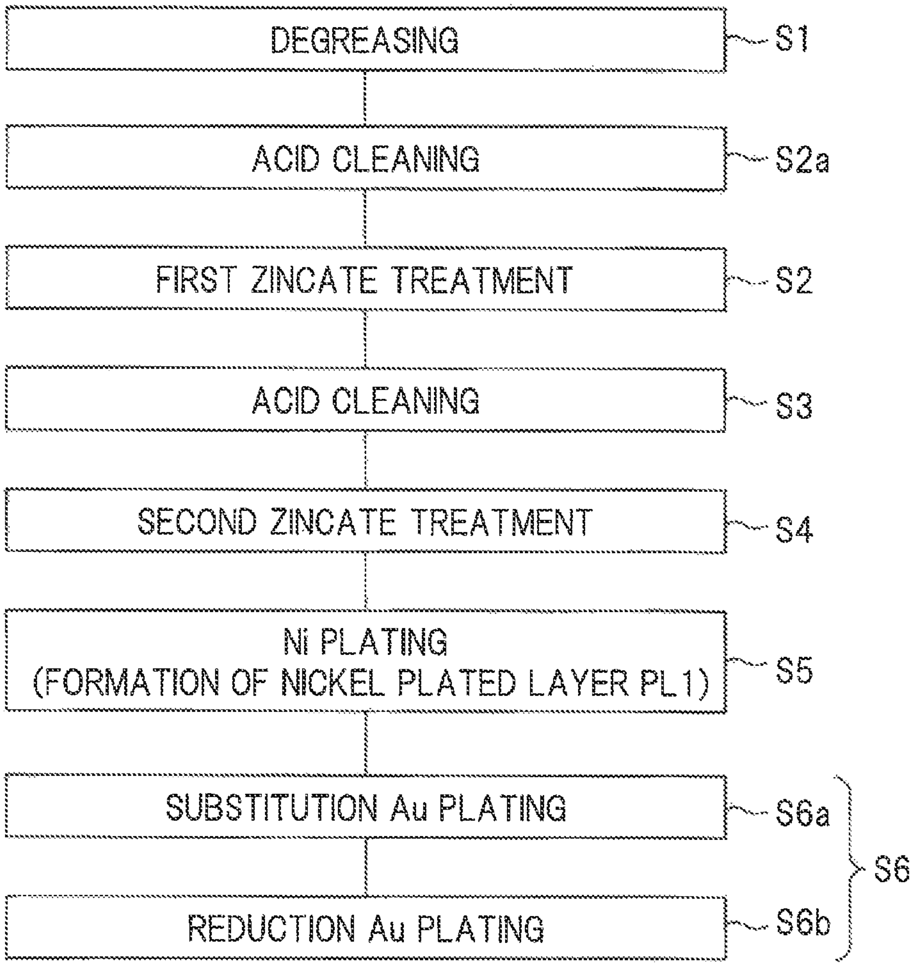
FIG. 35 is a process flow diagram illustrating details of a plated layer forming process.
Figure 36:
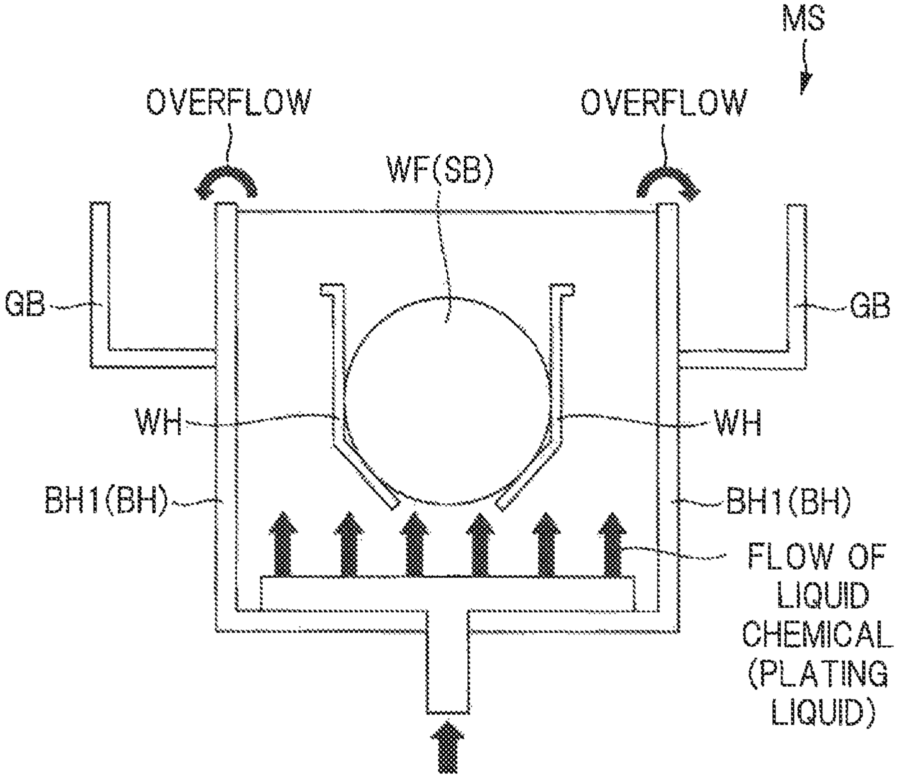
FIG. 36 is an explanatory diagram of the plated layer forming process.

Referring to FIGS. 35 and 36, a forming process of the plated layer PL will be described in more detail. FIG. 35 is a process flow diagram illustrating details of the plated layer PL forming process, and FIG. 36 is an explanatory diagram of the plated layer PL forming process. FIG. 36 schematically illustrates a cross-section of a treatment device (plating device). Hatching is omitted for viewability.

A treatment device (plating device) MS used in the process of forming the plated layer PL is a batch treatment device. While the treatment device MS includes a plurality of treatment tanks (liquid chemical tanks) BH, FIG. 36 illustrates a treatment tank BH1 used in a process of forming the nickel plated layer PL1 as a representative of the plurality of treatment tanks BH included in the treatment device MS. Further, FIG. 36 schematically illustrates flow of a liquid chemical by arrows.

Each of the treatment tanks BH of the treatment device MS allows the liquid chemical to be introduced from a bottom portion of the treatment tank BH into the treatment tank BH. Further, an outer tank (collection tank) GB is provided for each of the treatment tanks BH. In each of the treatment tanks BH, the liquid chemical introduced from the bottom portion of the treatment tank BH is stored in the treatment tank BH. The liquid chemical spilling over (overflowing) from an upper portion of the treatment tank BH is collected in the outer tank GB. Further, a wafer holder WH capable of holding a wafer is arranged in each of the treatment tanks BH. In each of the treatment tanks BH, a plurality of wafers (semiconductor wafers) WF can be arranged (accommodated) in the wafer holder WH. Note that the wafer WF used here corresponds to the semiconductor substrate SB. Although not illustrated, the treatment device MS is arranged in a treatment room to which exhaust piping is connected.

In each of the treatment tanks BH, the plurality of wafers WF to be processed is immersed in the liquid chemical stored in the treatment tank BH and arranged in the wafer holder, so that a state in which the plurality of wafers WF are immersed in the liquid chemical in the treatment tank BH is maintained for a predetermined time, and the treatment for each of the wafers WF is (any of the treatments illustrated in FIG. 35) is performed. The steps in FIG. 35 can be respectively performed in the dedicated treatment tanks BH for performing the steps. Further, in each of the treatment tanks BH, after the treatment with the liquid chemical is performed, pure water cleaning treatment for the wafer WF can be performed.

The process of forming the plated layer PL will be specifically described.

As described above, after the opening portions OP (OPG and OPS) are formed in the insulating film PA, a natural oxide film and an organic matter on the front surface of the conductive film CD exposed in the opening portions OP are removed by Ar (argon) plasma treatment or the like. The Ar plasma treatment can be performed using a plasma treatment device (not illustrated).

Next, degreasing treatment (degreasing and cleaning treatment) for the wafer WF is performed in the treatment device MS (step S1 in FIG. 35). The decreasing treatment can be performed in the treatment tank BH for decreasing treatment. The front surface of the conductive film CD exposed in the opening portion OP is cleaned by the decreasing treatment. After the decreasing treatment, pure water cleaning treatment for the wafer WF is performed.

Next, acid cleaning (step S2*a* in FIG. 35) is performed, and then, first zincate treatment is performed (step S2 in FIG. 35).

In the first zincate treatment in step S2, a zincate solution is brought in contact with the front surface of the conductive film CD exposed in the opening portion OP, and a zinc film (Zn film) is formed over the front surface of the conductive film CD exposed in the opening portion OP by a substitution reaction of aluminum (Al) and zinc (Zn). To be specific, the first zincate treatment is performed by immersing the wafer WF (semiconductor substrate SB) in the zincate solution stored in the treatment tank BH for the first zincate treatment, to form the Zn film over the front surface of the conductive film CD exposed in the opening portion OP.

Next, acid cleaning by use of dilute nitric acid or the like (step S3 in FIG. 35) is performed to remove the Zn film over the front surface of the conductive film CD exposed in the opening portion OP.

Next, second zincate treatment is performed (step S4 in FIG. 35). In the second zincate treatment in step S4, a zincate solution is brought in contact with the front surface of the conductive film CD exposed in the opening portion OP, and a zinc film (Zn film) is formed over the front surface of the conductive film CD exposed in the opening portion OP by a substitution reaction of aluminum (Al) and zinc (Zn). To be specific, the second zincate treatment is performed by immersing the wafer WF (semiconductor substrate SB) in the zincate solution stored in the treatment tank BH for the second zincate treatment, to form the Zn film over the front surface of the conductive film CD exposed in the opening portion OP. By repeating the zincate treatment twice in this way, a dense and uniform Zn film can be formed.

Next, Ni plating treatment (step S5 in FIG. 35) is performed to grow a plated film (Ni film) using Zn in the Zn film (not illustrated) as a core. That is, the front surface (the exposed front surface from the opening portion OP) of the conductive film CD, over which the Zn film (not illustrated) has been formed, is brought in contact with a plating solution for Ni plating, to form the nickel plated layer PL1. To be specific, the plating treatment (Ni plating treatment) is performed by using a hypophosphorous acid-based plating solution as the plating solution and immersing the wafer WF (semiconductor substrate SB) in the plating solution having a temperature of substantially 85° C. and stored in the treatment tank BH1 for Ni plating, and the nickel plated layer PL1 having a film thickness of substantially 2.5 μm is formed. This nickel plated layer PL1 is selectively grown over the front surface of the conductive film CD exposed in the opening portion OP. Therefore, in step S5, the source pad nickel plated layer PLS1 is formed over the source electrode SE exposed in the opening portion OPS, and the gate pad nickel plated layer PLG1 is formed over the gate electrode GE exposed in the opening portion OPG.

The nickel plated layer PL1 is preferably an electroless nickel plated layer containing phosphorus (P). An example of the plating solution to be used includes a plating solution containing nickel sulfate and containing hypophosphite as a reducing agent. A temperature of the plating solution can be substantially 80 to 90° C., a pH can be substantially 4 to 5, and a Ni concentration can be substantially 5 to 6.5 g/l (gram/liter).

Next, gold (Au) plating treatment (step S6 in FIG. 35) is performed to grow plated film (Au film).

As the Au plating treatment in step S6, first, substitution Au plating treatment (step S6*a* in FIG. 35) can be performed. In the substitution Au plating treatment in step S6*a*, the gold plated layer (Au plated layer) is formed by bringing the front surface of the nickel plated layer PL1 in contact with a plating solution for Au plating. To be specific, the plating treatment (Au plating treatment) is performed by immersing the wafer WF (semiconductor substrate SB) in the plating solution for substitution Au plating stored in the treatment tank BH for substitution Au plating, to form the gold plated layer over the nickel plated layer PL1. The gold plated layer is selectively grown over the nickel plated layer PL1 formed over the conductive film CD exposed in the opening portion OP. As the substitution Au plating, non-cyanide substitution Au plating can be applied. Note that, in the non-cyanide substitution Au plating, a plating solution without containing cyanide is used. An example of the plating solution to be used includes a plating solution containing gold sodium sulfite. A temperature of the plating solution can be substantially 60 to 70° C., a pH can be substantially 8 to 9, and an Au concentration can be substantially 1.5 to 2.5 g/l (gram/liter).

In the substitution Au plating, formation of the Au film is normally stopped when the substitution reaction is completed. Therefore, to form a thick Au film (for example, 0.05 μm or more), reduction Au plating treatment (step S6*b* in FIG. 35) can be performed after the substitution Au plating treatment of step S6*a*. That is, an Au film having a desired film thickness is formed over the Au film formed in the substitution Au plating treatment in step S6*a*, by reduction Au plating treatment of step S6*b*. In the reduction Au plating treatment in step S6*b*, a gold plated layer is further formed by bringing the front surface of the Au film formed in step S6*a* in contact with a plating solution for reduction Au plating. To be specific, the plating treatment (Au plating treatment) is performed by immersing the wafer WF (semiconductor substrate SB) in the plating solution for reduction Au plating stored in the treatment tank BH for reduction Au plating, to further form the gold plated layer over the Au film formed in step S6*a*. As the reduction Au plating, non-cyanide reduction Au plating can be applied. Note that, in the non-cyanide reduction Au plating, a plating solution without containing cyanide is used. An example of the plating solution to be used includes a plating solution containing gold sodium sulfite and further containing a reducing agent and a stabilizer. A temperature of the plating solution can be substantially 45 to 55° C., a pH can be substantially 7 to 7.5, and an Au concentration can be substantially 2.5 to 3.5 g/l (gram/liter).

When both steps S6*a* and S6*b* are performed, the gold plated layer PL2 is formed of the Au film formed in step S6*a* and the Au film formed in step S6*b*. Further, when step S6*b* is not performed after step S6*a* is performed, the gold plated layer PL2 is formed of the Au film formed in step S6*a*. Therefore, the source pad gold plated layer PLS2 is formed over the nickel plated layer PLS1, and the gate pad gold plated layer PLG2 is formed over the nickel plated layer PLG1 in step S6.

<Background of Study>

The present inventor has examined bonding pads. In a plurality of bonding pads included in a semiconductor chip, areas of the bonding pads may differ. That is, there is a case in which a semiconductor chip includes a bonding pad having a small area and a bonding pad having a large area. For example, in a semiconductor chip having a power MISFET built in, an area of a source pad as a source bonding pad is considerably larger than an area of a gate pad as a gate bonding pad. With this configuration, when the semiconductor chip having a power MISFET built in is packaged, a wire can be connected to the gate pad, and a metal plate can be connected with the source pad. Although a large current flows in the power MISFET, when the metal plate is connected to the source pad, the metal plate has smaller resistance than the wire, and the metal plate can function as a current path in which the large current flows. Therefore, the resistance of the current path in which the large current flows can be reduced, and the conduction loss can be reduced.

A bonding pad includes a plated layer on its front surface. In a case of the bonding pad connecting the wire, if the plated layer on the front surface of the bonding pad connecting the wire is thin, a crack may occur in the plated layer due to physical impact at the time of wire bonding. Conversely, in a case of the bonding pad connecting the metal plate, even if the plated layer on the front surface of the bonding pad connecting the metal plate is thin, no crack occurs in connecting the metal plate. This is because, when the metal plate is connected with the bonding pad, the physical impact applied to the bonding pad is relatively smaller than the case where the wire is connected to the bonding pad. When a crack occurs in the plated layer on the front surface of the bonding pad, reliability of the semiconductor device (semiconductor package) is lowered. Therefore, it is desirable to prevent occurrence of a crack in the plated layer on the front surface of the bonding pad.

In the bonding pad connecting the wire, if the plating layer on the front surface is made thick, durability against pressure (physical impact) at the time of wire bonding is enhanced, and thus, the crack due to physical impact at the time of wire bonding is less likely to occur. In contrast, in the bonding pad having a large area (the bonding pad connecting the metal plate), if the plated layer on the front surface is made thick, stress of the plated layer becomes large, and a warpage (a warpage of the semiconductor substrate) may occur. This is because, while the area of the bonding pad connecting the metal plate is larger than the bonding pad connecting the wire, the larger the area of the bonding pad, the larger the area of the plated layer, and the larger the influence of the stress of the plated layer. When a warpage occurs in the semiconductor substrate due to the stress of the plated layer, a trouble may occur in various processes. This may lead to lowering in reliability of the manufactured semiconductor device (semiconductor chip or semiconductor package) and lowering in a manufacturing yield of the semiconductor device. Therefore, it is desirable to prevent occurrence of a warpage in the plated layer on the front surface of the bonding pad.

Figure 37:
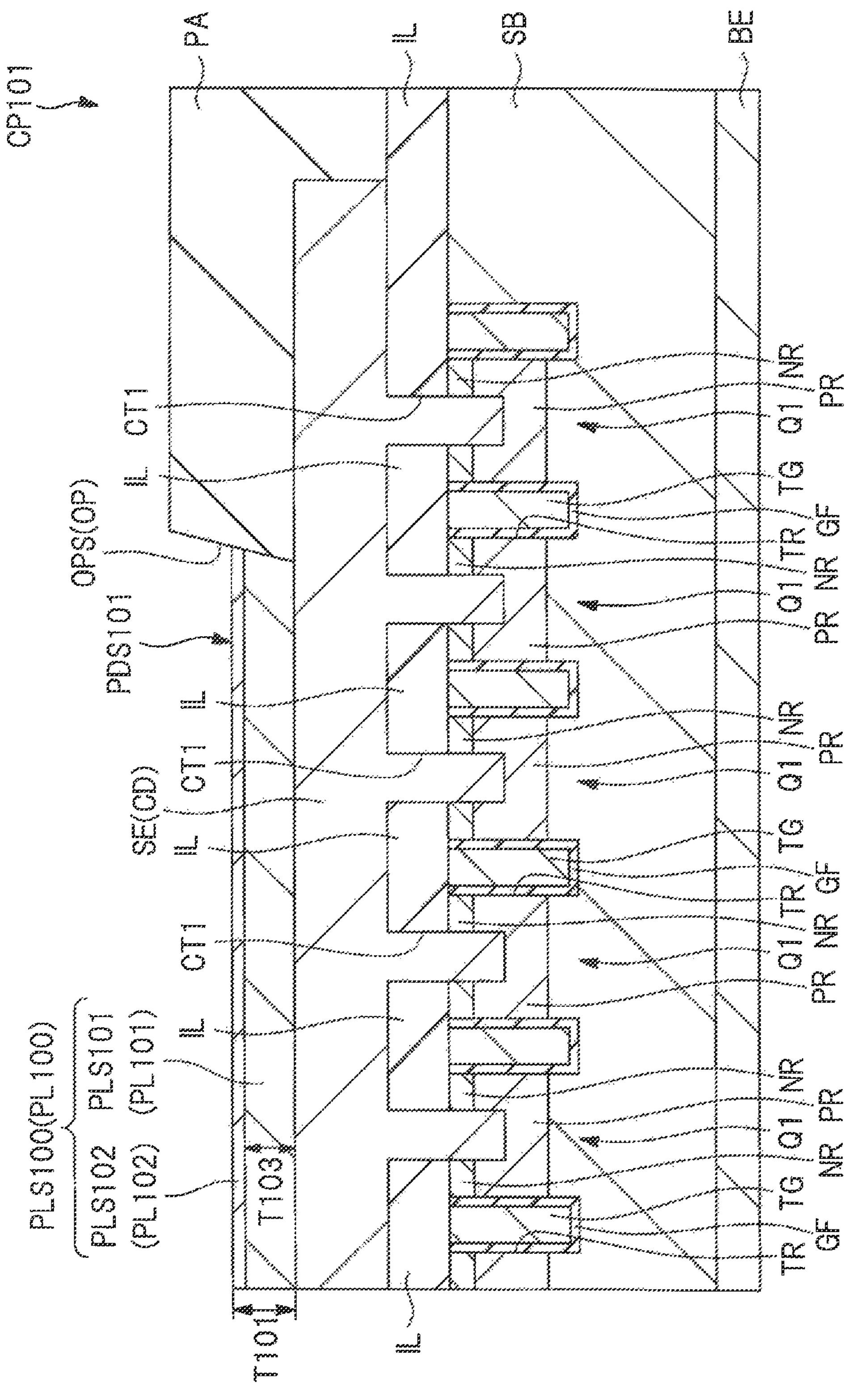
FIG. 37 is a cross-sectional view of a principal portion of a semiconductor device of a study example.
Figure 38:
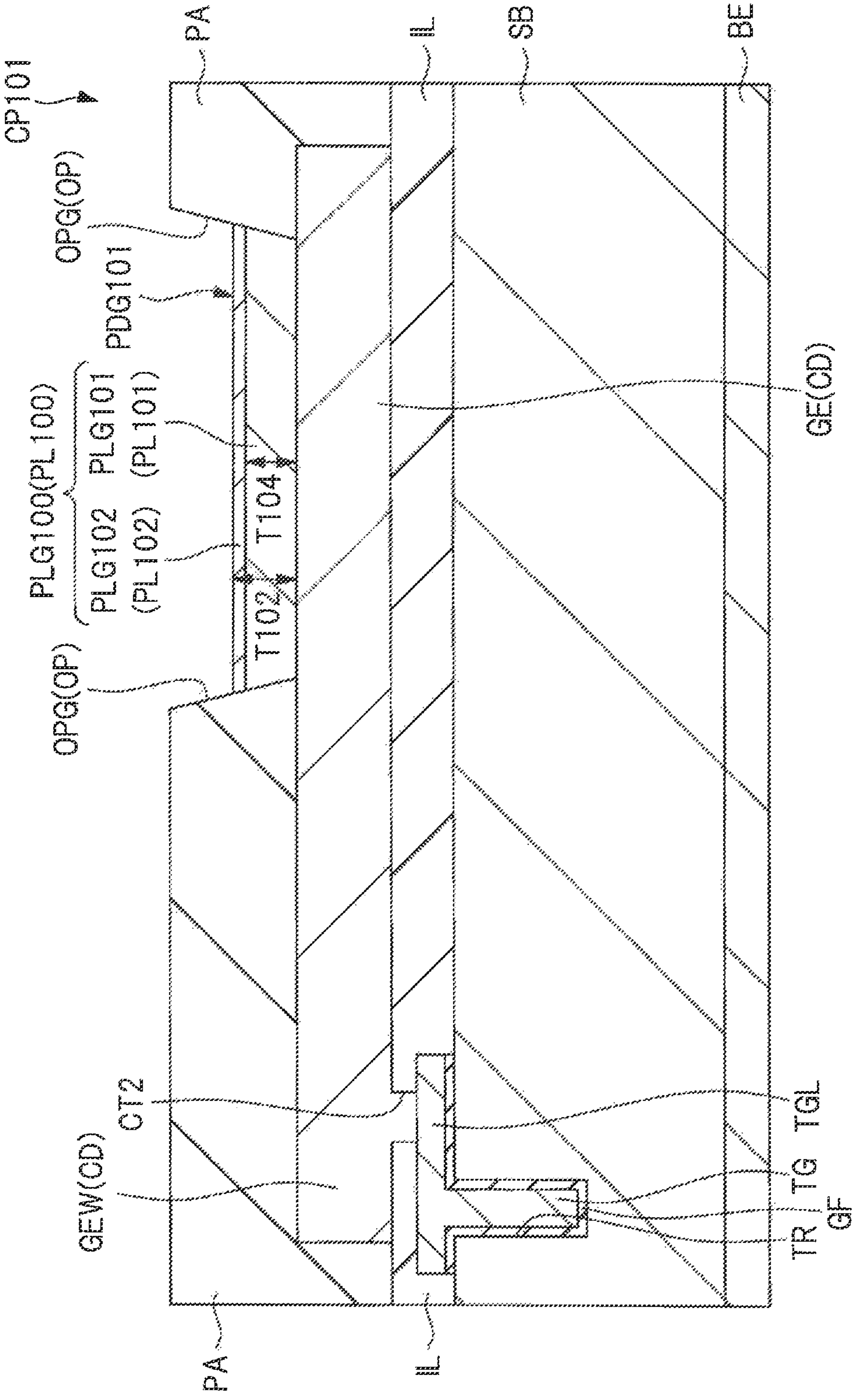
FIG. 38 is a cross-sectional view of the principal portion of the semiconductor device of the study example.

FIGS. 37 and 38 are cross-sectional views each illustrating a principal portion of a semiconductor device (semiconductor chip) of a study example examined by the present inventor. FIG. 37 illustrates a cross-section corresponding to FIG. 11 described above, and FIG. 38 illustrates a cross-section corresponding to FIG. 12 described above.

In the study example of FIGS. 37 and 38, a plated layer PL100 corresponding to the plated layer PL is formed over each of the portion of the source electrode SE exposed in the opening portion OPS and the portion of the gate electrode GE exposed in the opening portion OPG. Note that the plated layer PL100 is formed of a layered film including a nickel (Ni) plated layer PL101 and a gold (Au) plated layer PL102 thereover.

Here, in the study example of FIGS. 37 and 38, the plated layer PL100 formed over the portion of the source electrode SE exposed in the opening portion OPS is called a source pad (PDS101) plated layer PLS100, and the plated layer PL100 formed over the portion of the gate electrode GE exposed in the opening portion OPG is called a gate pad (PDG101) plated layer PLG100. Further, in the study example of FIGS. 37 and 38, the nickel plated layer PL101 and the gold plated layer PL102 constituting the source pad plated layer PLS100 are respectively called a source pad nickel plated layer PLS101 and a source pad gold plated layer PLS102. Further, in the study example of FIGS. 37 and 38, the nickel plated layer PL101 and the gold plated layer PL102 constituting the gate pad plated layer PLG100 are respectively called a gate pad nickel plated layer PLG101 and a gate pad gold plated layer PLG102.

The semiconductor device according to the study example of FIGS. 37 and 38 is different from the semiconductor device according to the present embodiment in FIGS. 11 and 12 described above in thickness of the bonding pad plated layer.

That is, in the study example of FIGS. 37 and 38, a thickness T101 of the source pad plated layer PLS100 and a thickness T102 of the gate pad plated layer PLG100 are the same (T101=T102). Further, a thickness T103 of the source pad nickel plated layer PLS101 and a thickness T104 of the gate pad nickel plated layer PLG101 are the same (T103=T104). Further, a thickness of the source pad gold plated layer PLS102 and a thickness of the gate pad gold plated layer PLG102 are the same.

In the study example of FIGS. 37 and 38, since the thickness T101 of the source pad plated layer PLS100 and the thickness T102 of the gate pad plated layer PLG100 are the same, when the thickness T102 of the gate pad plated layer PLG100 is made thin, the thickness T101 of the source pad plated layer PLS100 becomes inevitably thin. Further, when the thickness T102 of the gate pad plated layer PLG100 is made thick, the thickness T101 of the source pad-plated layer PLS100 becomes inevitably thick.

However, in the study example of FIGS. 37 and 38, when the thickness T102 of the gate pad plated layer PLG100 and the thickness T101 of the source pad plated layer PLS100 are made thin, a crack may occur in the gate pad plated layer PLG100 by the physical impact at the time of wire bonding, in connecting the wire to the gate pad PDG101.

In contrast, in the study example of FIGS. 37 and 38, when the thickness T102 of the gate pad plated layer PLG100 and the thickness T101 of the source pad plated layer PLS100 are made thick such that the crack becomes less likely to occur at the time of wire bonding, a warpage (a warpage of the semiconductor substrate) may occur due to the stress of the source pad plated layer PLS100 having a large area.

<Major Characteristics and Effects>

The semiconductor device CP of the present embodiment includes the semiconductor substrate SB, the interlayer insulating film (here, the insulating film IL) formed over the main surface of the semiconductor substrate SB, the source electrode SE and the gate electrode GE formed over the interlayer insulating film (IL), and the insulating film PA formed over the interlayer insulating film (IL) to cover the source electrode SE and the gate electrode GE. Here, the source electrode SE is a conductive film pattern (first conductive film pattern) for the source pad PDS (first pad), and the gate electrode GE is a conductive film pattern (second conductive film pattern) for the gate pad PDG (second pad). The opening portion OPS (first opening portion) for the source pad PDS (first pad), which exposes a portion of the source electrode SE, and the opening portion OPG (second opening portion) for the gate pad PDG (second pad), which exposes a portion of the gate electrode GE, are formed in the insulating film PA. The source pad plated layer PLS (first plated layer) is formed over the portion of the source electrode SE exposed in the opening portion OPS in the insulating film PA, and the gate pad plated layer PLG (second plated layer) is formed over the portion of the gate electrode GE exposed in the opening portion OPG in the insulating film PA. The source pad PDS (first pad) is formed of the portion of the source electrode SE (first conductive film pattern) exposed in the opening portion OPS in the insulating film PA and the plated layer PLS (first plated layer) over the exposed portion of the source electrode SE. Further, the gate pad PDG (second pad) is formed of the portion of the gate electrode GE (second conductive film pattern) exposed in the opening portion OPG in the insulating film PA and the plated layer PLG (second plated layer) over the exposed portion of the gate electrode GE.

One of the major characteristics of the present embodiment is that the area of the opening portion OPG (second opening portion) is smaller than the area of the opening portion OPS (first opening portion). In other words, the area of the gate pad PDG (second pad) is smaller than the area of the source pad PDS (first pad). Another one of the major characteristics of the present embodiment is that the thickness T2 of the gate pad plated layer PLG (second plated layer) is greater than the thickness T1 of the source pad plated layer PLS (first plated layer) (that is, T2>T1).

In the present embodiment, the thickness T2 of the gate pad plated layer PLG is greater than the thickness T1 of the source pad plated layer PLS, and accordingly, the thickness of the plated layer PL (PLG) for the gate pad PDG having a small area can be made thick, and the thickness of the plated layer PL (PLS) for the source pad PDS having a large area can be made thin.

As for the gate pad PDG having a small area, the thickness of the plated layer PL (PLG) is made thin, and accordingly, durability against pressure (physical impact) at the time of wire bonding is enhanced, so that a crack caused by the physical impact at the time of wire bonding becomes less likely to occur. Therefore, as for the gate pad PDG having a small area, occurrence of the crack in the plated layer PL (PLG) at the time of wire bonding can be suppressed or prevented. Therefore, reliability of the semiconductor device (the semiconductor package including the semiconductor chip) can be improved.

Meanwhile, as for the source pad PDS having a larger area than the gate pad PDG, the thickness of the plated layer PL (PLS) is made thin, and accordingly, stress of the plated layer PL (PLS) can be suppressed, so that the problem caused by the stress of the plated layer PL (PLS) can be improved. For example, occurrence of a warpage of the semiconductor substrate caused by the stress of the plated layer PL (PLS) can be suppressed or prevented. As a result, occurrence of a trouble in various processes can be prevented. Therefore, reliability of the manufactured semiconductor device (semiconductor chip or semiconductor package) can be improved. Further, the manufacturing yield of the semiconductor device can be improved.

As for the source pad PDS having a large area, of the gate pad PDG and the source pad PDS, the stress of the plated layer PL (PLS) becomes large due to the large area of the plated layer PL (PLS), and accordingly, the problem (for example, the warpage of the semiconductor substrate) caused by the stress of the plated layer PL (PLS) is more likely to occur. Therefore, in the present embodiment, as for the source pad PDS having a large area, of the gate pad PDG and the source pad PDS, the thickness of the plated layer PL (PLS) is made thin to suppress the stress of the plated layer PL (PLS). Further, as for the gate pad PDG having a small area, of the gate pad PDG and the source pad PDS, the stress of the plated layer PL (PLG) is suppressed because of the small area of the plated layer PL (PLG), and thus, the problem (for example, the warpage of the semiconductor substrate) caused by the stress of the plated layer PL (PLG) is less likely to occur. Therefore, in the present embodiment, as for the gate pad PDG having a small area, of the gate pad PDG and the source pad PDS, the thickness of the plated layer PL (PLG) is made thick to enhance the durability against the pressure (physical impact) at the time of wire bonding.

The thickness of the source pad plated layer PLS having a large area is made thin, and the thickness of the gate pad plated layer PLG having a small area is made greater than the source pad plated layer PLS. As a result, the stress of the source pad plated layer PLS having a concern of an influence of the stress can be suppressed, and the durability at the time of wire bonding can be enhanced for the gate pad PDG. Therefore, the overall reliability of the semiconductor device can be improved. Further, the manufacturing yield of the semiconductor device can be improved.

Further, the plated layer PL includes the nickel plated layer PL1 formed over the portion of the conductive film CD exposed in the opening portion OP. That is, the source pad plated layer PLS includes the nickel plated layer PLS1 formed over the portion of the source electrode SE exposed in the opening portion OPS, and the gate pad plated layer PLG includes the nickel plated layer PLG1 formed over the portion of the gate electrode GE exposed in the opening portion OPG. It is preferable to make the thickness T4 of the gate pad nickel plated layer PLG1 greater than the thickness T3 of the source pad nickel plated layer PLS1 (T4>T3).

Nickel (Ni) is relatively hard metal material. In contrast, aluminum (Al) is relatively soft metal material. For this reason, the nickel plated layer PL1 is harder than the conductive film CD, and the conductive film CD is softer than the nickel plated layer PL1. Accordingly, the nickel plated layer PL1 is a film having a high risk of occurrence of a crack due to physical impact at the time of wire bonding. For this reason, it is desirable to make the nickel plated layer PL1 (PLG1) thick in the bonding pad (here, the gate pad PDG) for wire connection, which receives the physical impact at the time of wire bonding, and to enhance the durability against the stress (physical impact) at the time of wire bonding. Further, since the nickel plated layer PL1 includes the relatively hard metal material, when the stress becomes large, the nickel plated layer PL1 is likely to cause a warpage of the semiconductor substrate. For this reason, in the bonding pad having a large area (here, the source pad PDS), when the nickel plated layer PL1 (PLS1) is made thick, the stress of the nickel plated layer PL1 (PLS1) becomes large, and a warpage of the semiconductor substrate may occur. Accordingly, it is desirable to make the nickel plated layer PL1 (PLS1) thin. For this reason, it is especially important to control the thickness of the nickel plated layer PL1 according to the bonding pad in a case where the plated layer PL for the bonding pad includes the nickel plated layer PL1.

Therefore, in the present embodiment, it is preferable to make the thickness T4 of the gate pad nickel plated layer PLG1 having a small area greater than the thickness T3 of the source pad nickel plated layer PLS1 having a large area (that is, T4>T3). That is, in the present embodiment, the gate pad plated layer PLG is made thicker than the source pad plated layer PLS, and particularly, the gate pad nickel plated layer PLG1 is made thicker than the source pad nickel plated layer PLS1. Especially, as for the gate pad PDG having a small area, the thickness of the nickel plated layer PL1 (PLG1) is made thick, and accordingly, the durability against the pressure (physical impact) at the time of wire bonding can be effectively enhanced, so that occurrence of a crack in the nickel plated layer PL1 (PLG1) at the time of wire bonding can be appropriately suppressed or prevented. Meanwhile, as for the source pad PDS having a larger area than the gate pad PDG, the thickness of the nickel plated layer PL1 (PLS1) is made thin, and accordingly, the stress of the nickel plated layer PL1 (PLS1) can be suppressed, so that the problem caused by the stress of the nickel plated layer PL1 (PLS1) can be improved. For example, occurrence of a warpage of the semiconductor substrate caused by the stress of the nickel plated layer PL1 (PLS1) can be appropriately suppressed or prevented. Therefore, the reliability of the manufactured semiconductor device (semiconductor package including a semiconductor chip) can be appropriately improved.

Gold (Au) is a relatively softer metal material than nickel (Ni). In the bonding pads, the thickness of the gold plated layer PL2 is substantially thinner than the thickness of the nickel plated layer PL1. For this reason, the gold plated layer PL2 has a smaller risk of causing the problem concerned in connection with the nickel plated layer PL1 (the problem of a crack at the time of wire bonding or a warpage of the semiconductor substrate) than the nickel plated layer PL1. Therefore, it is important to control the thickness of the nickel plated layer PL1 according to the bonding pad, and it is sufficient if the thickness of the gate pad nickel plated layer PLG1 is greater than the thickness of the source pad nickel plated layer PLS1. Accordingly, the thickness of the gate pad gold plated layer PLG2 and the thickness of the source pad gold plated layer PLS2 may be the same or may be different from each other. Further, the thickness of the gate pad gold plated layer PLG2 may be greater than the thickness of the source pad gold plated layer PLS2.

The thickness T4 of the gate pad nickel plated layer PLG1 is preferably 1.2 times or more the thickness T3 of the source pad nickel plated layer PLS1 (that is, $T4 \geq T3 \times 1.2$), and is more preferably 1.3 times or more the thickness T3 of the source pad nickel plated layer PLS1 (that is, $T4 \geq T3 \times 1.3$).

Variation in thickness in a case of forming the nickel plated layer by electroless plating is substantially 5% at most. In the present embodiment, the thickness of the gate pad nickel plated layer PLG1 is positively (intentionally) made greater than the thickness of the source pad nickel plated layer PLS1, is preferably 1.2 times or more the thickness of the source pad nickel plated layer PLS1, and is more preferably 1.3 times or more the thickness of the source pad nickel plated layer PLS1. In doing so, the effect obtained by making the thickness of the gate pad nickel plated layer PLG1 thick (improvement of the durability at the time of wire bonding) and the effect obtained by making the thickness of the source pad nickel plated layer PLS1 thin (prevention of a warpage of the semiconductor substrate) can be efficiently acquired.

Further, in the present embodiment, as for the bonding pad having a small area (here, the gate pad PDG), the thickness of the plated layer PL (particularly, the nickel plated layer PL1) is made thick, and as for the bonding pad having a large area (here, the source pad PDS), the thickness of the plated layer PL (particularly, the nickel plated layer PL1) is made thin, so that the above-described effects can be obtained. Such effects become more remarkable as a ratio of the area of the bonding pad having a small area (here, the gate pad PDG) to the area of the bonding pad having a large area (here, the source pad PDS) is large. Therefore, the present embodiment is more preferable if applied to a case in which the area of the opening portion OPS is nine times or more the area of the opening portion OPG. In doing so, the effect obtained by controlling the thickness of the plated layer PL (particularly, the nickel plated layer PL1) according to the bonding pad becomes extremely large.

The area of the source pad PDS is almost the same as the area of the opening portion OPS, and the area of the gate pad PDG is almost the same as the area of the opening portion OPG. Therefore, the area of the opening portion OPS being nine times or more the area of the opening portion OPG corresponds to the area of the source pad PDS being nine times or more the area of the gate pad PDG. That is, the present embodiment is more preferable if applied to the case in which the area of the source pad PDS is nine times or more the area of the gate pad PDG.

In a case where the semiconductor device CP further includes a pad (for example, the pad PD1 in FIG. 10 above) smaller than the source pad PDS and for connecting a wire, other than the gate pad PDG, the configuration (the layer structure, the material, and the thickness) of the plated layer PL of the wire connection pad (PD1) can be made similar to the gate pad plated layer PLG. With the configuration, the thickness of the plated layer PL of the wire connection pad (PDG or PD1) can be made greater than the thickness of the source pad plated layer PLS, and particularly, the thickness of the nickel plated layer PL1 of the wire connection pad (PDG or PD1) can be made greater than the thickness of the source pad nickel plated layer PLS1. With the configuration, a crack at the time of wire bonding can be prevented in the wire connection pad (PDG or PD1).

In the present embodiment, the thickness of the gate pad nickel plated layer PLG1 is intentionally made greater than the thickness of the source pad nickel plated layer PLS1. A specific technique will be described below.

As described in the paragraph <Process of Forming Plated Layer PL> above, in step S5, the nickel plated layer PL1 is formed by immersing the wafer WF in the plating solution stored in the treatment tank BH1 for Ni plating and maintaining the state in which the wafer WF is immersed in the plating solution for a predetermined time. The nickel plated layer PL1 is selectively grown over the front surface of the conductive film CD exposed in the opening portion OP, that is, over the front surface of the gate electrode GE exposed in the opening portion OPG and over the front surface of the source electrode SE exposed in the opening portion OPS. The plating solution to be used contains nickel sulfate and containing hypophosphite as a reducing agent.

As the reaction formula in the following formula 1, in the electroless Ni plating process (step S5), Ni metal is deposited over the conductive film CD exposed in the opening portion OP by supply of electrons from the reducing agent (here, hypophosphite).

$$Ni^{2+} + H_2PO_2^- + H_2O \rightarrow Ni + H_2PO_3^- + 2H^+ \quad \text{(Formula 1)}$$

As can be seen from the formula 1, the film forming speed of the nickel plated film is decreased as supply of the reducing agent is decreased.

Therefore, in the present embodiment, the nickel plated layer PL1 (PLS1 and PLG1) is grown in a state where concentration of the reducing agent in the plating solution is lower in a vicinity of the source electrode SE exposed in the opening portion OPS than in a vicinity of the gate electrode GE exposed in the opening portion OPG. With the configuration, a film-forming speed (film-forming rate) of the gate pad nickel plated layer PLG1 is larger (faster) than a film-forming speed (film-forming rate) of the source pad nickel plated layer PLS1. As a result, the thickness of the nickel plated layer PLG1 formed over the gate electrode GE exposed in the opening portion OPG can be made greater than the thickness of the nickel plated layer PLS1 formed over the source electrode SE exposed in the opening portion OPS.

To be specific, the wafer WF is immersed in the plating solution stored in the treatment tank BH1 and is arranged in the wafer holder WH, then the flow rate of the plating solution is made low (for example, the flow rate is lowered from 18 L/min to 10 L/min), and the wafer WF is kept still without swinging. Accordingly, the plating solution near the front surface of the conductive film CD exposed in the opening portion OP hardly moves and maintains the state for a predetermined time. Ni metal is deposited over the front surface of the gate electrode GE exposed in the opening portion OPG and over the front surface of the source electrode SE exposed in the opening portion OPS by the reaction of the above-describe formula 1. However, the consumption of the reducing agent in the plating solution is larger in a vicinity of the source electrode SE exposed in the opening portion OPS than in a vicinity of the gate electrode GE exposed in the opening portion OPG, reflecting the fact that the area of the opening portion OPS is larger than the area of the opening portion OPG.

In a typical electroless Ni plating process, the flow rate of the plating solution is relatively large, and the wafer WF swings up and down in the plating solution. Accordingly, a consumed reducing agent is immediately supplied in the vicinity of the gate electrode GE and in the vicinity of the source electrode SE, and the concentration of the reducing agent in the plating solution in the vicinity of the gate electrode GE exposed in the opening portion OPG becomes almost the same as that in the vicinity of the source electrode SE exposed in the opening portion OPS.

However, in the present embodiment, the flow rate of the plating solution is made low, and the wafer WF is made still in the plating solution without swinging in the electroless Ni plating process. Accordingly, the consumed reducing agent is not immediately supplied in the vicinity of the gate electrode GE and in the vicinity of the source electrode SE, and the concentration of the reducing agent in the plating solution differs in the vicinity of the gate electrode GE exposed in the opening portion OPG and in the vicinity of the source electrode SE exposed in the opening portion OPS. That is, the concentration of the reducing agent in the plating solution becomes lower in a vicinity region of the source electrode SE having a relatively larger consumption of the reducing agent than in a vicinity region of the gate electrode GE, and thus, the concentration of the reducing agent in the plating solution becomes lower in the vicinity of the source electrode SE exposed in the opening portion OPS than in the vicinity of the gate electrode GE exposed in the opening portion OPG. In this state, when the deposition of Ni metal progresses, the film-forming speed of the gate pad nickel plated layer PLG1 becomes larger (faster) than the film-forming speed of the source pad nickel plated layer PLS1. Accordingly, when the electroless Ni plating process ends, the thickness of the nickel plated layer PLG1 formed over the gate electrode GE exposed in the opening portion OPG having a small area can be made greater than the thickness of the nickel plated layer PLS1 formed over the source electrode SE exposed in the opening portion OPS having a large area.

Figure 39:
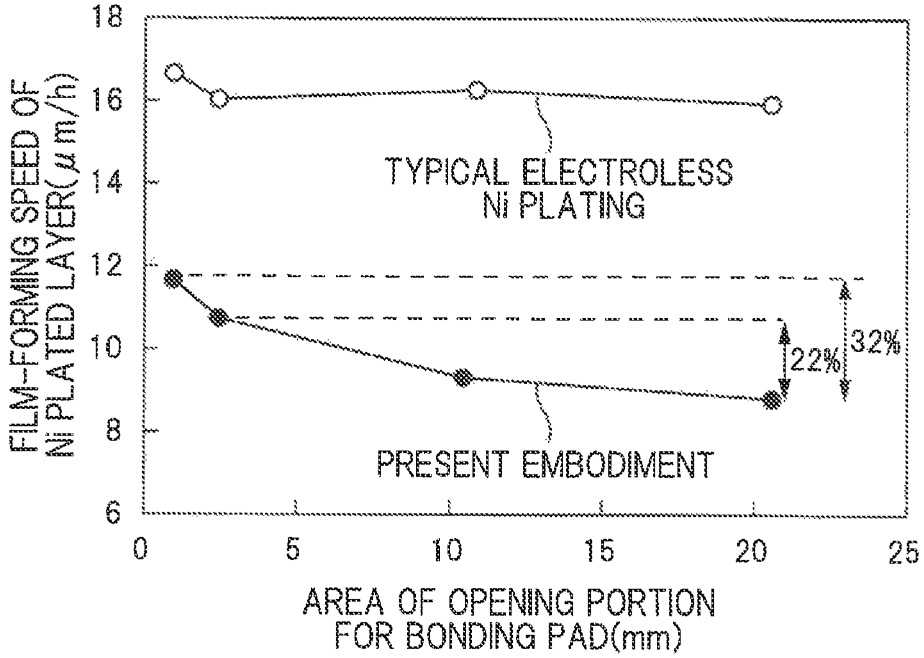
FIG. 39 is a graph illustrating correlation between an area of an opening portion for a bonding pad and a film-forming speed of a nickel plated layer formed over a conductive film exposed in the opening portion.

FIG. 39 is a graph illustrating correlation between an area of an opening portion (corresponding to the opening portion OP) for a bonding pad and a film-forming speed of a nickel plated layer (corresponding to the nickel plated layer PL1) formed over a conductive film (corresponding to the conductive film CD) exposed in the opening portion. The horizontal axis of the graph in FIG. 39 corresponds to the area of the opening portion for the bonding pad, and the vertical axis of the graph in FIG. 39 corresponds to the film-forming speed of the nickel plated layer. Further, in the graph in FIG. 39, the case of the typical electroless Ni plating process (corresponding to the white circles in the graph) is illustrated as “typical electroless Ni plating,” and the case of the electroless Ni plating process of the present embodiment (corresponding to the black circles in the graph) is illustrated as “present embodiment.” Note that, in the case of the typical electroless Ni plating process illustrated in the graph in FIG. 39, the flow rate of the plating solution is made relatively large, and the wafer swings up and down in the plating solution. Further, in the electroless Ni plating process of the present embodiment illustrated in the graph in FIG. 39, the flow rate of the plating solution is made low, and the wafer does not swing and stands still in the plating solution.

As illustrated in the graph in FIG. 39, in the case of the typical electroless Ni plating process, the film-forming speed of the nickel plated layer is almost constant without depending on the area of the opening portion for the bonding pad (corresponding to the opening portion OP). This is because the concentration of the reducing agent in the plating solution in a vicinity of a small opening portion is almost the same as that in a vicinity of a large opening portion even if the electroless Ni plating progresses. Therefore, in the case of the typical electroless Ni plating process, the thickness of the nickel plated layer formed over the conductive film exposed in the small opening portion and the thickness of the nickel plated layer formed over the conductive film exposed in the large opening portion are almost the same.

As illustrated in the graph in FIG. 39, in the case of the electroless Ni plating process of the present embodiment, the film-forming speed of the nickel plated layer becomes smaller as the area of the opening portion for the bonding pad (corresponding to the opening portion OP) becomes larger. That is, the film forming speed is smaller in the nickel plated layer formed over the conductive film exposed in the large opening portion than in the nickel plated layer formed over the conductive film exposed in the small opening portion. In the case of the graph in FIG. 39, the film-forming speed of the nickel plated layer differs by substantially 22% between the large opening portion and the small opening portion when an area ratio of the large opening portion to the small opening portion is substantially 9 times, and the film-forming speed of the nickel plated layer differs by substantially 32% between the large opening portion and the small opening portion when an area ratio of the large opening portion to the small opening portion is substantially 26 times. This is because, when the electroless Ni plating progresses, a difference is caused in concentration of the reducing agent in the plating solution between in the vicinity of the small opening portion and in the vicinity of the large opening portion, and the concentration of the reducing agent in the plating solution becomes lower in the vicinity region of the conductive film exposed in the large opening portion than in the vicinity region of the conductive film exposed in the small opening portion. Therefore, in the case of the electroless Ni plating process of the present embodiment, the thickness of the nickel plated layer (corresponding to the nickel plated layer PLS1) formed over the conductive film exposed in the large opening portion becomes thinner than the thickness of the nickel plated layer (corresponding to the nickel plated layer PLG1) formed over the conductive film exposed in the small opening portion.

As described above, in the present embodiment, in the film-forming process of the nickel plated layer PL1 (plating process), the nickel plated layer PL1 is formed such that the film-forming speed of the gate pad nickel plated layer PLG1 becomes larger (faster) than the film-forming speed of the source pad nickel plated layer PLS1. By making the film-forming speed of the gate pad nickel plated layer PLG1 larger (faster) than the film-forming speed of the source pad nickel plated layer PLS1, the thickness of the gate pad nickel plated layer PLG1 can be made greater than the thickness of the source pad nickel plated layer PLS1 when the film-forming process of the nickel plated layer PL1 ends.

Further, in the present embodiment, in the film-forming process of the nickel plated layer PL1 (plating process), the nickel plated layer PL1 (PLS1 and PLG1) is grown in a state where the concentration of the reducing agent in the plating solution is lower in the vicinity of the source electrode SE exposed in the opening portion OPS than in the vicinity of the gate electrode GE exposed in the opening portion OPG. Accordingly, the film-forming speed of the gate pad nickel plated layer PLG1 becomes larger (faster) than the film-forming speed of the source pad nickel plated layer PLS1. As a result, the thickness of the gate pad nickel plated layer PLG1 can be made greater than the thickness of the source pad nickel plated layer PLS1.

FIGS. 40 and 41 are tables indicating an examination result as to whether a warpage of a semiconductor substrate occurs and whether a crack occurs at the time of wire bonding. Among FIGS. 40 and 41, FIG. 40 illustrates a case corresponding to the above-described study example, and FIG. 41 illustrates a case corresponding to the present embodiment.

Here, in the tables in FIGS. 40 and 41, the large-area pad corresponds to the source pad (PDS or PDS101), and the small-area pad corresponds to the gate pad (PDG or PDG101). Therefore, in the table of FIG. 40 (study example), the thickness of the large-area pad Ni plated layer corresponds to the thickness of the source pad nickel plated layer PLS101, and the thickness of the small-area pad Ni plated layer corresponds to the thickness of the gate pad nickel plated layer PLG101. Further, in the table in FIG. 41 (the present embodiment), the thickness of the large-area pad Ni plated layer corresponds to the thickness of the source pad nickel plated layer PLS1, and the thickness of the small-area pad Ni plated layer corresponds to the thickness of the gate pad nickel plated layer PLG1. Note that, in the case of FIG. 40 (study example), the thickness of the large-area pad Ni plated layer and the thickness of the small-area pad Ni plated layer are the same. In the case of FIG. 41 (the present embodiment), the thickness of the small-area pad Ni plated layer is greater than the thickness of the large-area pad Ni plated layer, and the thickness of the small-area pad Ni plated layer is substantially 1.3 times the thickness of the large-area pad Ni plated layer. In this case (FIG. 41), the area of the large-area pad is substantially 26.1 times the area of the small-area pad.

When the area ratio of the large-area pad to the small-area pad is changed, a ratio of the thickness of the large-area pad Ni plated layer to the thickness of the small-area pad Ni plated layer may be changed. FIG. 42 illustrates a result of examination about a case of changing the area ratio of the large-area pad to the small-area pad from the case of FIG. 41, as a modification of the present embodiment, and illustrates a table indicating a result of examination as to whether a warpage of a semiconductor substrate occurs and whether a crack occurs at the time of wire bonding, similarly to FIGS. 40 and 41. In the case of FIG. 42, the thickness of the small-area pad Ni plated layer is substantially 1.2 times the thickness of the large-area pad Ni plated layer. In this case (FIG. 42), the area of the large-area pad is substantially 9.1 times the area of the small-area pad.

From the perspective of suppression of the warpage of the semiconductor substrate, the thickness of the large-area pad Ni plated layer is preferably thinner than 3 μm. Therefore, in the tables in FIGS. 40 to 42, "○" is illustrated in the section of "warpage of semiconductor substrate" when the thickness of the large-area pad Ni plated layer is thinner than 3 μm, and "x" is illustrated in the section of "warpage of semiconductor substrate" when the thickness of the large-area pad Ni plated layer is 3 m or more.

From the perspective of enhancement of the durability against the pressure (physical impact) at the time of wire bonding and prevention of occurrence of a crack, the thickness of the small-area pad Ni plated layer is preferably 3 μm or more in the small-area pad where the wire bonding is performed. Therefore, in the tables in FIGS. 40 to 42, "o" is illustrated in the section of "crack at time of wire bonding" when the thickness of the small-area pad Ni plated layer is 3 μm or more, and "x" is illustrated in the section of "crack at time of wire bonding" when the thickness of the small-area pad Ni plated layer is less than 3 μm.

As can be seen from the table in FIG. 40, when the thickness of the large-area pad Ni plated layer and the thickness of the small-area pad Ni plated layer are the same, either the problem of the warpage of the semiconductor substrate or the problem of the crack at the time of wire bonding is concerned. In contrast, as can be seen from the tables in FIGS. 41 and 42, in the case of the present embodiment in which the thickness of the small-area pad Ni plated layer is made greater than the thickness of the large-area pad Ni plated layer, both the problem of the warpage of the semiconductor substrate and the problem of the crack at the time of wire bonding can be solved. For example, in the table in FIG. 41, when the thickness of the large-area pad Ni plated layer is 2.3 to 2.9 μm and the thickness of the small-area pad Ni plated layer is 3 to 3.8 μm (that is, in the cases of sample Nos. 10, 11, and 12), both the problem of the warpage of the semiconductor substrate and the problem of the crack at the time of wire bonding can be solved. Further, in the table in FIG. 42, when the thickness of the large-area pad Ni plated layer is 2.5 to 2.9 μm and the thickness of the small-area pad Ni plated layer is 3 to 3.5 μm (that is, in the cases of sample Nos. 18 and 19), both the problem of the warpage of the semiconductor substrate and the problem of the crack at the time of wire-bonding can be solved.

Further, comparing the case of FIG. 41 and the case of FIG. 42, the thickness of the small-area pad Ni plated layer can be made larger while suppressing the thickness of the large-area pad Ni plated layer in the case of FIG. 41. Therefore, from the perspective of enhancing the durability against the pressure (physical impact) at the time of wire bonding as much as possible and preventing occurrence of a crack more appropriately, the case of FIG. 41 is more preferable.

Note that, in the cases of FIGS. 40 to 42, from the perspective of suppression of the warpage of the semiconductor substrate, the thickness of the large-area pad Ni plated layer is preferably thinner than 3 μm, and from the perspective of prevention of occurrence of a crack at the time of wire bonding, the thickness of the small-area pad Ni plated layer is preferably 3 μm or more. However, although the warpage of the semiconductor substrate can be suppressed by making the thickness of the large-area pad Ni plated layer thin, ease of warpage of the semiconductor substrate depends on the thickness of the semiconductor substrate. Further, although the crack at the time of wire bonding can be prevented by making the thickness of the small-area pad Ni plated layer where the wire bonding is performed thick, ease of occurrence of the crack at the time of wire bonding depends on the magnitude of bonding pressure (physical impact) applied to the bonding pad at the time of wire bonding. In recent years, a thickness of the semiconductor substrate has been reduced, and the magnitude of the bonding pressure at the time of wire bonding has been changed with improvement of the wire bonding technologies. Therefore, here, it has been described that the thickness of the large-area pad Ni plated layer is preferably thinner than 3 μm and the thickness of the small-area pad Ni plated layer is preferably 3 μm or more. However, a preferable range of the thickness of the large-area pad Ni plated layer and a preferable range of the thickness of the small-area pad Ni plated layer can be changed according to the thickness of the semiconductor substrate and the bonding pressure at the time of wire bonding.

Second Embodiment

Figure 43:
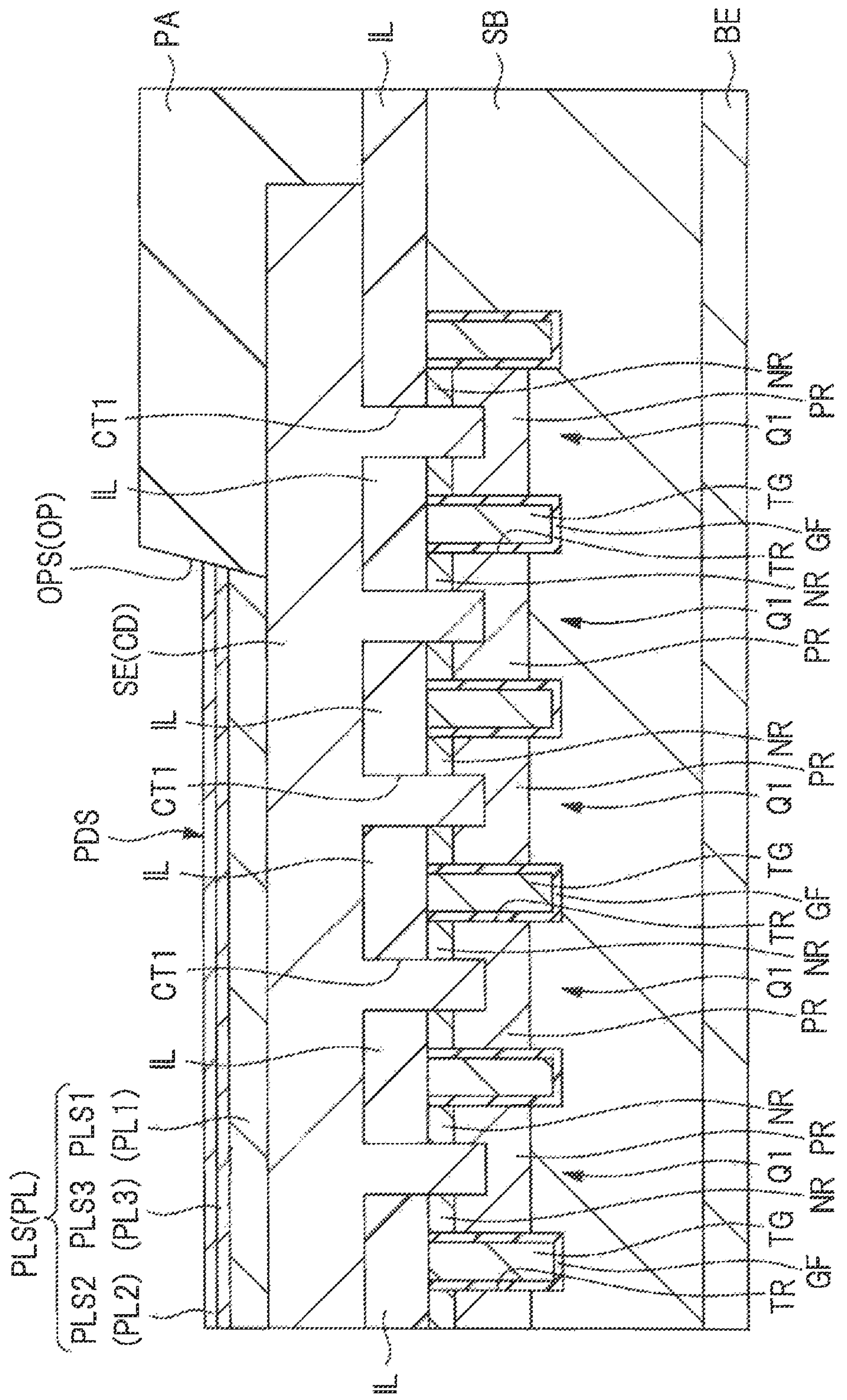
FIG. 43 is a cross-sectional view of a principal portion of a semiconductor device of another embodiment.
Figure 44:
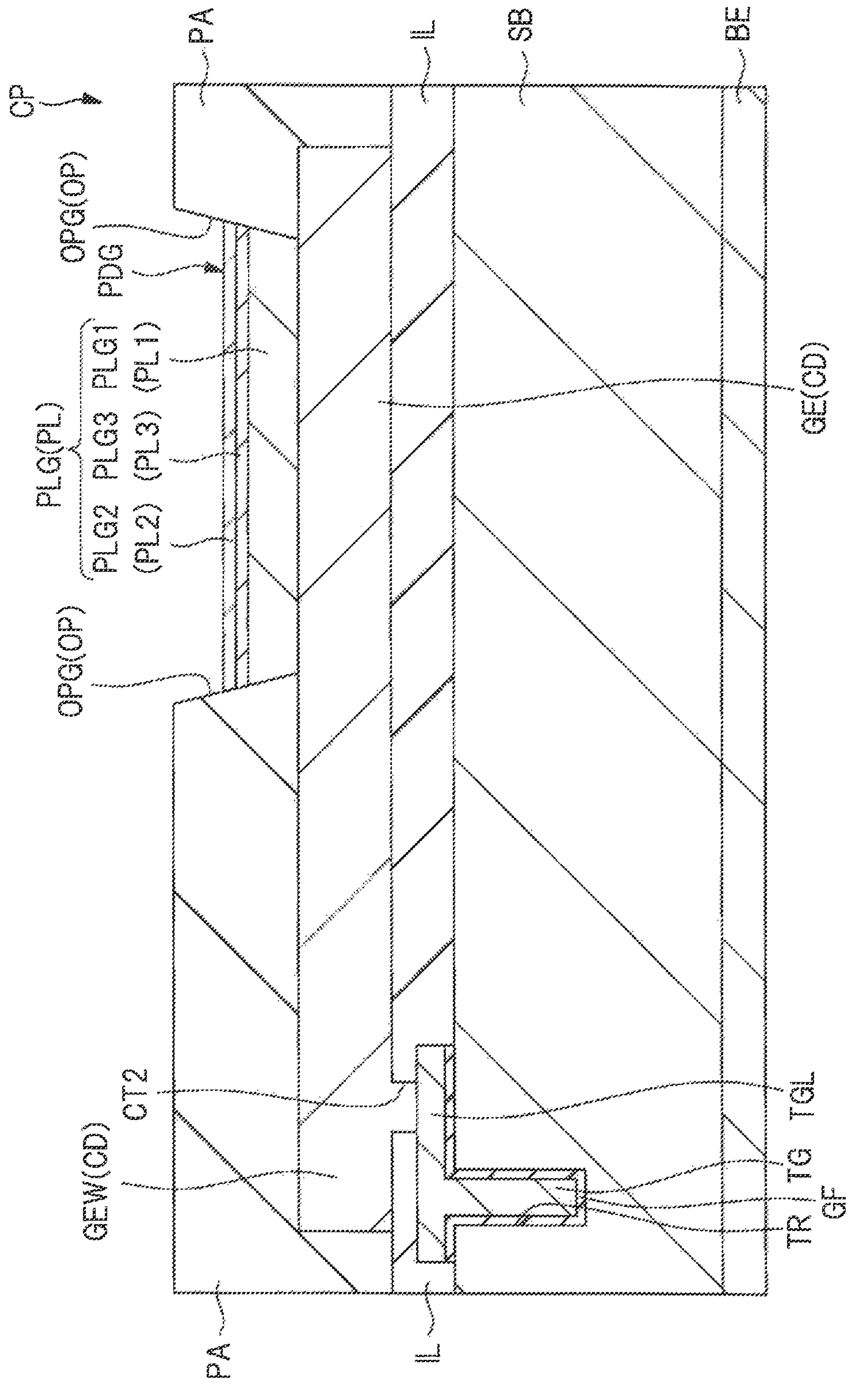
FIG. 44 is a cross-sectional view of the principal portion of the semiconductor device of FIG. 43.

FIGS. 43 and 44 are cross-sectional views each illustrating the principal portion of the semiconductor device (semiconductor chip) CP of the present second embodiment. FIG. 43 illustrates a cross-section corresponding to FIG. 11 of the first embodiment, and FIG. 44 illustrates a cross-section corresponding to FIG. 12 of the first embodiment.

In the first embodiment, the plated layer PL is formed of a laminated film including the nickel plated layer PL1 formed over the portion of the conductive film CD exposed in the opening portion OP, and the gold plated layer PL2 formed over the nickel plated layer PL1.

In the second embodiment, a plated layer PL is formed of a laminated film including a nickel plated layer PL1 formed over a portion of a conductive film CD exposed in an opening portion OP, a palladium (Pd) plated layer PL3 formed over the nickel plated layer PL1, and a gold plated layer PL2 formed over the palladium plated layer PL3. That is, the second embodiment is different from the first embodiment in that the palladium plated layer PL3 is provided between the nickel plated layer PL1 and the gold plated layer PL2 in the plated layer PL, and the second embodiment is almost similar to the first embodiment except for the above point. Therefore, in the second embodiment, the different point from the first embodiment will be mainly described, and repetitive description about similar points to the first embodiment is omitted.

Here, the palladium plated layer PL3 constituting a source pad plated layer PLS is called a source pad palladium plated layer PLS3. Further, the palladium plated layer PL3 constituting a gate pad plated layer PLG is called a gate pad palladium plated layer PLG3. Thus, the source pad palladium plated layer PLS3 is formed between a source pad nickel plated layer PLS1 and a source pad gold plated layer PLS2, and the gate pad palladium plated layer PLG3 is formed between a gate pad nickel plated layer PLG1 and a gate pad gold plated layer PLG2. The source pad plated layer PLS is formed of the nickel plated layer PLS1, the palladium plated layer PLS3 over the nickel plated layer PLS1, and the gold plated layer PLS2 over the palladium plated layer PLS3. Further, the gate pad plated layer PLG is formed of the nickel plated layer PLG1, the palladium plated layer PLG3 over the nickel plated layer PLG1, and the gold plated layer PLG2 over the palladium plated layer PLG3.

In a process of manufacturing a semiconductor device CP in the second embodiment, the nickel plated layer PL1, the palladium plated layer PL3, and the gold plated layer PL2 are formed in this order over the conductive film CD exposed in the opening portion OP in a process corresponding to FIGS. 31 and 32. That is, in the manufacturing process of the first embodiment, a process of forming the palladium plated layer PL3 may be performed between the process of forming the nickel plated layer PL1 (step S5 above) and the process of forming the gold plated layer PL2 (step S6 above). In the process of forming the palladium plated layer PL3, the source pad palladium plated layer PLS3 is formed over the source pad nickel plated layer PLS1, and the gate pad palladium plated layer PLG3 is formed over the gate pad nickel plated layer PLG1. Then, in the process of forming the gold plated layer PL2 (step S6 above), the source pad gold plated layer PLS2 is formed over the source pad palladium plated layer PLS3, and the gate pad gold plated layer PLG2 is formed over the gate pad palladium plated layer PLG3. With the processes, the plated layer PL formed of a laminated film including the nickel plated layer PL1, the palladium plated layer PL3 over the nickel plated layer PL1, and the gold plated layer PL2 over the palladium plated layer PL3 is formed over the conductive film CD exposed in the opening portion OP. The nickel plated layer PL1, the palladium plated layer PL3, and the gold plated layer PL2 can be formed by plating (preferably, by electroless plating). Other than the above point, the process of manufacturing the semiconductor device CP in the second embodiment is basically the same as that in the first embodiment.

The process of forming the palladium plated layer PL3 will be specifically described below.

In the process flow described with reference to FIG. 35 above, in the case of the second embodiment, Pd plating treatment is performed before Au plating treatment of step S6 after Ni plating treatment of step S5, and a plated film (Pd film) is grown. To be specific, in the second embodiment, a front surface of the nickel plated layer PL1 is brought in contact with a plating solution for Pd plating, to form the palladium plated layer (Pd plated layer) PL3. To be more specific, the plating treatment (Pd plating treatment) is performed by immersing a wafer WF (semiconductor substrate SB) in the plating solution for Pd plating stored in a treatment tank BH for Pd plating, to form the palladium plated layer PL3 over the nickel plated layer PL1. This palladium plated layer PL3 is selectively grown over the nickel plated layer PL1 formed over the conductive film CD exposed in the opening portion OP.

Examples of the palladium plated layer PL3 may include an electroless palladium plated layer made of pure palladium, and an electroless palladium plated layer containing phosphorus (P). In a case where the palladium plated layer PL3 is the electroless palladium plated layer made of pure palladium, an example of the plating solution to be used includes a plating solution containing a palladium salt and containing formate as a reducing agent. A temperature of the plating solution can be substantially 60 to 80° C., a pH can be substantially 5 to 7, and a Pd concentration can be substantially 1.5 to 2.5 g/l (gram/liter), for example. In a case where the palladium plated layer PL3 is the electroless palladium plated layer containing phosphorus (P), an example of the plating solution to be used includes a plating solution containing a palladium salt and containing hypophosphite as the reducing agent. A temperature of the plating solution can be substantially 45 to 55° C., a pH can be substantially 6.5 to 7.5, and a Pd concentration can be substantially 0.4 to 0.8 g/l (gram/liter), for example.

The second embodiment can also obtain the effects described in the first embodiment.

Briefly describing the effects, also in the second embodiment, a thickness of the source pad plated layer PLS having a large area is made thin, and a thickness of the gate pad plated layer PLG having a small area is made greater than the source pad plated layer PLS, similarly to the first embodiment. Therefore, stress of the source pad plated layer PLS having a concern of an influence of the stress can be suppressed, and durability at the time of wire bonding can be enhanced for the gate pad PDG. Therefore, overall reliability of the semiconductor device can be improved, and a manufacturing yield of the semiconductor device can be improved.

Further, in both the first and the second embodiments, the dominant thickness of the layers in the plated layer PL is the nickel plated layer PL1, and for example, the thickness of the nickel plated layer PL1 occupies more than half the thickness of the entire plated layer PL. Further, in both the first and the second embodiments, the layer that is more likely to be broken by the pressure (physical impact) at the time of wire bonding, of the layers constituting the plated layer PL, is the hard nickel plated layer PL. Further, in both the first and the second embodiments, the layer that may easily become a cause of the warpage of the semiconductor substrate, of the layers constituting the plated layer PL, is the nickel plated layer PL1. Therefore, also in the second embodiment, it is preferable to make the thickness of the gate pad nickel plated layer PLG1 having a small area greater than the thickness of the source pad nickel plated layer PLS1 having a large area, similarly to the first embodiment. As for the gate pad PDG having a small area, particularly, the thickness of the nickel plated layer PL1 (PLG1) is made thick, and accordingly, the durability against the pressure (physical impact) at the time of wire bonding can be effectively enhanced, so that occurrence of a crack in the nickel plated layer PL1 (PLG1) at the time of wire bonding can be appropriately suppressed or prevented. Meanwhile, as for the source pad PDS having a larger area than the gate pad PDG, the thickness of the nickel plated layer PL1 (PLS1) is made thin, and accordingly, stress of the nickel plated layer PL1 (PLS1) can be suppressed, so that a problem caused by the stress of the nickel plated layer PL1 (PLS1) can be improved. For example, occurrence of a warpage of a semiconductor substrate caused by the stress of the nickel plated layer PL1 (PLS1) can be appropriately suppressed or prevented. Therefore, reliability of the manufactured semiconductor device (a semiconductor package including a semiconductor chip) can be appropriately improved.

Also, the palladium plated layer PL3 has a smaller risk of causing the problem concerned in connection with the nickel plated layer PL1 (the problem of a crack at the time of wire bonding or a warpage of the semiconductor substrate) than the nickel plated layer PL1. Therefore, also in the second embodiment, it is important to control the thickness of the nickel plated layer PL1 according to the bonding pad, similarly to the first embodiment. Therefore, the thickness of the gate pad palladium plated layer PLG3 and the thickness of the source pad palladium plated layer PLS3 may be the same or may be different from each other. Further, the thickness of the gate pad palladium plated layer PLG3 may be greater than the thickness of the source pad palladium plated layer PLS3. Further, also in the second embodiment, the relation between the thickness of the gate pad gold plated layer PLG2 and the thickness of the source pad gold plated layer PLS2 can be made similar to the first embodiment.

The palladium plated layer PL3 is provided in the second embodiment, whereby an effect below can be further obtained.

In the second embodiment, the palladium plated layer PL3 is provided between the nickel plated layer PL1 and the gold plated layer PL2. Although the palladium plated layer can also function as a solder barrier layer, the function as the solder barrier layer is superior in the nickel plated layer to the palladium plated layer. However, palladium (Pd) has a lower modulus of elasticity and a slightly lower thermal expansion coefficient than nickel (Ni). Therefore, the palladium plated layer PL3 is formed over the nickel plated layer PL1 like the second embodiment, so that stress applied to the conductive film CD can be reduced. Further, the thickness of the nickel plated layer PL1 can be made thin by the formation of the palladium plated layer PL3 over the nickel plated layer PL1 like the second embodiment. Therefore, the stress of the nickel plated layer PL1 can be made small. Therefore, the palladium plated layer PL3 is formed over the nickel plated layer PL1 like the second embodiment, so that the warpage of the semiconductor substrate due to the stress of the nickel plated layer PL1 can be more appropriately suppressed or prevented. Therefore, the reliability of the semiconductor device (the semiconductor device CP and a semiconductor package using the semiconductor device CP) can be further improved.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A method of manufacturing a semiconductor device, the method comprising:

(a) forming an interlayer insulating film over a main surface of a semiconductor substrate;

(b) forming a first conductive film pattern for a first pad and a second conductive film pattern for a second pad over the interlayer insulating film;

(c) forming an insulating film over the interlayer insulating film such that the insulating film covers the first and the second conductive film patterns;

(d) forming a first opening portion for the first pad, the first opening portion exposing a portion of the first conductive film pattern, and a second opening portion for the second pad, the second opening portion exposing a portion of the second conductive film pattern, in the insulating film; and (e) forming a first plated layer by plating over the portion of the first conductive film pattern exposed in the first opening portion, and a second plated layer by plating over the portion of the second conductive film pattern exposed in the second opening portion, wherein an area of the second opening portion is smaller than an area of the first opening portion, wherein the semiconductor substrate is kept still without swinging when the first plated layer and the second plated layer are formed by plating, and wherein a thickness of the second plated layer in a center of the second opening portion is greater than a thickness of the first plated layer in a center of the first opening portion.

2. The method of manufacturing the semiconductor device according to claim 1, wherein the first and the second conductive film patterns include a conductive material containing aluminum as a main component.

3. The method of manufacturing the semiconductor device according to claim 1, wherein the first plated layer includes a first nickel plated layer, wherein the second plated layer includes a second nickel plated layer, wherein the (e) includes:

(e1) forming the first nickel plated layer over the portion of the first conductive film pattern exposed in the first opening portion, and the second nickel plated layer over the portion of the second conductive film pattern exposed in the second opening portion, and wherein a thickness of the second nickel plated layer is greater than a thickness of the first nickel plated layer.

4. The method of manufacturing the semiconductor device according to claim 3, wherein, in the (e1), a film-forming speed of the second nickel plated layer is larger than a film-forming speed of the first nickel plated layer.

5. The method of manufacturing the semiconductor device according to claim 3, wherein the thickness of the second nickel plated layer is 1.2 times or more the thickness of the first nickel plated layer.

6. The method of manufacturing the semiconductor device according to claim 3, wherein the first plated layer includes the first nickel plated layer, and a first gold plated layer formed over the first nickel plated layer, wherein the second plated layer includes the second nickel plated layer, and a second gold plated layer formed over the second nickel plated layer, and wherein the (e) further includes:

(e2) after the (e1), forming the first gold plated layer over the first nickel plated layer, and the second gold plated layer over the second nickel plated layer.

7. The method of manufacturing the semiconductor device according to claim 3, wherein the first plated layer includes the first nickel plated layer, a first palladium plated layer formed over the first nickel plated layer, and a first gold plated layer formed over the first palladium plated layer, wherein the second plated layer includes the second nickel plated layer, a second palladium plated layer formed over the second nickel plated layer, and a second gold plated layer formed over the second palladium plated layer, and wherein the (e) includes:

(e2) after the (e1), forming the first palladium plated layer over the first nickel plated layer, and the second palladium plated layer over the second nickel plated layer; and (e3) after the (e2), forming the first gold plated layer over the first palladium plated layer, and the second gold plated layer over the second palladium plated layer.

8. The method of manufacturing the semiconductor device according to claim 3, wherein, in the (e1), the first nickel plated layer and the second nickel plated layer are grown in a state where a concentration of a reducing agent in a plating solution in a vicinity of the portion of the first conductive film pattern exposed in the first opening portion is lower than that in a vicinity of the portion of the second conductive film pattern exposed in the second opening portion.

9. The method of manufacturing the semiconductor device according to claim 1, further comprising:

(a1) before the (a), forming a semiconductor element in the semiconductor substrate; and (f) after the (e), forming a back surface electrode over a back surface opposite to the main surface of the semiconductor substrate.

10. The method of manufacturing the semiconductor device according to claim 9, wherein the semiconductor element includes a power MISFET, and the first conductive film pattern includes a source conductive film pattern, the second conductive film pattern includes a gate conductive film pattern, and the back surface electrode includes a drain back surface electrode.

11. The method of manufacturing the semiconductor device according to claim 1, wherein the first conductive film pattern and the first plated layer include a bonding pad for connecting a metal plate, and wherein the second conductive film pattern and the second plated layer include a bonding pad for connecting a wire.

12. The method of manufacturing the semiconductor device according to claim 1, wherein, in the (e), a flow rate of a plating solution is lowered.

13. The method of manufacturing the semiconductor device according to claim 12, wherein, in the (e), the flow rate of the plating solution is lowered from 18 L/min to 10 L/min.

14. The method of manufacturing the semiconductor device according to claim 12, wherein a temperature of the plating solution is 80° C. to 90° C.

15. The method of manufacturing the semiconductor device according to claim 14, wherein a PH of the plating solution is in a range from 4 to 5.

16. The method of manufacturing the semiconductor device according to claim 15, wherein the plating solution contains nickel sulfate, and wherein a Ni concentration is in a range from 5 g/L to 6.5 g/L.

17. The method of manufacturing the semiconductor device according to claim 1, wherein, in the (e), the first plated layer and the second plated layer are formed by immersing the semiconductor substrate in a plating solution stored in a treatment tank.

18. A method of manufacturing a semiconductor device, the method comprising:

(a) forming an interlayer insulating film over a main surface of a semiconductor substrate;

(b) forming a first conductive film pattern for a first pad and a second conductive film pattern for a second pad over the interlayer insulating film;

(c) forming an insulating film over the interlayer insulating film such that the insulating film covers the first and the second conductive film patterns;

(d) forming a first opening portion for the first pad, the first opening portion exposing a portion of the first conductive film pattern, and a second opening portion for the second pad, the second opening portion exposing a portion of the second conductive film pattern, in the insulating film; and (e) forming a first plated layer by plating over the portion of the first conductive film pattern exposed in the first opening portion, and a second plated layer by plating over the portion of the second conductive film pattern exposed in the second opening portion, wherein an area of the second opening portion is smaller than an area of the first opening portion, wherein a thickness of the second plated layer is greater than a thickness of the first plated layer, wherein the semiconductor substrate is kept still without swinging when the first plated layer and the second plated layer are formed by plating, wherein the first plated layer includes a first nickel plated layer, wherein the second plated layer includes a second nickel plated layer, wherein the (e) includes:

(e1) forming the first nickel plated layer over the portion of the first conductive film pattern exposed in the first opening portion, and the second nickel plated layer over the portion of the second conductive film pattern exposed in the second opening portion, wherein a thickness of the second nickel plated layer is greater than a thickness of the first nickel plated layer, and wherein, in the (e1), a film-forming speed of the second nickel plated layer is larger than a film-forming speed of the first nickel plated layer.

19. A method of manufacturing a semiconductor device, the method comprising:

(a) forming an interlayer insulating film over a main surface of a semiconductor substrate;

(b) forming a first conductive film pattern for a first pad and a second conductive film pattern for a second pad over the interlayer insulating film;

(c) forming an insulating film over the interlayer insulating film such that the insulating film covers the first and the second conductive film patterns;

(d) forming a first opening portion for the first pad, the first opening portion exposing a portion of the first conductive film pattern, and a second opening portion for the second pad, the second opening portion exposing a portion of the second conductive film pattern, in the insulating film; and (e) forming a first plated layer by plating over the portion of the first conductive film pattern exposed in the first opening portion, and a second plated layer by plating over the portion of the second conductive film pattern exposed in the second opening portion, wherein an area of the second opening portion is smaller than an area of the first opening portion, wherein a thickness of the second plated layer is greater than a thickness of the first plated layer, wherein the semiconductor substrate is kept still without swinging when the first plated layer and the second plated layer are formed by plating, wherein the first plated layer includes a first nickel plated layer, wherein the second plated layer includes a second nickel plated layer, wherein the (e) includes:

(e1) forming the first nickel plated layer over the portion of the first conductive film pattern exposed in the first opening portion, and the second nickel plated layer over the portion of the second conductive film pattern exposed in the second opening portion, wherein a thickness of the second nickel plated layer is greater than a thickness of the first nickel plated layer, and wherein, in the (e1), the first nickel plated layer and the second nickel plated layer are grown in a state where a concentration of a reducing agent in a plating solution in a vicinity of the portion of the first conductive film pattern exposed in the first opening portion is lower than that in a vicinity of the portion of the second conductive film pattern exposed in the second opening portion.

* * * * *